US012694931B2

(12) United States Patent

Harari

(10) Patent No.: US 12,694,931 B2

(45) Date of Patent: Jul. 28, 2026

(54) MEMORY STRUCTURE INCLUDING HIGH DENSITY THREE-DIMENSIONAL NOR MEMORY STRINGS OF JUNCTIONLESS FERROELECTRIC STORAGE TRANSISTORS AND METHOD OF FABRICATION

(71) Applicant: SUNRISE MEMORY CORPORATION, San Jose, CA (US)

(72) Inventor: Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 392 days.

(21) Appl. No.: 18/175,277

(22) Filed: Feb. 27, 2023

(65) Prior Publication Data

US 2023/0282283 A1 Sep. 7, 2023

Related U.S. Application Data

(60) Provisional application No. 63/315,797, filed on Mar. 2, 2022.

(51) Int. Cl.
H10B 51/10 (2023.01)
G11C 16/04 (2006.01)
(Continued)

(52) U.S. Cl.
CPC ......... G11C 16/0483 (2013.01); H10B 51/10 (2023.02); H10B 51/20 (2023.02); (Continued)

(58) Field of Classification Search
None
See application file for complete search history.

(56) References Cited

U.S. PATENT DOCUMENTS 4,213,139 A 7/1980 Rao
4,984,153 A 1/1991 Kregness et al.
(Continued)

FOREIGN PATENT DOCUMENTS

CN 111799263 A 10/2020
JP 2000339978 A 12/2000
(Continued)

OTHER PUBLICATIONS

Kim, Taeho , et al., "Effects of high pressure nitrogen annealing on ferroelectric Hf0.5Zr0.5O2 films", Appl. Phys. Lett. 112, 092906 https://doi.org/10.1063/1.5003369, Mar. 2, 2018, 5 pages.
(Continued)

*Primary Examiner* — Xiaoming Liu

(57) ABSTRACT

A memory structure including three-dimensional NOR memory strings and method of fabrication is disclosed. In some embodiments, a memory structure includes randomly accessible ferroelectric storage transistors organized as horizontal NOR memory strings. The NOR memory strings are formed over a semiconductor substrate in multiple scalable memory stacks of thin-film storage transistors. The ferroelectric storage transistors are junctionless field-effect transistors having a ferroelectric polarization layer formed adjacent a semiconductor oxide layer as the channel region. The three-dimensional memory stacks are manufactured in a process that uses a sacrificial layer and access shafts to perform channel separation through a backside selective etch process.

20 Claims, 25 Drawing Sheets

(51) Int. Cl.
_H10B 51/20_ (2023.01)
_H10D 30/01_ (2025.01)
_H10D 30/67_ (2025.01)
_H10D 30/69_ (2025.01)
_H10D 64/68_ (2025.01)

(52) U.S. Cl.
CPC ..... _H10D 30/0415_ (2025.01); _H10D 30/6755_
(2025.01); _H10D 30/701_ (2025.01); _H10D_
_64/689_ (2025.01)

(56) References Cited

U.S. PATENT DOCUMENTS

| | | | |
|---|---|---|---|
| 5,388,246 A | 2/1995 | Kasai |
| 5,583,808 A | 12/1996 | Brahmbhatt |
| 5,646,886 A | 7/1997 | Brahmbhatt |
| 5,656,842 A | 8/1997 | Iwamatsu |
| 5,768,192 A | 6/1998 | Eitan |
| 5,789,776 A | 8/1998 | Lancaster et al. |
| 5,880,993 A | 3/1999 | Kramer et al. |
| 5,915,167 A | 6/1999 | Leedy |
| 6,040,605 A | 3/2000 | Sano et al. |
| 6,049,497 A | 4/2000 | Yero |
| 6,057,862 A | 5/2000 | Margulis |
| 6,107,133 A | 8/2000 | Furukawa et al. |
| 6,118,171 A | 9/2000 | Davies et al. |
| 6,130,838 A | 10/2000 | Kim et al. |
| 6,313,518 B1 | 11/2001 | Ahn et al. |
| 6,314,046 B1 | 11/2001 | Kamiya et al. |
| 6,362,508 B1 | 3/2002 | Rasovaky et al. |
| 6,396,744 B1 | 5/2002 | Wong |
| 6,434,053 B1 | 8/2002 | Fujiwara |
| 6,580,124 B1 | 6/2003 | Cleeves et al. |
| 6,587,365 B1 | 7/2003 | Salling |
| 6,627,503 B2 | 9/2003 | Ma |
| 6,744,094 B2 | 6/2004 | Forbes |
| 6,754,105 B1 | 6/2004 | Chang et al. |
| 6,774,458 B2 | 8/2004 | Fricke et al. |
| 6,873,004 B1 | 3/2005 | Han et al. |
| 6,881,994 B2 | 4/2005 | Lee et al. |
| 6,946,703 B2 | 9/2005 | Ryu et al. |
| 7,005,350 B2 | 2/2006 | Walker et al. |
| 7,177,977 B2 | 2/2007 | Chen et al. |
| 7,223,653 B2 | 5/2007 | Cheng et al. |
| 7,307,308 B2 | 12/2007 | Lee |
| 7,465,980 B2 | 12/2008 | Arimoto et al. |
| 7,489,002 B2 | 2/2009 | Forbes et al. |
| 7,512,012 B2 | 3/2009 | Kuo |
| 7,524,725 B2 | 4/2009 | Chung |
| 7,542,348 B1 | 6/2009 | Kim |
| 7,612,411 B2 | 11/2009 | Walker |
| 7,709,359 B2 | 5/2010 | Boescke et al. |
| 7,804,145 B2 | 9/2010 | Shimizu et al. |
| 7,872,295 B2 | 1/2011 | Park et al. |
| 7,898,009 B2 | 3/2011 | Wilson et al. |
| 8,026,521 B1 | 9/2011 | Or-Bach et al. |
| 8,139,418 B2 | 3/2012 | Carman |
| 8,178,396 B2 | 5/2012 | Sinha et al. |
| 8,237,213 B2 | 8/2012 | Liu |
| 8,242,504 B2 | 8/2012 | Kim |
| 8,278,183 B2 | 10/2012 | Lerner |
| 8,304,823 B2 | 11/2012 | Boescke |
| 8,383,482 B2 | 2/2013 | Kim et al. |
| 8,395,942 B2 | 3/2013 | Samachisa et al. |
| 8,604,618 B2 | 12/2013 | Cooney et al. |
| 8,630,114 B2 | 1/2014 | Lue |
| 8,743,612 B2 | 6/2014 | Choi et al. |
| 8,767,436 B2 | 7/2014 | Scalia et al. |
| 8,767,473 B2 | 7/2014 | Shim et al. |
| 8,848,425 B2 | 9/2014 | Schloss |
| 8,878,278 B2 | 11/2014 | Alsmeier et al. |
| 9,053,801 B2 | 6/2015 | Sandhu et al. |
| 9,053,802 B2 | 6/2015 | Mueller |
| 9,190,293 B2 | 11/2015 | Wang et al. |
| 9,202,694 B2 | 12/2015 | Konevecki et al. |
| 9,219,225 B2 | 12/2015 | Karda et al. |
| 9,230,985 B1 | 1/2016 | Wu et al. |
| 9,231,206 B2 | 1/2016 | Tao et al. |
| 9,263,577 B2 | 2/2016 | Ramaswamy et al. |
| 9,281,044 B2 | 3/2016 | Ramaswamy et al. |
| 9,299,580 B2 | 3/2016 | Kong et al. |
| 9,337,210 B2 | 5/2016 | Karda et al. |
| 9,362,487 B2 | 6/2016 | Inumiya et al. |
| 9,391,084 B2 | 7/2016 | Lue |
| 9,412,752 B1 | 8/2016 | Yeh et al. |
| 9,455,268 B2 | 9/2016 | Oh et al. |
| 9,472,560 B2 | 10/2016 | Ramaswamy et al. |
| 9,530,794 B2 | 12/2016 | Ramaswamy et al. |
| 9,558,804 B2 | 1/2017 | Müller |
| 9,620,605 B2 | 4/2017 | Liang et al. |
| 9,633,944 B2 | 4/2017 | Kim |
| 9,698,152 B2 | 7/2017 | Peri |
| 9,711,529 B2 | 7/2017 | Hu et al. |
| 9,748,172 B2 | 8/2017 | Takaki |
| 9,786,684 B2 | 10/2017 | Ramaswamy et al. |
| 9,799,761 B2 | 10/2017 | Or-Bach et al. |
| 9,818,468 B2 | 11/2017 | Müller |
| 9,818,848 B2 | 11/2017 | Sun et al. |
| 9,830,969 B2 | 11/2017 | Slesazeck et al. |
| 9,842,651 B2 | 12/2017 | Harari |
| 9,865,680 B2 | 1/2018 | Okumura et al. |
| 9,875,784 B1 | 1/2018 | Li et al. |
| 9,876,018 B2 | 1/2018 | Chavan et al. |
| 9,892,800 B2 | 2/2018 | Harari |
| 9,911,497 B1 | 3/2018 | Harari |
| 9,941,299 B1 | 4/2018 | Chen et al. |
| 10,014,317 B2 | 7/2018 | Peng |
| 10,038,092 B1 | 7/2018 | Chen et al. |
| 10,043,567 B2 | 8/2018 | Slesazeck et al. |
| 10,056,393 B2 | 8/2018 | Schroeder et al. |
| 10,074,667 B1 | 9/2018 | Higashi |
| 10,090,036 B2 | 10/2018 | Van Houdt |
| 10,096,364 B2 | 10/2018 | Harari |
| 10,121,553 B2 | 11/2018 | Harari et al. |
| 10,157,780 B2 | 12/2018 | Wu et al. |
| 10,211,223 B2 | 2/2019 | Van Houdt et al. |
| 10,211,312 B2 | 2/2019 | Van Houdt et al. |
| 10,217,667 B2 | 2/2019 | Or-Bach et al. |
| 10,249,370 B2 | 4/2019 | Harari |
| 10,254,968 B1 | 4/2019 | Gazit et al. |
| 10,283,493 B1 | 5/2019 | Nishida |
| 10,319,696 B1 | 6/2019 | Nakano |
| 10,355,121 B2 | 7/2019 | Or-Bach et al. |
| 10,373,956 B2 | 8/2019 | Gupta et al. |
| 10,381,370 B2 | 8/2019 | Shin et al. |
| 10,381,378 B1 | 8/2019 | Harari |
| 10,395,737 B2 | 8/2019 | Harari |
| 10,403,627 B2 | 9/2019 | Van Houdt et al. |
| 10,418,377 B2 | 9/2019 | Van Houdt et al. |
| 10,424,379 B2 | 9/2019 | Slesazeck et al. |
| 10,431,596 B2 | 10/2019 | Herner et al. |
| 10,438,645 B2 | 10/2019 | Müller et al. |
| 10,460,788 B2 | 10/2019 | Mueller |
| 10,475,812 B2 | 11/2019 | Harari |
| 10,510,773 B2 | 12/2019 | Ramaswamy et al. |
| 10,600,808 B2 | 3/2020 | Schröder et al. |
| 10,608,008 B2 | 3/2020 | Harari et al. |
| 10,608,011 B2 | 3/2020 | Harari et al. |
| 10,622,051 B2 | 4/2020 | Mueller et al. |
| 10,622,377 B2 | 4/2020 | Harari et al. |
| 10,636,471 B2 | 4/2020 | Ramaswamy et al. |
| 10,650,892 B2 | 5/2020 | Noack |
| 10,651,153 B2 | 5/2020 | Fastow et al. |
| 10,651,182 B2 | 5/2020 | Morris et al. |
| 10,651,196 B1 | 5/2020 | Sharangpani et al. |
| 10,692,837 B1 | 6/2020 | Nguyen et al. |
| 10,692,874 B2 | 6/2020 | Harari et al. |
| 10,700,093 B1 | 6/2020 | Kalitsov et al. |
| 10,720,437 B2 | 7/2020 | Yoo |
| 10,825,834 B1 | 11/2020 | Chen |
| 10,872,905 B2 | 12/2020 | Müller |
| 10,879,269 B1 | 12/2020 | Zhang et al. |
| 10,896,711 B2 | 1/2021 | Lee et al. |
| 10,937,482 B2 | 3/2021 | Sharma et al. |

(56) References Cited

U.S. PATENT DOCUMENTS

| | | |
|---|---|---|
| 10,950,616 B2 | 3/2021 | Harari et al. |
| 11,043,280 B1 | 6/2021 | Prakash et al. |
| 11,171,157 B1 | 11/2021 | Lai et al. |
| 11,411,025 B2 | 8/2022 | Lai et al. |
| 2001/0030340 A1 | 10/2001 | Fujiwara |
| 2001/0053092 A1 | 12/2001 | Kosaka et al. |
| 2002/0012271 A1 | 1/2002 | Forbes |
| 2002/0028541 A1 | 3/2002 | Lee et al. |
| 2002/0051378 A1 | 5/2002 | Ohsawa |
| 2002/0193484 A1 | 12/2002 | Albee |
| 2003/0038318 A1 | 2/2003 | Forbes |
| 2004/0214387 A1 | 10/2004 | Madurawe et al. |
| 2004/0246807 A1 | 12/2004 | Lee |
| 2004/0262681 A1 | 12/2004 | Masuoka et al. |
| 2004/0262772 A1 | 12/2004 | Ramanathan et al. |
| 2004/0264247 A1 | 12/2004 | Kim |
| 2005/0128815 A1 | 6/2005 | Ishikawa et al. |
| 2005/0218509 A1 | 10/2005 | Kipnis et al. |
| 2005/0236625 A1 | 10/2005 | Schuele et al. |
| 2005/0280061 A1 | 12/2005 | Lee |
| 2006/0001083 A1 | 1/2006 | Bhattacharyya |
| 2006/0080457 A1 | 4/2006 | Hiramatsu et al. |
| 2006/0140012 A1 | 6/2006 | Wan et al. |
| 2006/0155921 A1 | 7/2006 | Gorobets et al. |
| 2006/0212651 A1 | 9/2006 | Ashmore |
| 2006/0261404 A1 | 11/2006 | Forbes |
| 2007/0012987 A1 | 1/2007 | McTeer |
| 2007/0023817 A1 | 2/2007 | Dao |
| 2007/0045711 A1 | 3/2007 | Bhattacharyya |
| 2007/0134876 A1 | 6/2007 | Lai et al. |
| 2007/0192518 A1 | 8/2007 | Rupanagunta et al. |
| 2008/0022026 A1 | 1/2008 | Yang et al. |
| 2008/0054346 A1 | 3/2008 | Saitoh et al. |
| 2008/0160765 A1 | 7/2008 | Lee et al. |
| 2008/0173930 A1 | 7/2008 | Watanabe |
| 2008/0178794 A1 | 7/2008 | Cho et al. |
| 2008/0212358 A1 | 9/2008 | Mitsui |
| 2008/0239812 A1 | 10/2008 | Naofumi et al. |
| 2008/0266960 A1 | 10/2008 | Kuo |
| 2008/0291723 A1 | 11/2008 | Wang et al. |
| 2008/0301359 A1 | 12/2008 | Smith |
| 2009/0057722 A1 | 3/2009 | Masuoka et al. |
| 2009/0140318 A1 | 6/2009 | Dong |
| 2009/0157946 A1 | 6/2009 | Arya |
| 2009/0237996 A1 | 9/2009 | Kirsch et al. |
| 2009/0242966 A1 | 10/2009 | Son et al. |
| 2009/0268519 A1 | 10/2009 | Ishii |
| 2009/0279360 A1 | 11/2009 | Peter et al. |
| 2009/0290442 A1 | 11/2009 | Rajan |
| 2009/0316487 A1 | 12/2009 | Lee et al. |
| 2010/0013001 A1 | 1/2010 | Cho et al. |
| 2010/0121994 A1 | 5/2010 | Kim et al. |
| 2010/0124116 A1 | 5/2010 | Takashi et al. |
| 2010/0128509 A1 | 5/2010 | Kim et al. |
| 2010/0148215 A1 | 6/2010 | Schulze et al. |
| 2010/0207185 A1 | 8/2010 | Lee et al. |
| 2010/0213527 A1 | 8/2010 | Shim et al. |
| 2010/0219392 A1 | 9/2010 | Awaya et al. |
| 2010/0254191 A1 | 10/2010 | Son et al. |
| 2010/0327413 A1 | 12/2010 | Lee et al. |
| 2011/0003418 A1 | 1/2011 | Sakata et al. |
| 2011/0044113 A1 | 2/2011 | Kim |
| 2011/0047325 A1 | 2/2011 | Mishima |
| 2011/0115011 A1 | 5/2011 | Masuoka et al. |
| 2011/0134705 A1 | 6/2011 | Jones et al. |
| 2011/0143519 A1 | 6/2011 | Lerner |
| 2011/0170266 A1 | 7/2011 | Haensh et al. |
| 2011/0208905 A1 | 8/2011 | Shaeffer et al. |
| 2011/0291176 A1 | 12/2011 | Lee et al. |
| 2011/0298013 A1 | 12/2011 | Hwang et al. |
| 2011/0310683 A1 | 12/2011 | Gorobets |
| 2012/0063223 A1 | 3/2012 | Lee |
| 2012/0064682 A1 | 3/2012 | Jang et al. |
| 2012/0146126 A1 | 6/2012 | Lai et al. |
| 2012/0182801 A1 | 7/2012 | Lue |
| 2012/0208347 A1 | 8/2012 | Hwang et al. |
| 2012/0223380 A1 | 9/2012 | Lee et al. |
| 2012/0243314 A1 | 9/2012 | Takashi |
| 2012/0307568 A1 | 12/2012 | Banna et al. |
| 2012/0327714 A1 | 12/2012 | Lue |
| 2013/0031325 A1 | 1/2013 | Nakamoto et al. |
| 2013/0126957 A1 | 5/2013 | Higashitani et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0070289 A1 | 3/2014 | Tanaka et al. |
| 2014/0070290 A1 | 3/2014 | Inumiya et al. |
| 2014/0075135 A1 | 3/2014 | Choi et al. |
| 2014/0112075 A1 | 4/2014 | Dunga et al. |
| 2014/0117366 A1 | 5/2014 | Saitoh |
| 2014/0151774 A1 | 6/2014 | Rhie |
| 2014/0173017 A1 | 6/2014 | Takagi et al. |
| 2014/0213032 A1 | 7/2014 | Kai et al. |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2014/0355328 A1 | 12/2014 | Müller et al. |
| 2015/0054507 A1 | 2/2015 | Gulaka et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0220463 A1 | 8/2015 | Fluman et al. |
| 2015/0249143 A1 | 9/2015 | Sano |
| 2015/0263005 A1 | 9/2015 | Zhao et al. |
| 2015/0340371 A1 | 11/2015 | Lue |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0086970 A1 | 3/2016 | Peng |
| 2016/0118404 A1 | 4/2016 | Peng |
| 2016/0141294 A1 | 5/2016 | Peri et al. |
| 2016/0225860 A1 | 8/2016 | Karda et al. |
| 2016/0276360 A1 | 9/2016 | Doda et al. |
| 2016/0300724 A1 | 10/2016 | Levy et al. |
| 2016/0314042 A1 | 10/2016 | Plants |
| 2016/0321002 A1 | 11/2016 | Jung et al. |
| 2016/0358934 A1 | 12/2016 | Lin et al. |
| 2017/0053906 A1 | 2/2017 | Or-Bach et al. |
| 2017/0062456 A1 | 3/2017 | Sugino et al. |
| 2017/0092370 A1 | 3/2017 | Harari |
| 2017/0092371 A1 | 3/2017 | Harari |
| 2017/0140807 A1 | 5/2017 | Sun et al. |
| 2017/0148517 A1 | 5/2017 | Harari |
| 2017/0148810 A1 | 5/2017 | Kai et al. |
| 2017/0194341 A1 | 7/2017 | Yamada |
| 2017/0213731 A1 | 7/2017 | Yoon et al. |
| 2017/0213821 A1 | 7/2017 | Or-Bach et al. |
| 2017/0358594 A1 | 12/2017 | Lu et al. |
| 2018/0006044 A1 | 1/2018 | Chavan et al. |
| 2018/0095127 A1 | 4/2018 | Pappu et al. |
| 2018/0108416 A1 | 4/2018 | Harari |
| 2018/0151419 A1 | 5/2018 | Wu et al. |
| 2018/0261613 A1 | 9/2018 | Ariyoshi et al. |
| 2018/0269229 A1 | 9/2018 | Or-Bach et al. |
| 2018/0286918 A1 | 10/2018 | Bandyopadhyay et al. |
| 2018/0314635 A1 | 11/2018 | Alam |
| 2018/0330791 A1 | 11/2018 | Li et al. |
| 2018/0331042 A1 | 11/2018 | Manusharow et al. |
| 2018/0342455 A1 | 11/2018 | Nosho et al. |
| 2018/0342544 A1 | 11/2018 | Lee et al. |
| 2018/0366471 A1 | 12/2018 | Harari et al. |
| 2018/0366485 A1 | 12/2018 | Harari |
| 2018/0366489 A1 | 12/2018 | Harari et al. |
| 2018/0374929 A1 | 12/2018 | Yoo |
| 2019/0006009 A1 | 1/2019 | Harari |
| 2019/0006015 A1 | 1/2019 | Norman et al. |
| 2019/0019564 A1 | 1/2019 | Li et al. |
| 2019/0067327 A1 | 2/2019 | Herner et al. |
| 2019/0148286 A1 | 5/2019 | Or-Bach et al. |
| 2019/0157296 A1 | 5/2019 | Harari et al. |
| 2019/0180821 A1 | 6/2019 | Harari |

(56) References Cited

U.S. PATENT DOCUMENTS

| | | |
|---|---|---|
| 2019/0198509 A1 | 6/2019 | Kim |
| 2019/0206890 A1 | 7/2019 | Harari et al. |
| 2019/0214077 A1 | 7/2019 | Oh et al. |
| 2019/0237470 A1 | 8/2019 | Mine et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0304988 A1 | 10/2019 | Dong et al. |
| 2019/0319044 A1 | 10/2019 | Harari |
| 2019/0325945 A1 | 10/2019 | Linus |
| 2019/0325964 A1 | 10/2019 | Harari |
| 2019/0348424 A1 | 11/2019 | Karda et al. |
| 2019/0355747 A1 | 11/2019 | Herner et al. |
| 2019/0370117 A1 | 12/2019 | Fruchtman et al. |
| 2020/0006376 A1 | 1/2020 | Makala et al. |
| 2020/0020718 A1 | 1/2020 | Harari et al. |
| 2020/0051990 A1 | 2/2020 | Harari et al. |
| 2020/0063263 A1 | 2/2020 | Yang et al. |
| 2020/0065647 A1 | 2/2020 | Mulaosmanovic et al. |
| 2020/0075631 A1 | 3/2020 | Dong |
| 2020/0098738 A1 | 3/2020 | Herner et al. |
| 2020/0098779 A1 | 3/2020 | Cernea et al. |
| 2020/0098881 A1 | 3/2020 | Vellianitis |
| 2020/0176468 A1 | 6/2020 | Herner et al. |
| 2020/0201718 A1 | 6/2020 | Richter et al. |
| 2020/0203378 A1 | 6/2020 | Harari et al. |
| 2020/0219572 A1 | 7/2020 | Harari |
| 2020/0227123 A1 | 7/2020 | Salahuddin et al. |
| 2020/0243486 A1 | 7/2020 | Quader et al. |
| 2020/0258897 A1 | 8/2020 | Yan et al. |
| 2020/0350234 A1 | 11/2020 | Shan et al. |
| 2020/0350324 A1 | 11/2020 | Hoffman |
| 2020/0357453 A1 | 11/2020 | Slesazeck et al. |
| 2020/0357455 A1 | 11/2020 | Noack et al. |
| 2020/0357470 A1 | 11/2020 | Noack |
| 2020/0357822 A1 | 11/2020 | Chen |
| 2020/0365609 A1 | 11/2020 | Harari |
| 2020/0388313 A1 | 12/2020 | Cho et al. |
| 2020/0388711 A1 | 12/2020 | Doyle et al. |
| 2020/0403002 A1 | 12/2020 | Harari |
| 2020/0411533 A1 | 12/2020 | Alsmeier et al. |
| 2021/0005238 A1 | 1/2021 | Mueller |
| 2021/0013224 A1 | 1/2021 | Purayath et al. |
| 2021/0020659 A1 | 1/2021 | Chen |
| 2021/0066502 A1 | 3/2021 | Karda et al. |
| 2021/0074725 A1 | 3/2021 | Lue |
| 2021/0074726 A1 | 3/2021 | Lue |
| 2021/0111179 A1 | 4/2021 | Shivaraman et al. |
| 2021/0175251 A1 | 6/2021 | Zhang et al. |
| 2021/0242241 A1* | 8/2021 | Rajashekhar .......... H10B 41/10 |
| 2021/0247910 A1 | 8/2021 | Kim et al. |
| 2021/0248094 A1 | 8/2021 | Norman et al. |
| 2021/0265308 A1 | 8/2021 | Norman et al. |
| 2021/0320182 A1* | 10/2021 | Chien .................. H10D 30/697 |
| 2021/0375933 A1 | 12/2021 | Lu et al. |
| 2021/0407600 A1 | 12/2021 | Cariello |
| 2021/0407845 A1 | 12/2021 | Wang et al. |
| 2022/0005830 A1 | 1/2022 | Wu et al. |
| 2022/0028876 A1 | 1/2022 | Purayath et al. |
| 2022/0028886 A1 | 1/2022 | Pur et al. |
| 2022/0028894 A1* | 1/2022 | Yang ................... H10D 62/115 |
| 2022/0059549 A1* | 2/2022 | Lai ......................... H10B 51/40 |
| 2022/0084564 A1 | 3/2022 | Choi et al. |
| 2022/0139933 A1 | 5/2022 | Noack |
| 2022/0231049 A1 | 7/2022 | Lin et al. |
| 2022/0246766 A1 | 8/2022 | Manfrini et al. |
| 2022/0246776 A1 | 8/2022 | Onozaki et al. |
| 2022/0254390 A1 | 8/2022 | Gans et al. |
| 2022/0351776 A1 | 11/2022 | Nam et al. |
| 2022/0367479 A1 | 11/2022 | Lee et al. |
| 2022/0384459 A1 | 12/2022 | Lu et al. |
| 2022/0393031 A1 | 12/2022 | Ando et al. |
| 2023/0052477 A1 | 2/2023 | Ha et al. |
| 2023/0143057 A1 | 5/2023 | Hoang et al. |
| 2023/0209835 A1 | 6/2023 | Wu et al. |

FOREIGN PATENT DOCUMENTS

| | | |
|---|---|---|
| JP | 2004079606 A | 3/2004 |
| JP | 2006099827 A1 | 4/2006 |
| JP | 2009206451 A1 | 9/2009 |
| JP | 2010108522 A1 | 5/2010 |
| JP | 2010251572 A | 11/2010 |
| JP | 2011028540 A1 | 2/2011 |
| KR | 20120085591 A1 | 8/2012 |
| KR | 20120085603 A | 8/2012 |
| WO | 2016018412 A1 | 2/2016 |
| WO | 2018236937 A1 | 12/2018 |
| WO | 2019066948 A1 | 4/2019 |
| WO | 2021141612 A1 | 7/2021 |

OTHER PUBLICATIONS

Kim, N. , et al., "Multi-layered Vertical gate NANO Flash Overcoming Stacking Limit for Terabit Density Storage", Symposium on VLSI Tech. Dig. of Technical Papers, 2009, pp. 188-189.

Lee, Sang Yeol, "Comprehensive Review on Amorphous Oxide Semiconductor Thin Film Transistor", Trans. Electr. Electron. Mater. 21, https://doi.org/10.1007/s42341-020-00197-w, Mar. 28, 2020, pp. 235-248.

Lee, Chea-Young , et al., "Etching Characteristics and Changes in Surface Properties of IGZO Thin Films by O2 Addition in CF4/Ar Plasma", Coatings. 2021, 11(8):906. https://doi.org/10.3390/coatings11080906, Jul. 29, 2021.

Liao, P.J. , et al., "Characterization of Fatigue and Its Recovery Behavior in Ferroelectric HfZrO", 2021 Symposium on VLSI Technology, Jun. 2021, 2 p.

Liao, C.Y. , et al., "Multibit Ferroelectric FET Based on Nonidentical Double HfZrO2 for High-Density Nonvolatile Memory", IEEE Electron Device Letters, vol. 42, No. 4, doi: 10.1109/LED.2021. 3060589., Apr. 2021, pp. 617-620.

Lue, H.T. , et al., "A Highly Scalable 8-Layer 3D Vertical-gate {VG} TFT NANO Flash Using Junction-Free Buried Channel BESONOS Device", Symposium on VLSI: Tech. Dig. Of Technical Papers, 2010, pp. 131-132.

Materano, Monica , et al., "Interplay between oxygen defects and dopants: effect on structure and performance of HfO2-based ferroelectrics", Inorg. Chem. Front. (8), Apr. 9, 2021, pp. 2650-2672.

McBriarty, Martin E., et al., "Crystal Phase Distribution and Ferroelectricity in Ultrathin HfO2—ZrO2 Bilayers", Phys. Status Solidi B, 257: 1900285. https://doi.org/10.1002/pssb.201900285, 8/21/82019, pp. 1-25.

Mittmann, T. , et al., "Impact of Oxygen Vacancy Content in Ferroelectric HZO films on the Device Performance", 2020 IEEE International Electron Devices Meeting (IEDM), doi: 10.1109/IEDM13553.2020.9372097., 2020, pp. 18.4.1-18.4.4.

Wann, H.C. , et al., "High-Endurance Ultra-Thin Tunnel Oxide in Monos Device Structure for Dynamic Memory Application", IEEE Electron Device letters, vol. 16, No. 11, Nov. 1995, pp. 491-493.

Mo, Fei , et al., "Experimental Demonstration of Ferroelectric HfO2 FET with Ultrathin-body IGZO for High-Density and Low-Power Memory Application", Symposium on VLSI Technology, 2019, pp. T42-T43, doi: 10.23919/VLSIT.2019.8776553., Jul. 13, 2020, 7 pages.

Mo, Fei , et al., "Low-Voltage Operating Ferroelectric FET with Ultrathin IGZO Channel for High-Density Memory Application", IEEE Journal of the Electron Devices Society, vol. 8, doi: 10.1109/JEDS.2020.3008789., Jul. 13, 2020, pp. 717-723.

Mueller, S. , et al., "Development Status of Gate-First FeFET Technology", 2021 Symposium on VLSI Technology, Jun. 2021, 2 pages.

Mueller, J. , et al., "Ferroelectric Hafnium Oxide Based Materials and Devices: Assessment of Current Status and Future Prospects", ECS Journal of Solid State Science and Technology, 4 (5) N30-N35 (2015), Feb. 21, 2015, pp. N29-N35.

(56) References Cited

OTHER PUBLICATIONS

Mueller, J. , et al., "Ferroelectric hafnium oxide: A CMOS-compatible and highly scalable approach to future ferroelectric memories", IEEE International Electron Devices Meeting, Washington, DC, USA, doi: 10.1109/IEDM.2013.6724605., 2013, pp. 10.8.1-10.8.4.

Mueller, Stephen , et al., "From MFM Capacitors Toward Ferroelectric Transistors: Endurance and Disturb Characteristics of HfO2-Based FeFET Devices", IEEE Transactions on Electron Devices, vol. 60, No. 12, doi: 10.1109/TED.2013.2283465., Dec. 2013, pp. 4199-4205.

Wu, Jixuan , et al., "A Monolithic 3D Integration of RRAM Array with Oxide Semiconductor FET for In-Memory Computing in Quantized Neural Network AI Applications", 2020 IEEE Symposium on VLSI Technology Digest of Technical Papers, Honolulu, HI, USA, Jun. 2020, 4 pages.

Nguyen, Manh-Cuong , et al., "Wakeup-Free and Endurance-Robust Ferroelectric Field-Effect Transistor Memory Using High Pressure Annealing", IEEE Electron Device Letters, vol. 42, No. 9, doi: 10.1109/LED.2021.3096248., Sep. 2021, pp. 1295-1298.

On, Nuri , et al., "Boosting carrier mobility and stability in indium-zinc-tin oxide thin-film transistors through controlled crystallization", Sci Rep 10, 18868, https://doi.org/10.1038/s41598-020-76046-w, 2020, 16 pages.

Onaya, Takashi , et al., "Improvement in ferroelectricity of HfxZr1-xO2 thin films using top- and bottom-ZrO2 nucleation layers", APL Materials 7, 061107; https://doi.org/10.1063/1.5096626, 2019, pp. 1-8.

Onuki, Tatsuya , et al., "Embedded memory and ARM Cortex-M0 core using 60-nm C-axis aligned crystalline indium-gallium-zinc oxide FET integrated with 65-nm Si CMOS", IEEE Journal of Solid-State Circuits, vol. 52, No. 4,, Apr. 2017, pp. 925-932.

Park, Goon-Ho , et al., "Electrical Characteristics of SiO2/High-k Dielectric Stacked Tunnel Barriers for Nonvolatile Memory Applications", Journal of the Korean Physical Society, vol. 55, No. 1, Jul. 2009, pp. 116-119.

Park, Min Hyuk, et al., "Review of defect chemistry in fluorite-structure ferroelectrics for future electronic devices", J. Mater. Chem. C, vol. 8, No. 31 10526-10550, Jun. 9, 2020., Aug. 21, 2020, pp. 10526-10550.

Rios, Rafael , et al., "A Physically Based Compact Model for IGZO Transistors", IEEE Transactions on Electron Devices, vol. 68, No. 4, doi: 10.1109/TED.2021.3059387., Apr. 2021, pp. 1664-1669.

Rzehak, Volker , "Low-Power FRAM Microcontrollers and Their Applications", Texas Instruments White Paper, SLAA502, Jul. 2019, 7 pages.

Saitoh, Masumi , et al., "HfO2-based FeFET and FTJ for Ferroelectric-Memory Centric 3D LSI towards Low-Power and High-Density Storage and AI Applications", 2020 IEEE International Electron Devices Meeting (IEDM), doi: 10.1109/IEDM13553.2020.9372106., 2020, pp. 18.1.1-18.1.4.

Yang, Jin , et al., "Highly Optimized Complementary Inverters Based on p-SnO and n-InGaZnO With High Uniformity", IEEE Electron Device Letters, vol. 39, No. 4, doi: 10.1109/LED.2018.2809796., Apr. 2018, pp. 516-519.

Salahuddin, Sayeef , et al., "FeFETs for Near-Memory and In-Memory Compute", 2021 IEEE International Electron Devices Meeting (IEDM), Department of Electrical Engineering and Computer Sciences, Dec. 2021, 4 pages.

Sato, Yuta , et al., "Source/Drain Contact Engineering of InGaZnO Channel BEOL Transistor for Low Contact Resistance and Suppressing Channel Shortening Effect,", 20th International Workshop on Junction Technology (IWJT), doi: 10.23919/IWJT52818.2021.9609366., 2021, 3 pages.

Sharma, Abhishek A., et al., "High Speed Memory Operation in Channel-Last, Back-gated Ferroelectric Transistors", IEEE International Electron Devices Meeting (IEDM), doi: 10.1109/IEDM13553.2020.9371940., 2020, pp. 18.5.1-18.5.4.

Sheng, Jiazhen , et al., "Review Article: Atomic layer deposition for oxide semiconductor thin film transistors: Advances in research and development", J. Vac. Sci. Technol. A 36, 060801, https://doi.org/10.1116/1.5047237., Nov. 2, 2018, 14 pages.

Si, Mengwei , et al., "Why In2O3 Can Make 0.7 nm Atomic Layer Thin Transistors?", https://arxiv.org/ftp/arxiv/papers/2012/2012.12433.pdf., 2012, 26 pages.

Si, Mengwei , et al., "Why In2o03 Can Make 0.7 nm Atomic Layer Thin Transistors?", available at https://arxiv.org/ftp/arxiv/papers/2012/2012.12433.pdf, School of Electrical and Computer Engineering and Birck Nanotechnology Center, Purdue University, West Lafayette, IN 47907, United States, 2012, pp. 1-26.

Su, Nai-Chao , et al., "A Nonvolatile InGaZnO Charge-Trapping-Engineered Flash Memory With Good Retention Characteristics", IEEE Electron Device Letters, vol. 31, No. 3, Mar. 2010, pp. 201-203.

Sun, Chen , "First Demonstration of BEOL-Compatible Ferroelectric TCAM Featuring a-IGZO Fe-TFTs with Large Memory Window of 2.9 V, Scaled Channel Length of 40 nm, and High Endurance of 10/\8 Cycles", 2021 Symposium on VLSI Technology Digest of Technical Papers, Kyoto, doi: 978-4-86348-779-6., Jun. 2021, 2 pages.

Tan, Ava J., et al., "A Nitrided Interfacial Oxide for Interface State Improvement in Hafnium Zirconium Oxide-Based Ferroelectric Transistor Technology", IEEE Electron Device Letters, vol. 39, No. 1, doi: 10.1109/LED.2017.2772791., Jan. 2018, pp. 95-98.

Tan, Ava J., et al., "Experimental Demonstration of a Ferroelectric HfO2-Based Content Addressable Memory Cell", IEEE Electron Device Letters, vol. 41, No. 2, doi: 10.1109/LED.2019.2963300., Feb. 2020, pp. 240-243.

Tan, Ava Jiang, et al., "Ferroelectric HfO2 Memory Transistors with High-κ Interfacial Layer and Write Endurance Exceeding 1010 Cycles", arXiv:2103.08806 [physics.app-ph], available at https://arxiv.org/abs/2103.08806., Mar. 16, 2021.

Tan, Ava J., et al., "Hot Electrons as the Dominant Source of Degradation for Sub-5nm HZO FeFETs", IEEE Symposium on VLSI Technology, Honolulu, HI, USA, doi: 10.1109/VLSITechnology18217.2020.9265067., 2020, pp. 1-2.

Tan, Yan-Ny , et al., "Over-Erase Phenomenon in SONOS-Type Flash Memory and its Minimization Using a Hafnium Oxide Charge Storage Layer", IEEE Transactions on Electron Devices, vol. 51, No. 7, Jul. 2004, pp. 1143-1147.

Tanaka, T. , et al., "A 768 GB 3b/cell 3D-Floaling-Gate NANO Flash Memory", Digest of Technical Papers, the 2016 EEE International Solid-Slate Circuits Conference, 2016, pp. 142-144.

Van Houdt, Jan , "The 3D FeFET: contender for 3D-NAND Flash memory and machine learning", available at https://www.imec-int.com/en/imec-magazine/imec-magazine-Oct. 2017/the-vertical-ferroelectric-fet-a-new-contender-for-3d-nand-flash-memory-and-machine-learning, Sep. 30, 2019, 8 pages.

Wang, Chin-I , et al., "Atomic layer deposited TiN capping layer for sub-10 nm ferroelectric Hf0.5Zr0.5O2 with large remnant polarization and low thermal budget", Applied Surface Science, vol. 570, 2021, 151152, ISSN 0169-4332, https://doi.org/10.1016/j.apsusc.2021.151152., Aug. 9, 2021, pp. 1-8.

"EP Extended Search Report EP168690149.3", Oct. 18, 2019.

"European Search Report, EP 16852238.1", Mar. 28, 2019.

"European Search Report, EP17844550.8", Aug. 12, 2020, 11 pages.

"Imec Demonstrates Capacitor-less IGZO-Based DRAM Cell With >400s Retention Time", IMEC, Press release, available at https://www.imec-int.com/en/press/imec-demonstrates-capacitor-less-igzo-based-dram-cell-400s-retention-time, Dec. 15, 2020, 15 pages.

"Invitation to Pay Additional Fees (PCT/ISA/206), PCT/US2020/015710", Mar. 20, 2020, 2 pages.

"Invitation to Pay Additional Fees, PCT/US2019/065256", Feb. 13, 2020, 2 pages.

"Notification of Reasons for Refusal, Japanese Patent Application 2018-527740", (English translation), Nov. 4, 2020, 8 pages.

"Partial European Search Report EP 16869049.3", Jul. 1, 2019, pp. 1-12.

"PCT Search Report and Written Opinion, PCT/US2018/038373", Sep. 10, 2018.

"PCT Search Report and Written Opinion, PCT/US2018/067338", May 8, 2019.

(56)                References Cited

OTHER PUBLICATIONS

"PCT Search Report and Written Opinion, PCT/US2019/014319", Apr. 15, 2019.
"PCT Search Report and Written Opinion, PCT/US2019/041678", Oct. 9, 2019.
"PCT Search Report and Written Opinion, PCT/US2019/052164", Feb. 27, 2020.
"PCT Search Report and Written Opinion, PCT/US2019/052446", Dec. 11, 2019.
"PCT Search Report and Written Opinion, PCT/US2019/065256", Apr. 14, 2020.
"PCT Search Report and Written Opinion, PCT/US2020/015710", Jun. 9, 2020.
"PCT Search Report and Written Opinion, PCT/US2020/017494", Jul. 20, 2020, 13 pages.
"PCT Search Report and Written Opinion, PCT/US2020/065374", Mar. 15, 2021, 17 pages.
"PCT Search Report and Written Opinion, PCT/US2020/065670", Apr. 5, 2021, 12 pages.
"PCT Search Report and Written Opinion, PCT/US2021/016964", Jun. 15, 2021, 19 pages.
"PCT Search Report and Written Opinion, PCT/US2021/025722", Jun. 15, 2021, 10 pages.
"PCT Search Report and Written Opinion, PCT/US2021/042607", Nov. 4, 2021, 17 pages.
"PCT Search Report and Written Opinion, PCT/US2021/064844", Mar. 8, 2022, 15 paged.
"PCT Search Report and Written Opinion, PCT/US2021/42620", Oct. 28, 2021, 18 pages.
"PCT Search Report and Written Opinion, PCT/US2022/016729", Applicant: SunRise Memory Corporation, May 17, 2022, 20 pages.
"PCT Search Report and Written Opinion, PCT/US2022/039473", Dec. 6, 2022, 14 pages.
Ahn, Min-Ju , et al., "Transparent multi-level-cell nonvolatile memory with dual-gate amorphous indiumgallium-zinc oxide thin-film transistors", Appl. Phys. Lett. 109, 252106; doi: 10.1063/1.4972961., 2016, 6 pages.
Alessandri, Cristobal , et al., "Monte Carlo Simulation of Switching Dynamics in Polycrystalline Ferroelectric Capacitors", IEEE Transactions on Electron Devices, vol. 66, No. 8, doi: 10.1109/TED.2019.2922268., Aug. 2019, pp. 3527-3534.
Ali, T. , et al., "A Multilevel FeFET Memory Device based on Laminated HSO and HZO Ferroelectric Layers for High-Density Storage", IEEE International Electron Devices Meeting (IEDM), 2019, doi: 10.1109/IEDM19573.2019.8993642., Dec. 2019, pp. 28.7.1-28.7.4.
Ali, T. , et al., "High Endurance Ferroelectric Hafnium Oxide-Based FeFET Memory Without Retention Penalty,", IEEE Transactions on Electron Devices, vol. 65, No. 9, doi: 10.1109/TED.2018.2856818.—paper cited in Bae (Berkeley) paper, Sep. 2018, pp. 3769-3774.
Bae, Jong-Ho , et al., "Highly Scaled, High Endurance, Q-Gate, Nanowire Ferroelectric FET Memory Transistors", IEEE Electron Device Letters, vol. 41, No. 11, doi: 10.1109/LED.2020.3028339.—Sayeef-Berkeley paper on FeFET memory, Nov. 2020, pp. 1637-1640.
Beyer, Sven , et al., "FeFET: A versatile CMOS compatible device with game-changing potential", IEEE International Memory Workshop (IMW), doi: 10.1109/IMW48823.2020.9108150., 2020, pp. 1-4.
Böscke, T.S. , et al., "Ferroelectricity in hafnium oxide: CMOS compatible ferroelectric field effect transistors", 2011 International Electron Devices Meeting, Washington, DC, USA, doi: 10.1109/IEDM.2011.6131606., 2011, pp. 24.5.1-24.5.4.
Chan, Chi-Yu , et al., "FeFET Memory Featuring Large Memory Window and Robust Endurance of Long-Pulse Cycling by Interface Engineering using High-k AlON", 2020 IEEE Symposium on VLSI Technology, doi: 10.1109/VLSITechnology18217.2020.9265103., 2020, pp. 1-2.
Chang, Sou-Chi , et al., "Anti-ferroelectric HfxZr1-xO2 Capacitors for High-density 3-D Embedded-DRAM", IEEE International Electron Devices Meeting (IEDM), doi: 10.1109/IEDM13553.2020.9372011., 2020, pp. 28.1.1-28.1.4.
Cho, Min Hoe, et al., "Achieving a Low-Voltage, High-Mobility IGZO Transistor through an ALD-Derived Bilayer Channel and a Hafnia-Based Gate Dielectric Stack", ACS Applied Materials & Interfaces, Apr. 1, 2021, 13 (14), , DOI: 10.1021/acsami.0c22677, 2021, pp. 16628-16640.
Cho, Min Hoe, et al., "Comparative Study on Performance of IGZO Transistors With Sputtered and Atomic Layer Deposited Channel Layer", IEEE Transactions on Electron Devices, vol. 66, No. 4, doi: 10.1109/TED.2019.2899586., Apr. 2019, pp. 1783-1788.
Choi, Seonjun , et al., "A novel three-dimensional NAND flash structure for improving the erase performance", IEICE Electronics Express, 2019 vol. 16 Issue 3, 2019, 6 pages.
Dünkel , "A FeFET based super-low-power ultra-fast embedded NVM technology for 22nm FDSOI and beyond", IEEE International Electron Devices Meeting (IEDM), San Francisco, CA, USA, 2017, doi: 10.1109/IEDM.2017.8268425., 2017, pp. 19.7.1-19.7.4.
Dutta, Sourav , et al., "Logic Compatible High-Performance Ferroelectric Transistor Memory", available at https://arxiv.org/abs/2105.11078, Department of Electrical Engineering, University of Notre Dame, Notre Dame, IN 46556, USA, May 24, 2021, 28 pages.
Florent, K. , "First demonstration of vertically stacked ferroelectric Al doped HfO2 devices for NAND applications", Symposium on VLSI Technology, doi: 10.23919/VLSIT.2017.7998162., 2017, pp. T158-T159.
Florent, K. , et al., "Vertical Ferroelectric HfO2 FET based on 3-D Nand Architecture: Towards Dense Low-Power Memory", IEEE International Electron Devices Meeting (IEDM), San Francisco, CA, 2018, doi: 10.1109/IEDM.2018.8614710., 2018, pp. 2.5.1-2.5.4.
Hendy, Ian , "The Role of Increased Semiconductor Mobility—an IGZO Case Study", Display Daily, available at https://www.displaydaily.com/article/display-daily/the-role-of-increased-semiconductor-mobility-an-igzo-case-study, Apr. 2021, 11 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Hsain, Hanan Alexandra, et al., "Many routes to ferroelectric HfO2: A review of current deposition methods", J. Vac. Sci. Technol. A 40, 010803 (2022), published Dec. 1, 2021., Dec. 1, 2021, pp. 010803-1-010803-36.
Jeewandara, Thamarasee , et al., "High-speed 3-D memory with ferroelectric NAND flash memory", available at https://techxplore.com/news/2021-01-high-speed-d-memoryferroelectric-nand.html, Jan. 26, 2021, 5 pages.
Kim, Min-Kyu , et al., "CMOS-compatible ferroelectric NAND flash memory for high-density, low-power, and high-speed three-dimensional memory", Science Advances, vol. 7, No. 3, eabe 1341, DOI: 10.1126/sciadv.abe1341. (Replacement of polysilicon channel material-use IZO for channel), Jan. 13, 2021, 10.
M. O'Connor et al., "Fine-Grained DRAM: Energy-Efficient DRAM for Extreme Bandwidth Systems," 2017 50th Annual IEEE/ACM International Symposium on Microarchitecture (MICRO), Boston, MA, USA, 2017, pp. 41-54.
PCT Search Report and Written Opinion PCT/US2023/010501, dated Jun. 29, 2023.
Kunitake, Hitoshi, et al., High-temperature Electrical Characteristics of 60nm CAAC-IGZO FET: Comparison with Si Fet, International Conference on Solid State Devices and Materials, https://doi.org/10.7567/SSDM.2018. N-3-04, Sep. 2018, pp. 787-788.
Mo, Fei, et al., "Experimental Demonstration of Ferroelectric HfO2 FET with Ultrathin-body IGZO for High-Density and Low-Power Memory Application," 2019 Symposium on VLSI Technology, 2019, pp. T42-T43, doi: 10.23919/VLSIT.2019.8776553, 2 pages.
De, Sourav , et al., "Ultra-Low Power Robust 3bit/cell Hf0.5Zr0.5O2 Ferroelectric FinFET with High Endurance for Advanced Computing-In-Memory Technology", 2021 Symposium on VLSI Technology, Kyoto, Japan, Jun. 13-19, 2021, Jun. 2021, 2 pages.
Kawai, H. , et al., "Design Principle of Channel Material for Oxide-Semiconductor Field-Effect Transistor with High Thermal Stability and High On-current by Fluorine Doping", IEEE Interna-

(56)       References Cited

OTHER PUBLICATIONS tional Electron Devices Meeting (IEDM), doi: 10.1109/IEDM13553.
2020.9372121., 2020, pp. 22.2.1-22.2.4.

* cited by examiner

MEMORY STRUCTURE INCLUDING HIGH DENSITY THREE-DIMENSIONAL NOR MEMORY STRINGS OF JUNCTIONLESS FERROELECTRIC STORAGE TRANSISTORS AND METHOD OF FABRICATION

CROSS REFERENCE TO RELATED APPLICATIONS

This application claims priority to U.S. Provisional Patent Application No. 63/315,797, entitled MEMORY STRUCTURE INCLUDING HIGH DENSITY THREE-DIMENSIONAL NOR MEMORY STRINGS OF JUNCTIONLESS FERROELECTRIC STORAGE TRANSISTORS AND METHOD OF FABRICATION, filed Mar. 2, 2022, which is incorporated herein by reference in its entirety for all purposes.

FIELD OF THE INVENTION

The invention relates to high-density memory structures, and in particular, the present invention relates to high-density, low read-latency memory structures formed by interconnected thin-film storage elements (e.g., 3-dimensional array of thin-film storage transistors), including those organized as NOR-type memory strings ("NOR memory strings"), and fabrication processes thereof.

BACKGROUND OF THE INVENTION

A NOR-type memory string includes storage transistors that share a common source region and a common drain region, where each storage transistor can be individually addressed and accessed. U.S. Pat. No. 10,121,553 (the '553 patent), entitled "Capacitive-Coupled Non-Volatile Thin-film Transistor NOR Strings in Three-Dimensional Arrays," issued on Nov. 6, 2018, discloses storage transistors (or memory transistors) organized as 3-dimensional arrays of NOR memory strings formed above a planar surface of a semiconductor substrate. The '553 patent is hereby incorporated by reference in its entirety for all purposes. In the '553 patent, a NOR memory string includes numerous thin-film storage transistors that share a common bit line and a common source line. In particular, the '553 patent discloses a NOR memory string that includes (i) a common source region and a common drain region both running lengthwise along a horizontal direction and (ii) gate electrodes for the storage transistors each running along a vertical direction. In the present description, the term "vertical" refers to the direction normal to the surface of a semiconductor substrate, and the term "horizontal" refers to any direction that is parallel to the surface of that semiconductor substrate. In a 3-dimensional array, the NOR memory strings are provided on multiple planes (e.g., 8 or 16 planes) above the semiconductor substrate, with the NOR memory strings on each plane arranged in rows. For a charge-trap type storage transistor, data is stored in each storage transistor using a charge storage film as the gate dielectric material. For examples, the charge storage film includes a tunneling dielectric layer, a charge trapping layer and a blocking layer, which can be implemented as a multilayer including silicon oxide or oxynitride, silicon-rich nitride, and silicon oxide, arranged in this order and referred to as an ONO layer. An applied electrical field across the charge storage film adds or removes charge from charge traps in the charge trapping layer, altering the threshold voltage of the storage transistor to encode a given logical state to the storage transistor.

Advances in electrically polarizable materials ("ferroelectric materials"), especially those that are being used in semiconductor manufacturing processes, suggest new potential applications in ferroelectric memory circuits. For example, the article "Ferroelectricity in Hafnium Oxide: CMOS compatible Ferroelectric Field Effect Transistors," by T. S. Böscke et al., published in 2011 *International Electron Devices Meeting (IEDM)*, pp. 24.5.1-24.5.4, discloses a ferroelectric field effect transistor ("FeFET") that uses hafnium oxide as a gate dielectric material. By controlling the polarization direction in a ferroelectric gate dielectric layer, the FeFET may be programmed to have either one of two threshold voltages. Each threshold voltage of the FeFET constitutes a state, for example, a "programmed" state or an "erased" state, that represents a designated logical value. Such an FeFET has application in high-density memory circuits. For example, U.S. Pat. No. 9,281,044, entitled "Apparatuses having a ferroelectric field-effect transistor memory array and related method," by D. V. Nirmal Ramaswamy et al., filed on May 17, 2013, discloses a 3-dimensional array of FeFETs.

SUMMARY OF THE INVENTION

The present disclosure discloses a memory structure including three-dimensional NOR memory strings of junctionless ferroelectric memory transistors and method of fabrication, substantially as shown in and/or described below, for example in connection with at least one of the figures, as set forth more completely in the claims.

In some embodiments, a three-dimensional memory structure formed above a planar surface of a semiconductor substrate includes an array of thin-film ferroelectric storage transistors being organized as an array of stacks of NOR memory strings, the storage transistors within each NOR memory string sharing a common source layer and a common drain layer, spaced apart by a first isolation layer, with each layer extending along a first direction. The common source layer and the common drain layer each includes a conductive layer formed between the first isolation layer. Each NOR memory string extends along the first direction that is substantially parallel to the planar surface of the semiconductor substrate. The NOR memory strings of each stack are (a) provided one on top of another along a second direction substantially normal to the planar surface, and (b) isolated one from the other memory string by a second isolation layer. A semiconductor oxide layer formed on the sidewalls of each stack of NOR memory strings and, with respect to each NOR memory string within the stack, in contact with the common source layer and the common drain layer of the NOR memory string, thus providing channel regions for the storage transistors of the NOR memory string. A ferroelectric gate dielectric layer is provided adjacent the semiconductor oxide layer. A set of conductors are provided between adjacent stacks of NOR memory strings, each conductor extending along the second direction, and each serving as a common gate electrode for a group of storage transistors in the NOR memory strings of the adjacent stacks. Within a stack of NOR memory strings, the semiconductor oxide layer for the storage transistors of a first NOR memory string are separated from the semiconductor oxide layer for the storage transistors of a second adjacent NOR memory string in the same stack in the second direction.

In other embodiments, a process suitable for use in fabricating a memory structure including storage transistors of a NOR memory string above a planar surface of a semiconductor substrate includes: above the planar surface, repeatedly depositing, alternately and one over another, a multilayer and an inter-layer sacrificial layer, each multilayer including first and second sacrificial layers and a first isolation layer between the first and second sacrificial layers; forming a first set of trenches in the multilayers and the inter-layer sacrificial layers, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width; and forming a semiconductor oxide layer on the sidewalls of the first set of trenches; forming a second set of trenches in the multilayers and the inter-layer sacrificial layers, each trench in the second set of trenches having substantially the same depth, length and width as the first set of trenches. The first and second set of trenches divide the multilayers into an array of stacks of multilayer strips, each stack being separated from an adjacent stack by one of the trenches. The process further includes replacing the first and second sacrificial layers with first and second conductive layers; and forming the semiconductor oxide layer also on the sidewalls of the second set of trenches.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

DETAILED DESCRIPTION OF THE INVENTION

Figure 1A:
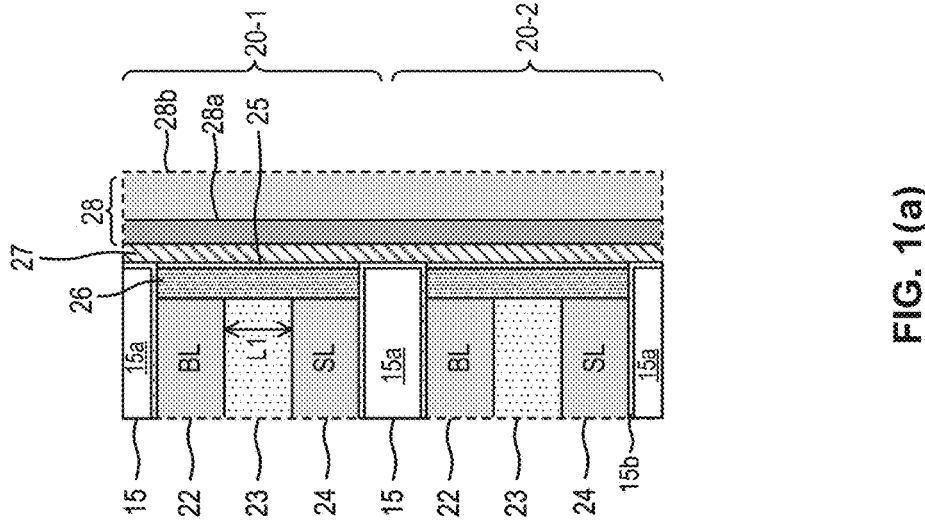
FIG. 1(a), is a perspective view of a memory structure including a 3-dimensional array of NOR memory strings in some embodiments.
Figure 1A:

In embodiments of the present invention, a memory structure includes randomly accessible ferroelectric storage transistors organized as horizontal NOR memory strings.

The NOR memory strings are formed over a semiconductor substrate in multiple scalable memory stacks of thin-film storage transistors. The ferroelectric storage transistors in each NOR memory string share a common source line and a common drain line extending in a horizontal direction. The channel layer of the ferroelectric storage transistors is formed on the sidewalls of the memory stacks, in contact with the common source line and the common drain line of each NOR memory string. Gate dielectric layers and gate conductor layers of the storage transistors are formed in a vertical direction in narrow trenches between the memory stacks to form storage transistors in multiple parallel planes of each stack, a storage transistor being formed at each intersection of a gate conductor layer and the common source line and the common drain line of a memory string. In the present description, the term "vertical" refers to the direction normal to the surface of a semiconductor substrate, and the term "horizontal" refers to any direction that is parallel to the surface of that semiconductor substrate.

In embodiments of the present invention, each memory stack includes multiple NOR memory strings formed one on top of another in the vertical direction. In some embodiments, the stacks of NOR memory strings are formed by groups of thin films successively deposited over a planar surface of a semiconductor substrate, each group of thin films being referred to as an "active layer" in the present description. The active layers in each stack of NOR memory strings are provided one on top of another and separated from the other by an inter-layer isolation layer. Each active layer includes conductive layers as the common drain line and the common source line, each line being arranged spaced apart from the other in the vertical direction by a channel spacer dielectric layer. The common drain line and the common line layer may be provided as sacrificial layers during initial processing and replaced by the conductive layers in later processing.

In embodiments of the present disclosure, the ferroelectric storage transistors are thin-film ferroelectric field-effect transistors (FeFETs) having a ferroelectric polarization layer as a gate dielectric layer, the ferroelectric polarization layer being formed adjacent a semiconductor oxide layer as a channel region. The ferroelectric storage transistors include source and drain regions—both formed of a metallic conductive material—in electrical contact with the semiconductor oxide channel region. The ferroelectric storage transistors thus formed are each a junctionless transistor without a p/n junction in the channel and in which the threshold voltage is modulated by the polarization of the mobile carriers in the ferroelectric polarization layer. In the memory structure of the present invention, the ferroelectric storage transistors in each NOR memory string are controlled by individual control gate electrodes to allow each storage transistor to be individually addressed and accessed. In some embodiments, the ferroelectric polarization layer is formed of a doped hafnium oxide material and the semiconductor oxide channel region is formed of an amorphous metal oxide semiconductor material.

In the present description, the term "semiconductor oxide layer" (sometimes also referred to as "oxide semiconductor layer" or "metal oxide semiconductor layer") as used herein refers to thin film semiconducting materials made from a conductive metal oxide, such as zinc oxide and indium oxide, or any suitable conductive metal oxides with charge-carriers having mobilities that can be modified or modulated using suitable preparation or inclusion of suitable impurities.

In the present embodiments, the storage transistors in the NOR memory strings are ferroelectric field effect transistors including a ferroelectric thin film as the gate dielectric layer, also referred to as the ferroelectric polarization layer or ferroelectric gate dielectric layer or ferroelectric dielectric layer. In a ferroelectric field effect transistor (FeFET), the polarization direction in the ferroelectric gate dielectric layer is controlled by an electric field applied between the transistor drain terminal and the transistor gate electrode, where changes in the polarization direction alters the threshold voltage of the FeFET. In some embodiments, the electric field is applied to both the transistor drain and source terminals, relative to the transistor gate electrode. For example, the FeFET may be programmed to have either one of two threshold voltages, where each threshold voltage of the FeFET can be used to encode a given logical state. For example, the two threshold voltages of the FeFET can be used to encode a "programmed" state and an "erased" state, each representing a designated logical value. In some embodiments, more than two threshold voltages may be established to represent more than two memory states at each FeFET.

The memory structure of the present invention realizes many advantages over known or existing memory structures and devices. First, ferroelectric storage transistors manufactured on vertical walls are very compact and can be manufactured in three-dimensional memory stacks at lower temperatures that are compatible with logic back-end-of-line (BEOL) processes. Ferroelectric storage transistors can operate at lower voltages than conventional charge-trapping storage transistors. These characteristics of the ferroelectric storage transistors enable easy integration of a memory array of three-dimensional horizontal NOR (HNOR) memory strings directly above digital and analog integrated circuits that are built at the surface of a semiconductor substrate. Until recently, ferroelectric transistors had limited endurance. Recent advances in ferroelectric memory research has demonstrated erase/write endurance in excess of $1 \times 10^{11}$ cycles as well as fast erase and fast program operations, which enable the use of ferroelectric storage transistors in embedded memory applications. For example, Tan et al. demonstrated ferroelectric memory transistors formed on a crystalline silicon channel with endurance exceeding 1010 cycles. (See, for example, Ava Jiang Tan et al., "Ferroelectric HfO$_2$ Memory Transistors with High-K Interfacial Layer and Write Endurance Exceeding 101° Cycles," arXiv: 2103.08806 [physics.app-ph], submitted Mar. 16, 2021, available at https://arxiv.org/abs/2103.08806.)

In some embodiments, the ferroelectric storage transistors, as described herein, provide high endurance, long data retention, and relatively low voltage operations for both erase and programming operations (e.g., under +/−5.0 volts). By combining the ferroelectric or polarization characteristics with the 3-dimensional organization (e.g., as the thin-film NOR memory strings described herein), the memory structure of ferroelectric storage transistors of the present invention achieves the additional benefits of high-density, low-cost memory arrays with the advantages of high-speed, randomly accessed memory circuits with low read latency.

Second, the three-dimensional memory structure of the present invention includes ferroelectric storage transistors that use semiconductor oxide layer (or a metal oxide semiconductor layer) as the junctionless channel regions, eliminating the need for heavily doped polysilicon layers for source and drain regions, resulting in a reduced thickness of each active layer in a memory stack as compared to storage transistors formed using traditional polysilicon channel regions with heavily doped semiconductor layers as the source and drain regions. In particular, semiconductor oxide channels have the advantage of a high mobility for greater switching performance and without concern for electron or hole tunneling, as compared to traditional polysilicon channels. Ferroelectric storage transistors with junctionless semiconductor oxide channels also support shorter channel length than is possible with polysilicon doped channels while providing lower channel leakage and reduced GIDL (Gate Induced Drain Leakage) effect.

More specifically, the length of the junctionless channel of the ferroelectric transistor can be significantly shorter than the length of the polysilicon channel, thereby allowing the ferroelectric memory structure of the present invention to be more scalable in stack height, making it easier to deposit and etch multiple layers of three dimensional ferroelectric memory strings that make up ever taller memory stacks. In particular, a thinner active layer results in a reduced aspect ratio (AR) for etching the deep trenches between the memory stacks. In turn, reduced aspect ratios allow building more memory planes within a given total height of the three-dimensional memory structure.

In some embodiments, a memory structure of one or more memory layers (or memory planes) of ferroelectric transistors can be configured to serve as high density embedded memory in logic integrated circuits; the high density is made possible by the fact that the ferroelectric transistors are formed along the vertical walls of memory stack, therefore requiring very little physical space in the horizontal X-Y dimension. For example, the three dimensional ferroelectric memory structure of the present invention can be constructed in the form of a "skyscraper," allows the formation of a high capacity memory circuit embedded within a logic integrated circuit. Embedding the memory structure of the present invention is made possible by virtue of the relatively low temperatures (typically under 500° C.) required to build the ferroelectric memory stacks, therefore minimizing any damage to the transistors making up the logic integrated circuits sharing the same substrate.

Third, the memory structure of the present invention is formed in a fabrication process where the channel layer is deposited as a continuous conformal layer on the sidewalls of the stacks and subsequently separated and isolated to each memory string in the stack by backside selective etching through access openings provided by an inter-layer sacrificial layer formed between each active layer and to be replaced in subsequent process steps by an inter-layer isolation layer. In one example, the stacks are formed by groups of thin films (active layers) separated by an inter-layer sacrificial layer, such as a silicon germanium or carbon layer, which is to be subsequently replaced by an insulation layer, which can be a dielectric layer or an air gap isolation. During intermediate processing steps, the inter-layer sacrificial layer is removed which provides access openings to the channel layer formed on the sidewall of the stacks at the areas between adjacent active layers. The exposed portion of the channel layer (referred herein as the backside of the channel layer) at each stack is etched using the access openings to separate and isolate the channel layer to each active layer, thereby forming the channel regions for the NOR memory strings in multiple planes.

Fourth, in embodiments of the present invention, the memory structure can be constructed using air gaps as the insulation between the active layers forming the NOR memory strings in the vertical direction. Air gaps have a dielectric constant approximately 1.0, which is considerably lower than most dielectric materials, thereby effectively reducing the parasitic capacitance between adjacent pair of NOR memory strings in the vertical direction. Using air gaps as the isolation between active layers improve the isolation between adjacent NOR memory string and enhance the performance of the memory device formed therefrom. In some embodiment, the inter-layer isolation layer between active layers includes an air gap liner layer to passivate the exposed surfaces of the inter-layer cavities, the remaining unfilled portions of the cavities forming the air gap isolation.

Fifth, in embodiments of the present invention, each storage transistor in the stacks of NOR memory strings may be isolated from other storage transistors in both the horizontal and vertical directions. In particular, each NOR memory string in a stack is isolated from other NOR memory strings in the same stack by the inter-layer isolation layer, which can be an air gap isolation. The storage transistors in each NOR memory string are further separated and isolated from each other along the NOR memory string (in the horizontal direction). For example, the channel layer between adjacent columns of the gate conductor layer formed in the narrow trenches is removed to isolate the storage transistors along the NOR memory strings in the horizontal direction. In this manner, each storage transistor can be completely isolated from other storage transistors in the same NOR memory string or from storage transistors in NOR memory strings formed in other planes in the same stack. The storage transistors in each NOR memory string are controlled by individual gate conductors to allow each storage transistor to be individually addressed and accessed.

These and other advantages of the memory structure of the present invention will be described further in the following description. In the present description, to facilitate reference to the figures, a Cartesian coordinate reference frame is used, in which the Z-direction is normal to the planar surface of the semiconductor surface and the X-direction and the Y-directions are orthogonal to the Z-direction and to each other, as indicated in the figures. Furthermore, the drawings provided herein are idealized representations to illustrate embodiments of the present disclosure and are not meant to be actual views of any particular component, structure, or device. The drawings are not to scale, and the sizes and relative sizes and dimensions of layers and regions may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components throughout.

In the present description, the term "storage transistor" is used interchangeably with "memory transistor" to refer to the memory device formed in the memory structure described herein. In some examples, the memory structure of the present disclosure including NOR memory strings of randomly accessible storage transistors (or memory transistors) can have applications in computing systems as the main memory where the memory locations are directly accessible by the processors of the computer systems, for instance, in a role served in the prior art by conventional random-access memories (RAMs), such as dynamic RAMs (DRAMS) and static RAMs (SRAMs). For example, the memory structure of the present disclosure can be applied in computing systems to function as a random-access memory to support the operations of microprocessors, graphical processors and artificial intelligence processors. In other examples, the memory structure of the present disclosure is also applicable to form a storage system, such as a solid-state drive or replacing a hard drive, for providing long term data storage in computing systems.

Figure 1:
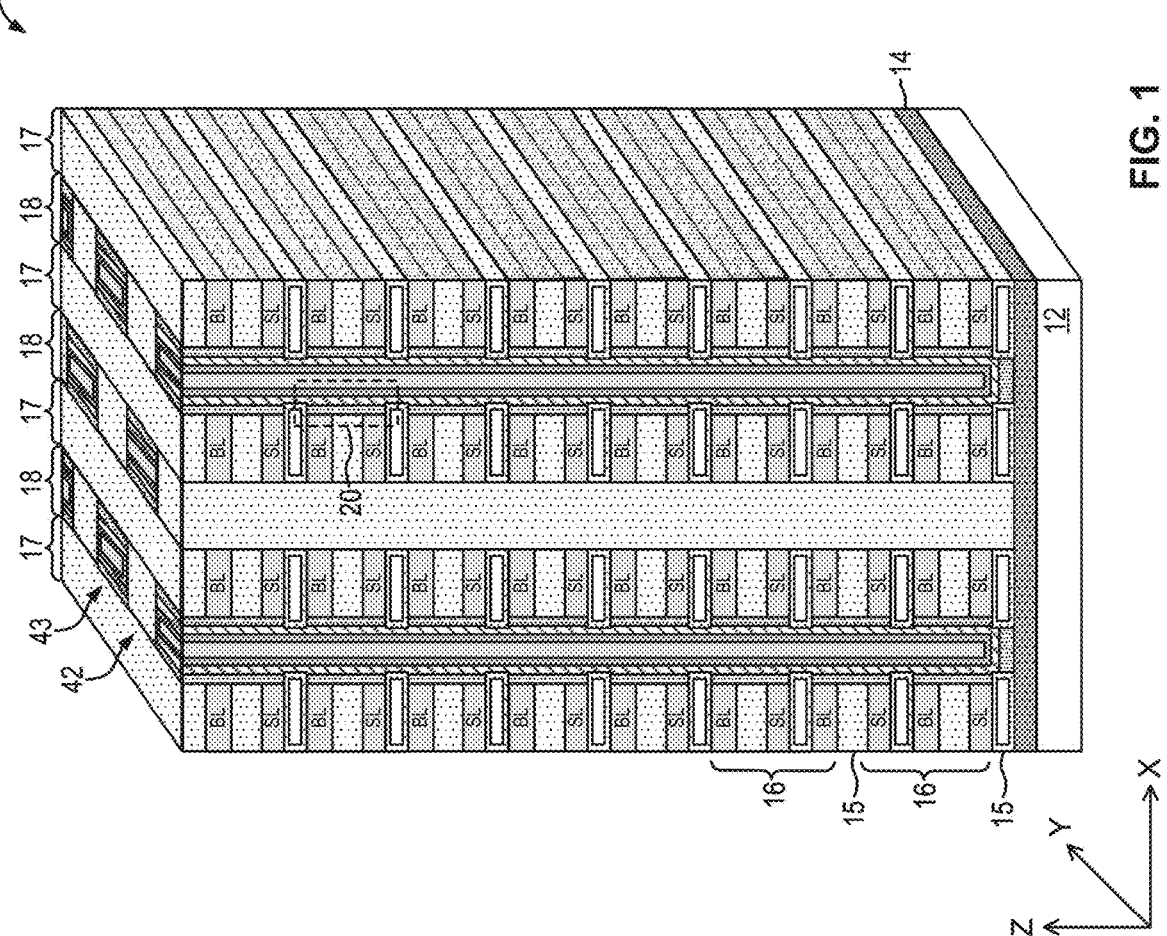
FIG. 1, which includes

FIG. 1, which includes FIG. 1(a), is a perspective view of a memory structure including a 3-dimensional array of NOR memory strings in some embodiments. The memory structure can be used to implemented part of a semiconductor memory device in some examples. Referring to FIG. 1, a memory structure 10 includes a number of active layers 16 formed on a planar surface of a semiconductor substrate 12. An insulating layer 14 may be provided between the semiconductor substrate 12 and the active layers 16 formed on the substrate. The active layers 16 are formed one on top of another in the Z-direction (i.e., along a direction normal to the planar surface of the substrate 12) and separated from each other by an inter-layer isolation layer 15. The active layers 16 are divided in the X-direction into narrow strips ("active strips") that are stacked one on top of another to form stacks of active strips 17 ("active stacks 17") extending in the Y-direction. The stacks 17 are also referred to as memory stacks in the present description.

Each active layer 16 includes first and second low resistivity conductive layer (e.g., titanium nitride (TiN)-lined tungsten (W)), separated by a channel spacer dielectric layer (e.g., silicon oxide). During intermediate processing steps, the active layer may include sacrificial layers (e.g., silicon nitride) to be subsequently replaced by conductive layers. Subsequent processing steps form the channel layers, gate dielectric layers, and the gate conductor layers in narrow trenches 18 between the separated active stacks. The narrow trenches 18 are also referred to as "LWL trenches" in the present description. The gate conductor layers and the gate dielectric layers are formed as columnar structures extending in the Z-direction. In the present description, the gate conductor layers are also referred to as "local word lines" and a gate conductor with a gate dielectric layer is collectively referred to a local word line (LWL) structure 43. The local word line structures 43 in each trench 18 are separated from each other by a dielectric-filled shaft 42.

The first and second conductive layers of each active strip form a drain region ("common bit line") and a source region ("common source line"), respectively, of the storage transistors. The storage transistors may be formed along one or both sides of the active strip in an active stack 17. In particular, a storage transistor 20 is formed at the intersection of an active strip with the channel layer and an LWL structure 43. In the present illustration, the LWL structures 43 are formed staggered in adjacent trenches bordering an active strip so that storage transistors formed on both sides of an active strip are offset from each other in the Y-direction along the memory string.

In the present embodiments, the storage transistors are ferroelectric storage transistors and the gate dielectric layer is a ferroelectric gate dielectric layer. In some embodiments, the ferroelectric gate dielectric layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric gate dielectric layer is a material selected from: zirconium-doped hafnium oxide (HZO), silicon-doped hafnium oxide (HSO), aluminum zirconium-doped hafnium oxide (HfZrAlO), aluminum-doped hafnium oxide (HfO$_2$:Al), lanthanum-doped hafnium oxide (HfO$_2$:La), hafnium zirconium oxynitride (HfZrON), hafnium zirconium aluminum oxide (HfZrAlO), and any hafnium oxide that includes zirconium impurities.

FIG. 1(a) illustrates the detail construction of the storage transistor 20 formed in the memory structure 10 in some embodiments. In particular, FIG. 1(a) illustrates a pair of storage transistors 20-1 and 20-2 in two adjacent planes of a memory stack. Referring to FIG. 1(*a*), the storage transistor 20 includes a first conductive layer 22 forming the drain region (the common drain line or the common bit line) and a second conductive layer 24 forming the source region (the common source line), the conductive layers being spaced apart by the channel spacer dielectric layer 23. The storage transistor 20 further includes the channel layer 26 formed vertically along the sidewall of the memory stack and in contact with both the first conductive layer 22 and the second conductive layer 24. The gate dielectric layer 27 and the gate conductor layer 28 are formed on the sidewall of the memory stack. The storage transistor 20 is isolated from adjacent storage transistors in the stack by an inter-layer isolation layer 15. As thus configured, along each active strip (in the Y-direction), the storage transistors that share the common source line and the common bit line form a NOR memory string (referred herein as a "Horizontal NOR memory string" or "HNOR memory string").

Each storage transistor 20 is isolated from adjacent storage transistors along an active stack (in the Z-direction) by the inter-layer isolation layer 15. In the present embodiment, the inter-layer isolation layer 15 is an air gap isolation formed by an air gap cavity 15a and an optional air gap liner 15b. The air gap liner 15b is a dielectric layer used to passivate the exposed surface of the air gap cavity 15a. In one embodiment, the air gap liner 15b is a silicon nitride layer. The air gap liner 15b may be 1 nm-3 nm thick. In FIG. 1(*a*), elements are sometimes exaggerated in size for illustrative purposes only. It is understood that the depictions in this and other figures are not necessarily to scale. The air gap cavities 15a forming the inter-layer isolation layer 15 provides effective isolation between adjacent storage transistors 20 along a memory stack. In embodiments of the present invention, the inter-layer isolation layer 15 is also used to provide physical separation between the channel layer 26 of one storage transistor and the channel layer of the storage transistors above or below it in the same memory stack, as will be described in more details below.

In embodiments of the present invention, the storage transistors in the memory structure 10 are junctionless ferroelectric storage transistors. Accordingly, each storage transistor 20 includes only conductive layers as the source and drain regions, without any semiconductor layers. The first and second conductive layers are formed using a low resistivity metallic conductive material. In some embodiments, the first and second conductive layers are metal layers, such as a titanium nitride (TiN)-lined tungsten (W) layer, a tungsten nitride (WN)-lined tungsten (W) layer, a molybdenum nitride (MoN) lined molybdenum (Mo) layer, or a liner-less tungsten or molybdenum or cobalt layer, or other metal layers. The channel spacer dielectric layer 23 between the first and second conductive layers may be a dielectric layer, such as silicon dioxide ($SiO_2$). The channel layer 26 is a semiconductor oxide layer. In some examples, the channel layer 26 is formed using an amorphous oxide semiconductor material, such as indium gallium zinc oxide (InGaZnO or IGZO), indium zinc oxide (IZO), indium tungsten oxide (IWO), or indium tin oxide (ITO), or other such semiconductor oxide materials. A semiconductor oxide channel region has the advantage of a high mobility for greater switching performance and without concern for electron or hole tunneling. For example, an IGZO film has an electron mobility of 10.0-100.0 cm2/V, depending on the relative compositions of indium, gallium, zinc and oxygen.

In the present example, the gate conductor layer 28 includes a titanium or titanium nitride layer 28a bordering the gate dielectric layer 27 and a conductive filler layer 28b, such as tungsten or a heavily doped polysilicon layer, filling the remaining area in the local word line.

To form the ferroelectric storage transistor, the gate dielectric layer 27 of the storage transistor 20 is a ferroelectric gate dielectric layer or ferroelectric polarization layer 27 in contact with the channel layer 26. The ferroelectric polarization layer 27 serves as the storage layer of the storage transistor. In some embodiments, an interfacial layer 25 may be provided between the semiconductor oxide channel layer 26 and the ferroelectric polarization layer 27. The interfacial layer 25 is a thin layer and may be 0.5 nm to 2 nm thick. In some embodiments, the interfacial layer is formed using a material with a high dielectric constant (K) (also referred to as "high-K" material). In the present description, a material with a high dielectric constant or a high-K material refers to a material with a dielectric constant greater than the dielectric constant of silicon dioxide. In some embodiments, the interfacial layer 25 may be a silicon nitride ($Si_3N_4$) layer, or a silicon oxynitride layer, or an aluminum oxide ($Al_2O_3$) layer. In one example, the interfacial layer, if present, may have a thickness of 1.5 nm when the ferroelectric polarization layer has a thickness of 4-5 nm. The inclusion of the interfacial layer 25 in FIG. 1(*a*) is illustrative only and not intended to be limiting. The interfacial layer 25 is optional and may be omitted in other embodiments of the present invention. In other embodiments, the interfacial layer 25, when included, may be formed as a multi-layer of different dielectric materials.

A salient feature of the ferroelectric storage transistor 20 is that the storage transistor can have a very short channel length, which is operative to increase the voltage separation between the different threshold voltages, while the memory structure 10 can be manufactured without requiring costly lithography techniques to realize the short channel length. In particular, the channel length of the ferroelectric storage transistor 20 is determined by the thickness L1 of the channel spacer dielectric layer 23. The thickness L1 can be accurately controlled during the deposition of the sublayers 22, 23, 24 forming the initial memory stack. The ability to control the thickness L1 by deposition process, together with the very low channel leakage of semiconductor oxide channel layer, make it possible to provide a ferroelectric storage transistor 20 with very short channel length, such as a channel length of 5 nm, without needing to employ costly lithography such as extreme ultraviolet scanners (EUV) that are necessary to pattern short channels in planar transistors. In some embodiments, the thickness L1, or the channel length of the storage transistor, can be between 5 nm and 20 nm, or between 5-7 nm.

Referring again to FIG. 1, to complete the memory circuit, various types of circuitry are formed in or at the surface of the semiconductor substrate 12 to support the operations of the HNOR memory strings. Such circuits are referred to as "circuits under array" ("CuA") and may include digital and analog circuitry such as decoders, drivers, sense amplifiers, sequencers, state machines, exclusive OR circuits, memory caches, multiplexers, voltage level shifters, voltage sources, latches and registers, and connectors, that execute repetitive local operations such as processing random address, activate, erase, program, read, and refresh commands with the memory arrays formed above the semiconductor substrate 12. In some embodiments, the transistors in the CuA is built using a process optimized for the control circuits, such as an advanced manufacturing process that is optimized for forming low-voltage and faster logic circuits. In some embodiments, the CuA is built using fin field-effect transistors (FinFET) or gate-all-around field-effect transistors (GAAFET) to realize a compact circuit layer and enhanced transistor performance.

In some embodiments, the CuA provides the data path to and from the memory array and further to a memory controller that may be built on the same semiconductor substrate as the CuA. Alternatively, the memory controller may reside on a separate semiconductor substrate, in which case the CuA and the associated data path are electrically connected to the memory controller using various bonding techniques. In some examples, the memory controller includes control circuits for accessing and operating the storage transistors in the memory array connected thereto, performing other memory control functions, such as data routing and error correction, and providing interface functions with systems interacting with the memory array.

The memory structure 10 of FIG. 1 illustrates a construction of a 3-dimensional array of NOR memory strings in some embodiments. In some embodiments, the memory structure 10 is fabricated in process that realizes advantageous features for the memory structure. First, the memory structure 10 is formed so that the storage transistors in the 3-dimensional array of NOR memory strings are individually isolated from other storage transistors. In particular each storage transistor is isolated in the vertical direction by the inter-layer isolation layer and in the horizontal direction by isolating the channel layer to each local word line structure 43, as shown in FIG. 1. The performance characteristics of the storage transistors are enhanced by individually isolating each storage transistors. Second, the channel layer can be deposited conformally and then channel separation between active layers in the memory stacks is realized by etching through access openings formed by the inter-layer sacrificial layer. This results in a simplified and more reliable process for forming the channel layer. Third, after the removal of the inter-layer sacrificial layer for channel separation, the remaining cavities between active layers can form air gap isolation between the active layers, realizing better isolation than most dielectric materials.

The memory structure 10 of the present disclosure includes a memory array portion fabricated as described above to form the 3-dimensional array of NOR memory strings. To complete the memory device, the memory structure includes staircase portions provided at the ends of the memory strings (in the Y-directions). The staircase portions are not shown in the present figures to simplify the discussion. The thin-film storage transistors of the NOR memory strings are formed in the memory array portion while the staircase portions include staircase structures to provide connections through conductive vias to the common bit lines and, optionally, the common source lines, of the NOR memory strings. In some embodiments, the common source lines are pre-charged to serve as virtual voltage reference source during programming, reading and erase operations, thereby obviating the need for a continuous electrical connection with the support circuitry during such operations. In the present description, the common source lines are described as being electrically floating. Various processing steps for forming staircase structures in the memory structure can be used. The processing steps for forming the staircase structures can be before, after, or interleaved with the processing steps for forming the memory array portion described below.

Figure 2A:
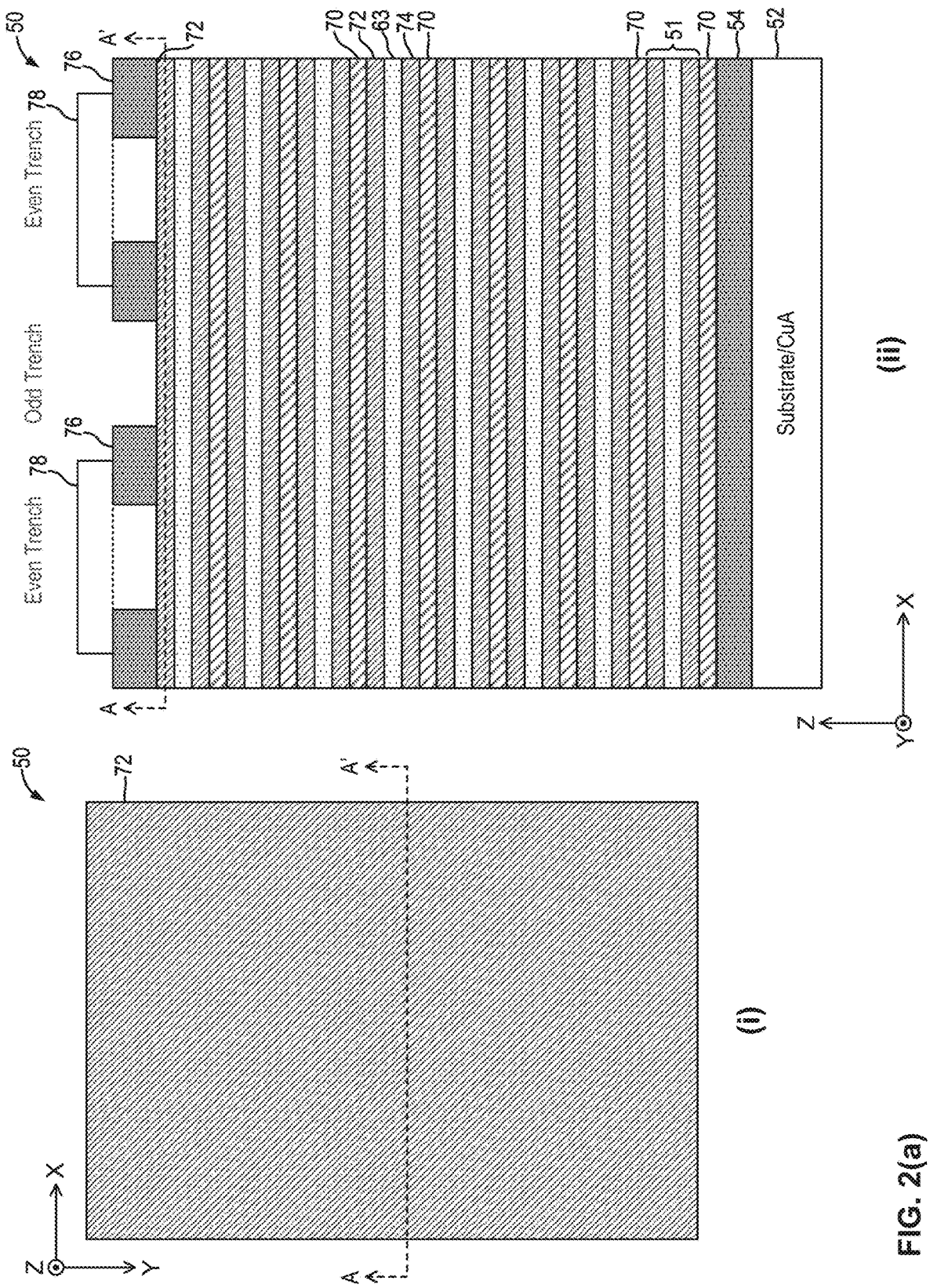
FIGS. 2(a) to 2(s), including FIGS. 2(11) and 2(01), illustrate a process for fabricating a memory structure including HNOR memory strings in embodiments of the present invention.
Figure 2B:
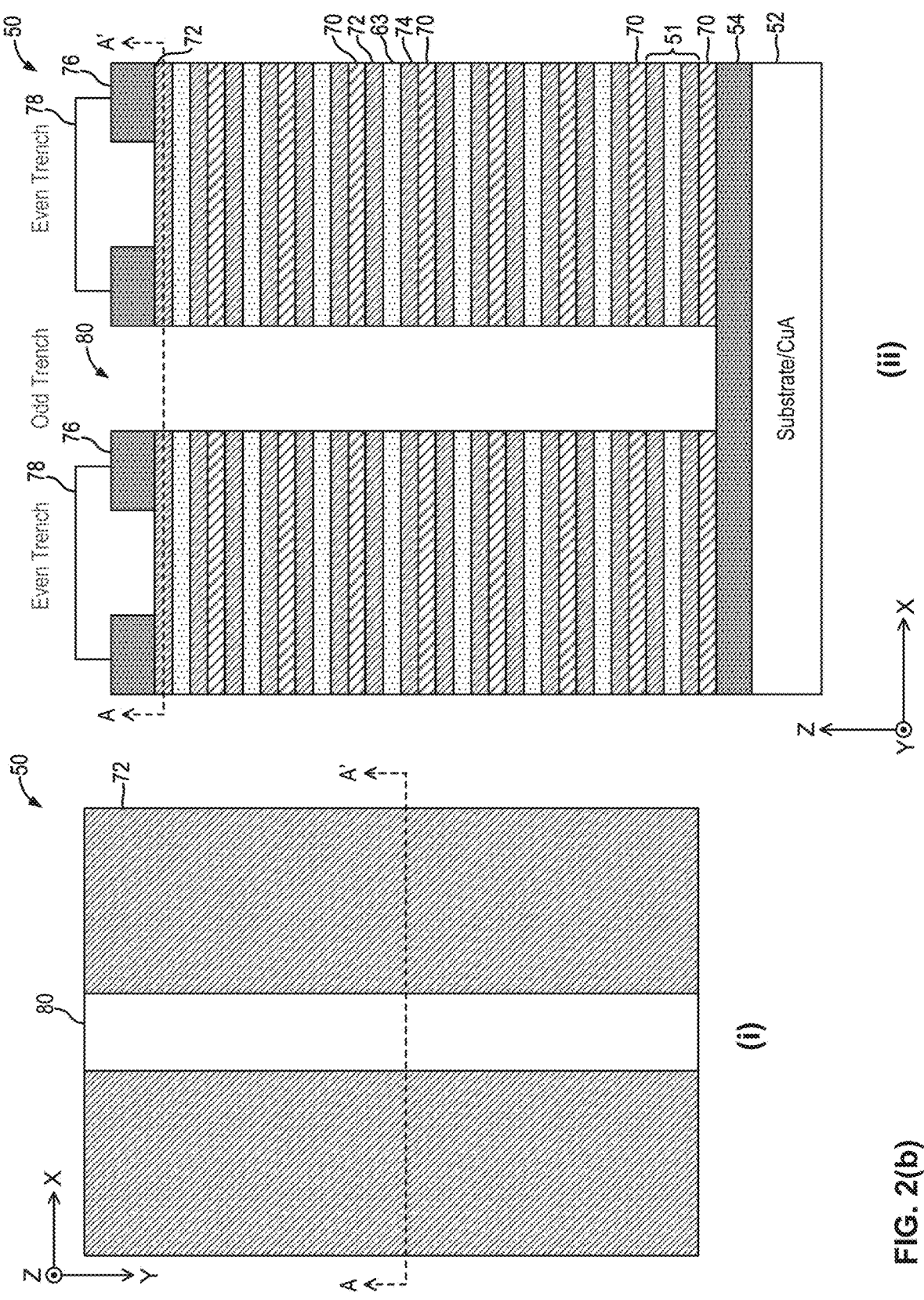
Figure 2C:
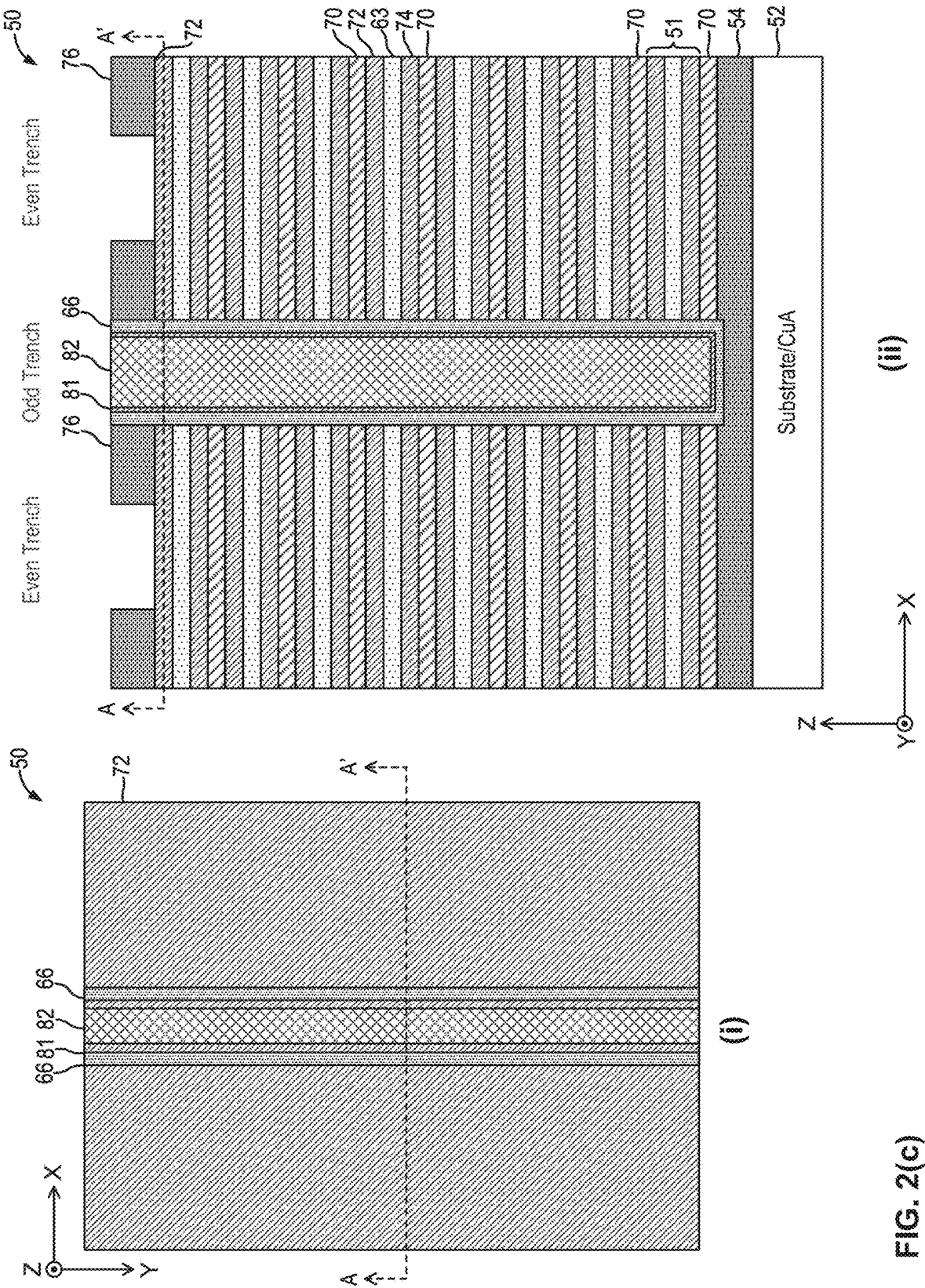
Figure 2D:
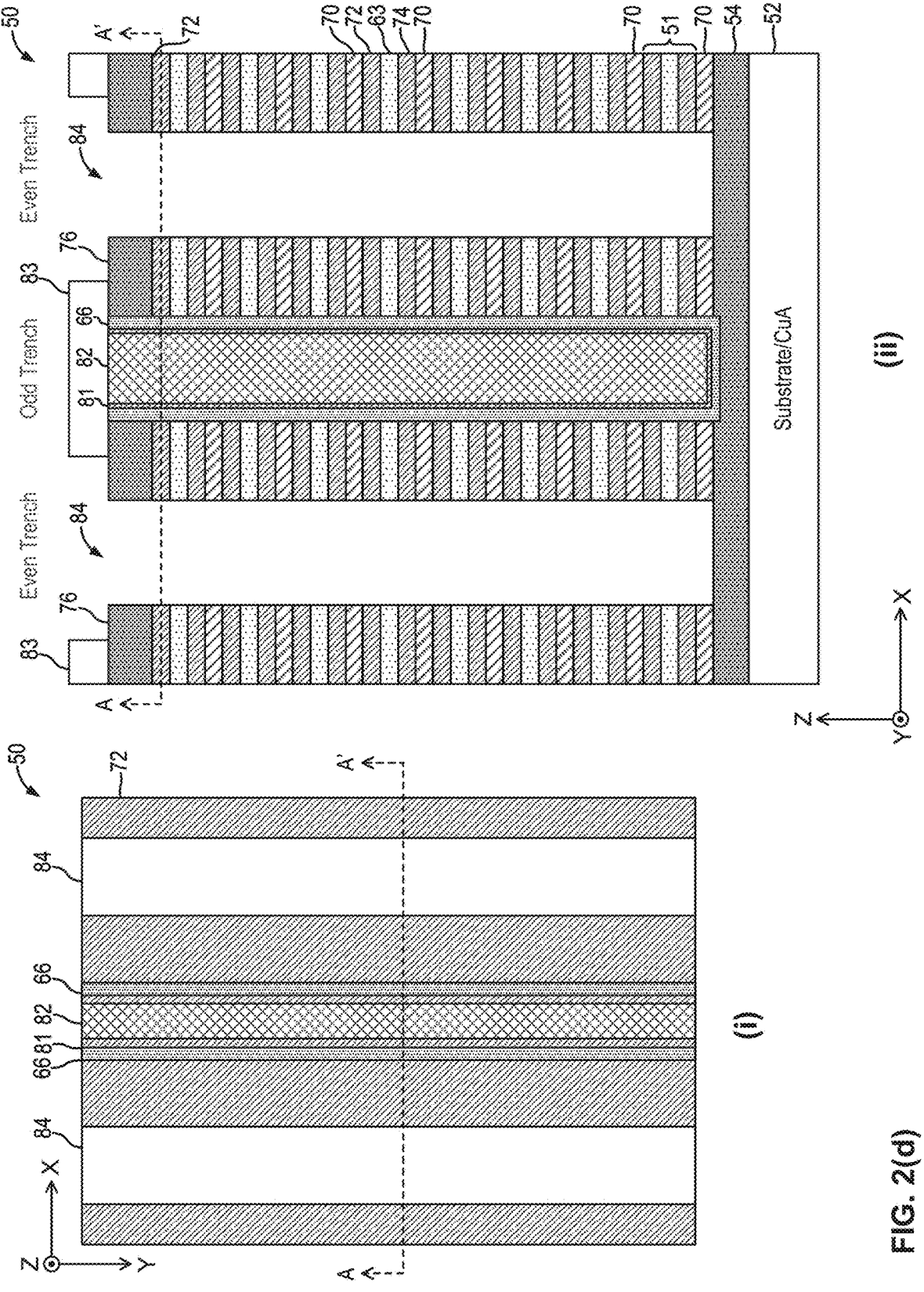
Figure 2E:
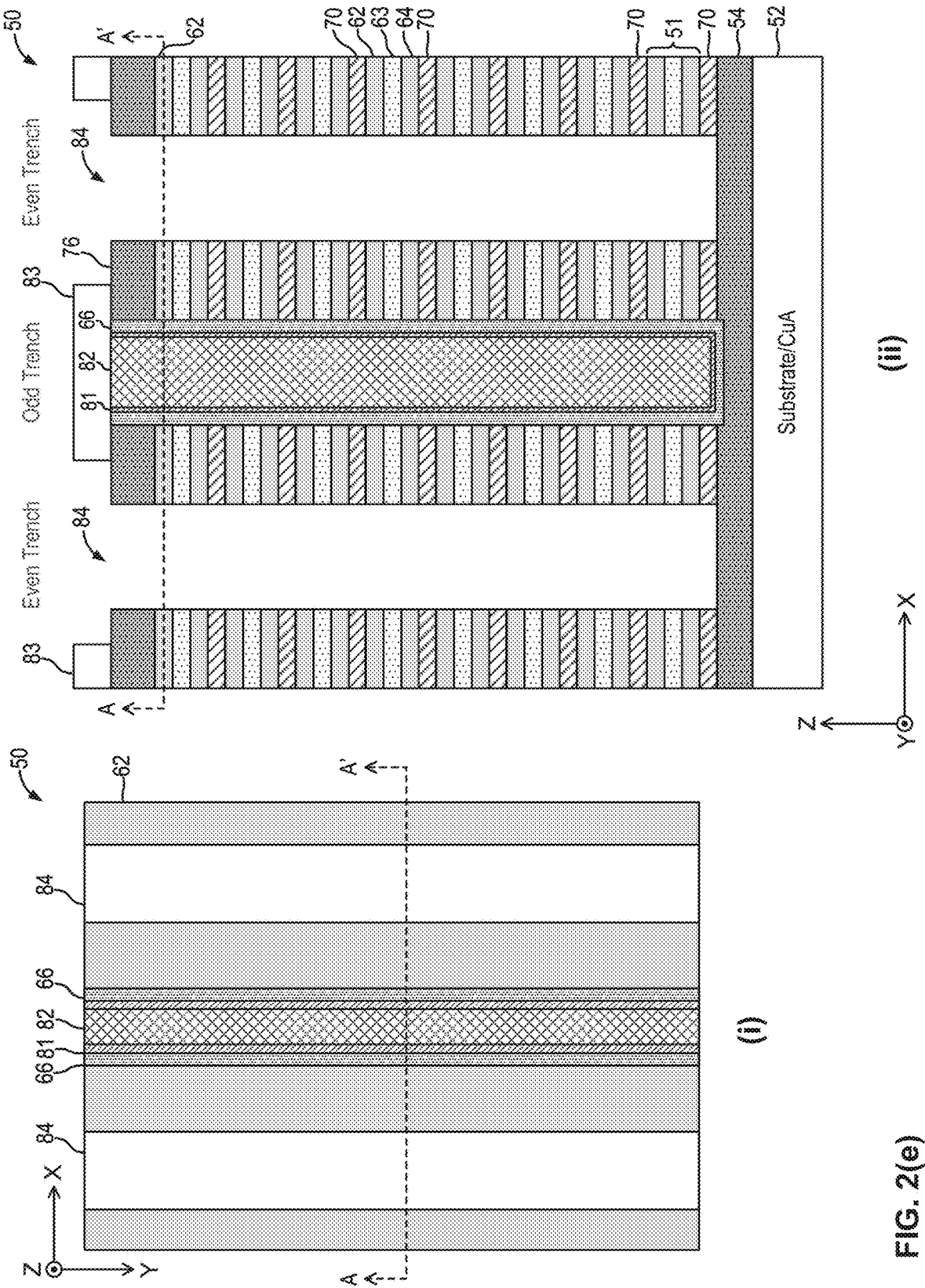
Figure 2F:
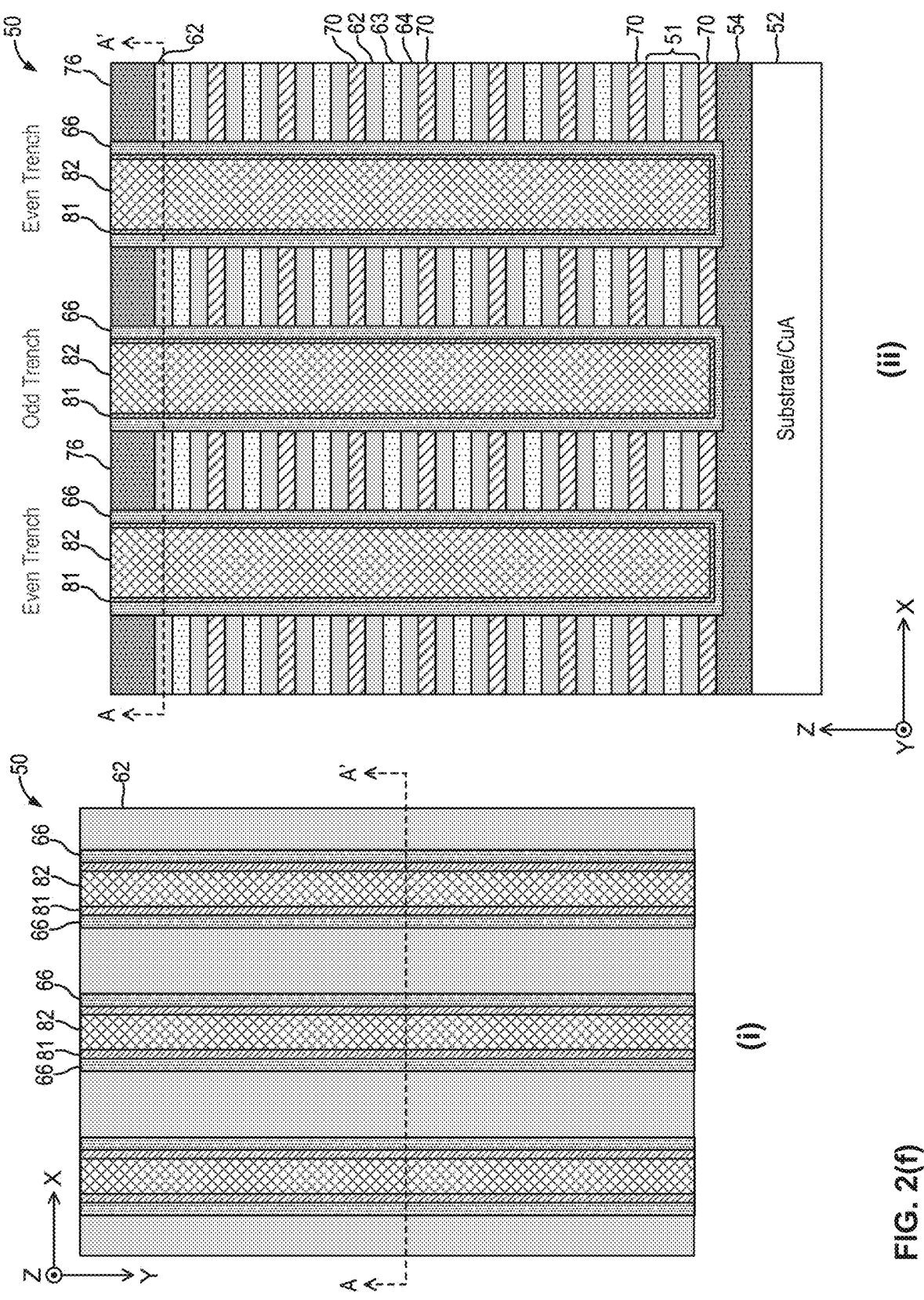
Figure 2G:
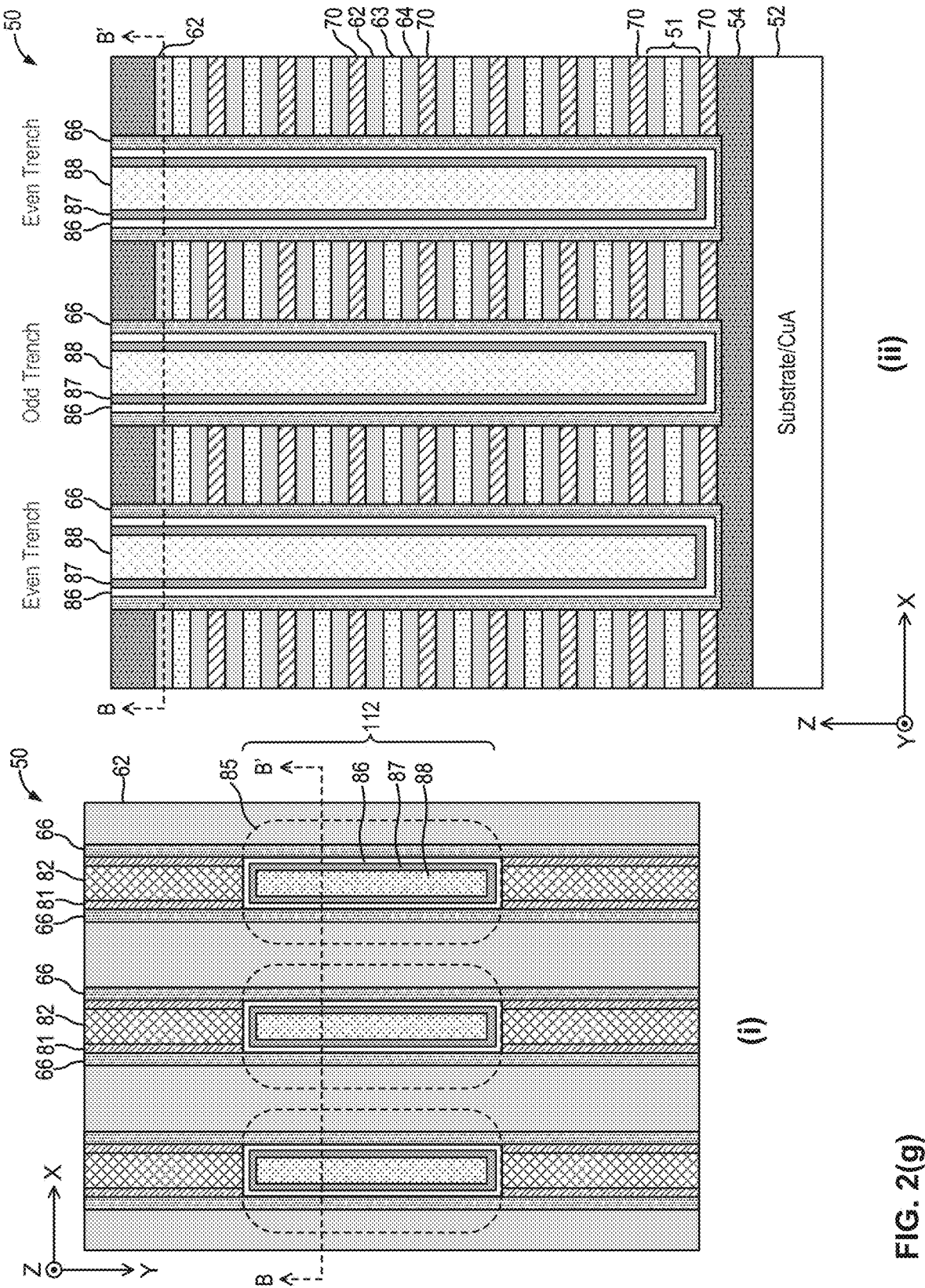
Figure 2H:
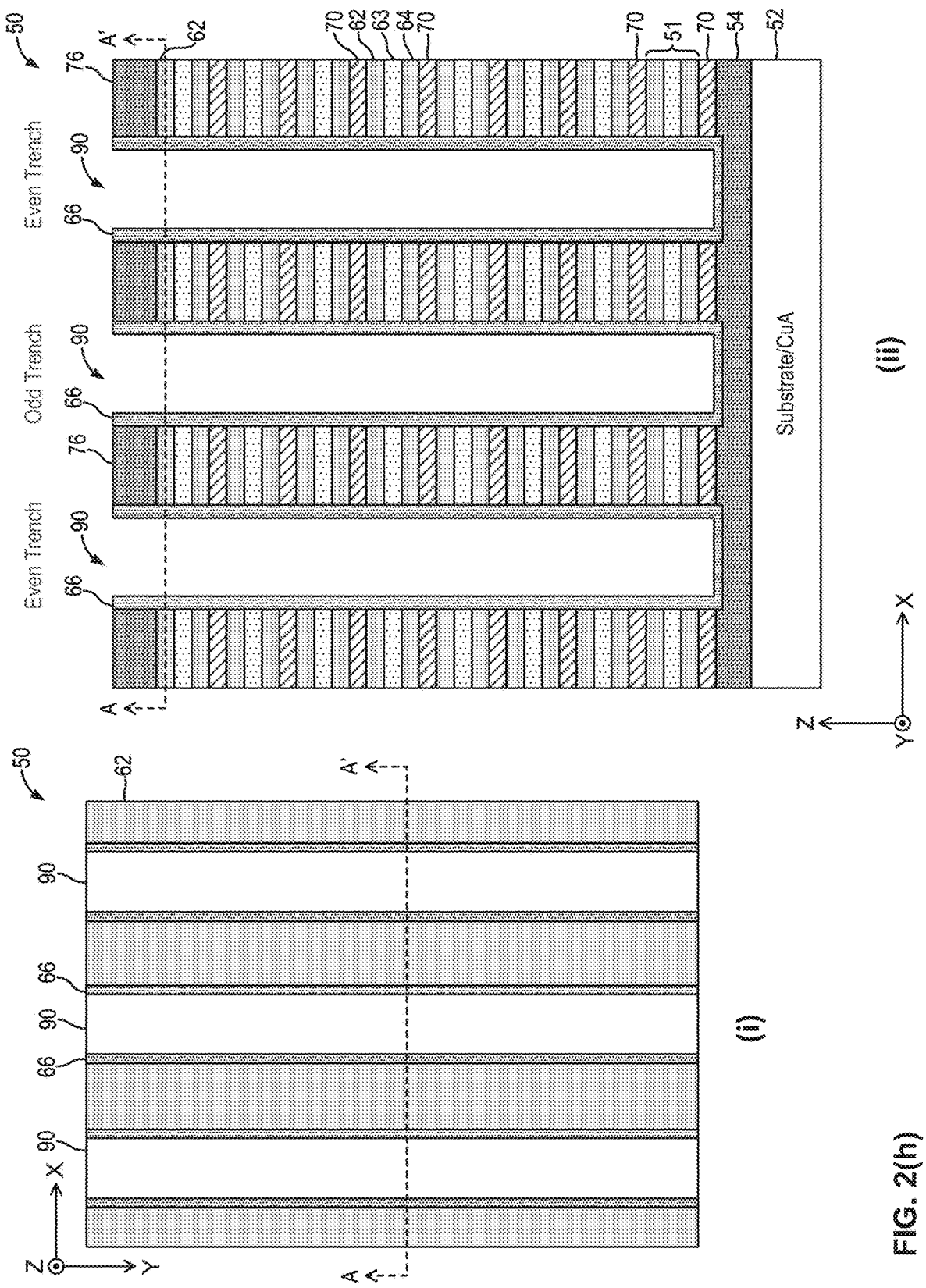
Figure 2I:
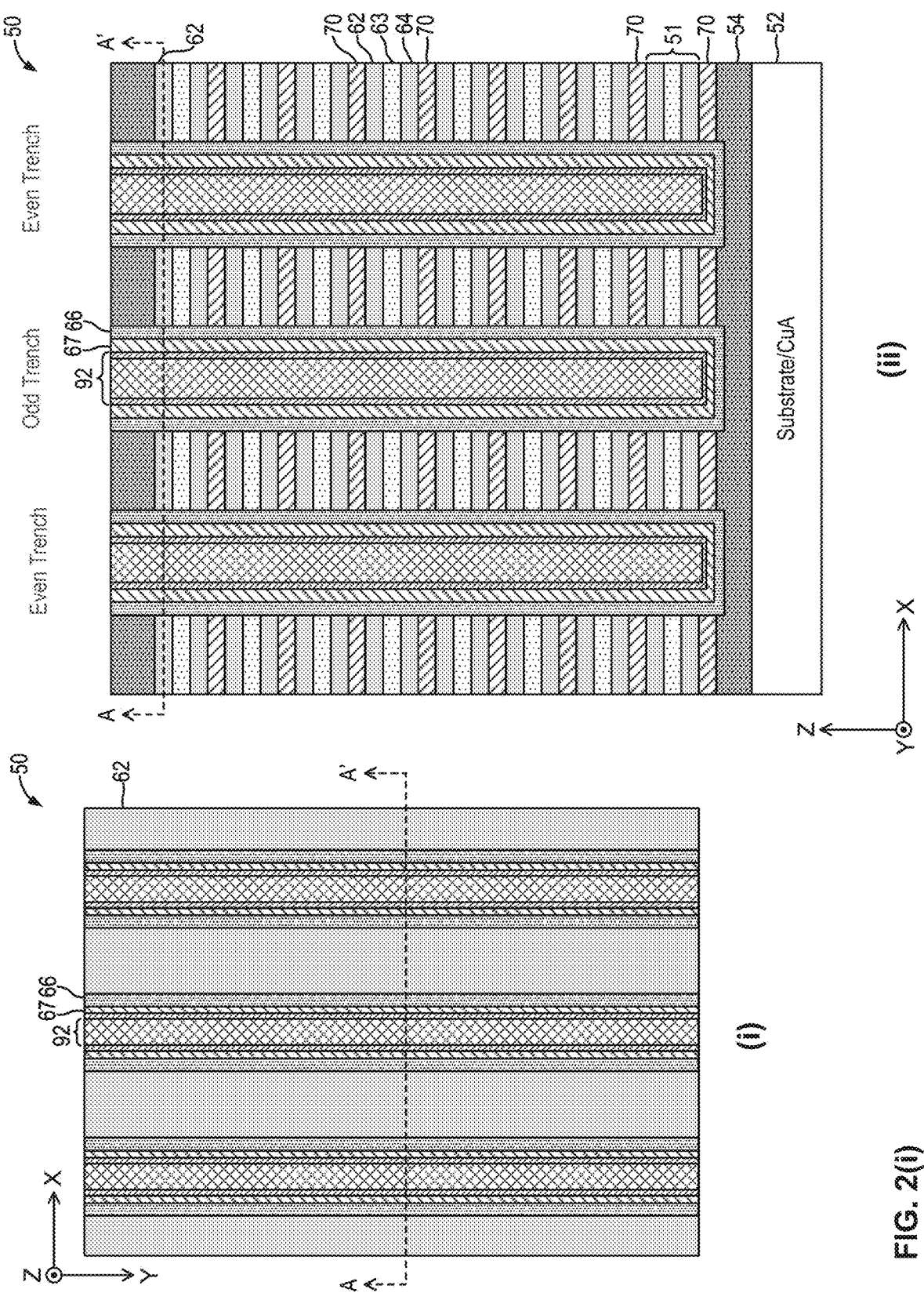
Figure 2J:
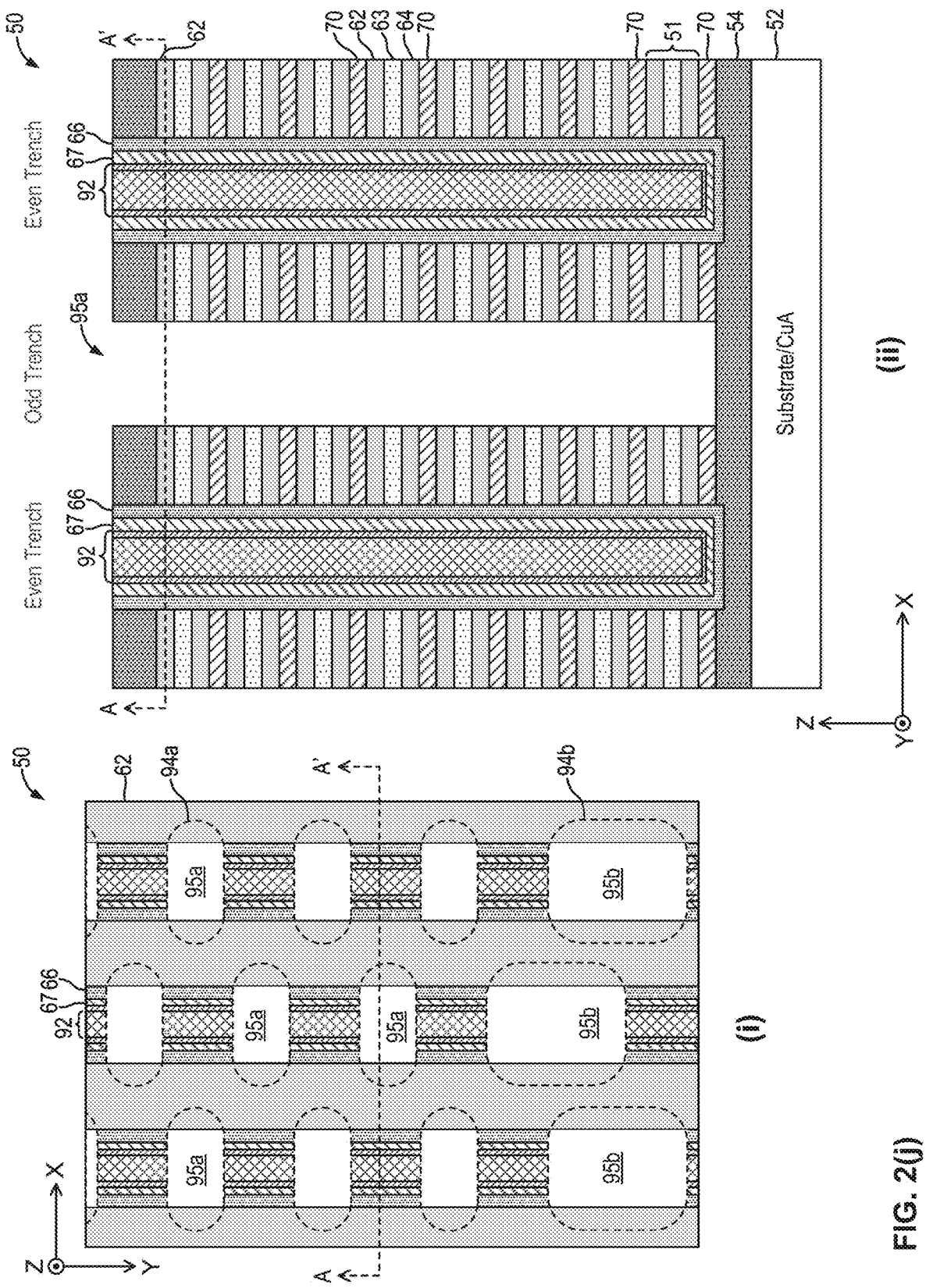
Figure 2K:
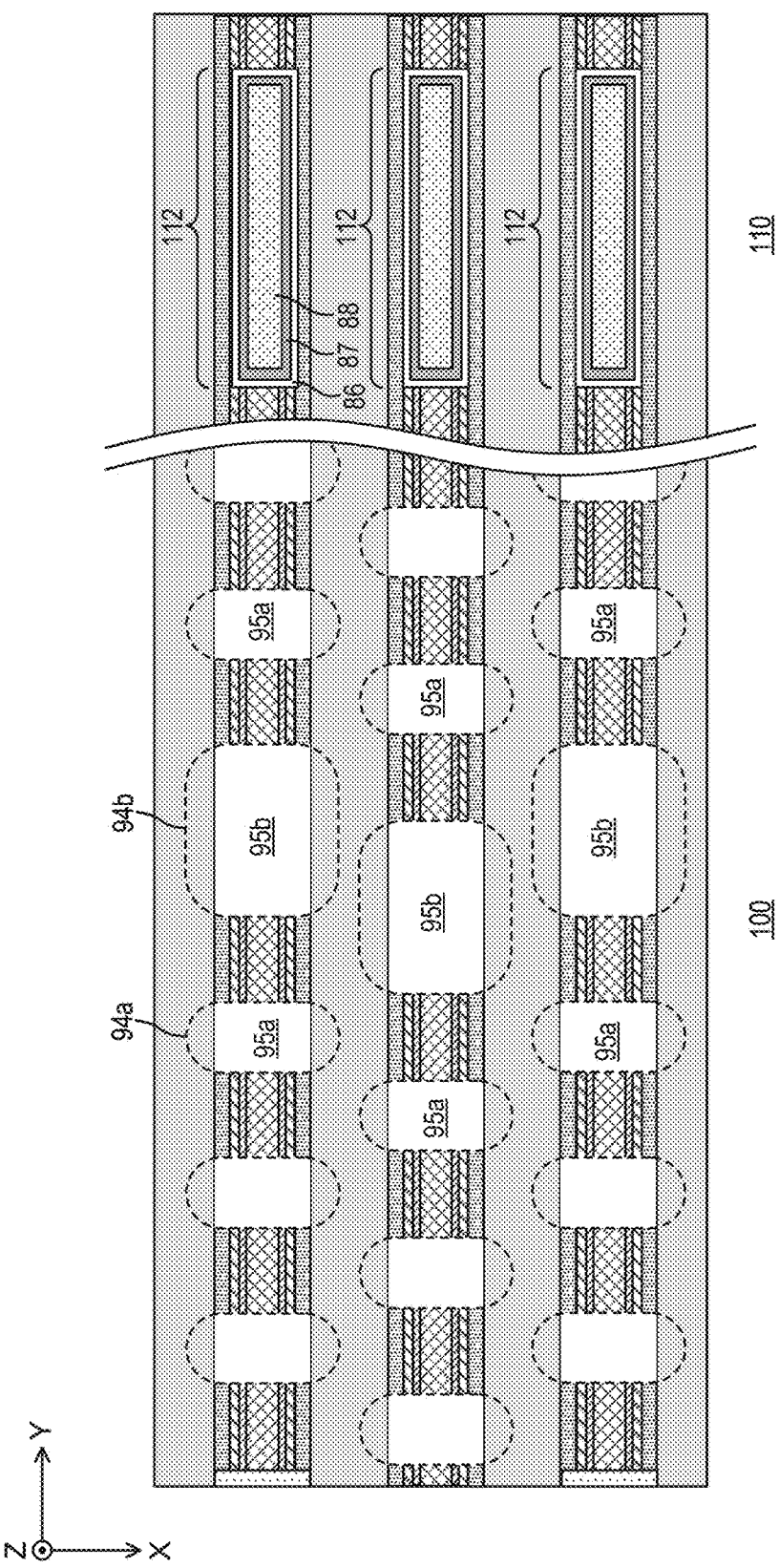
Figure 2I:
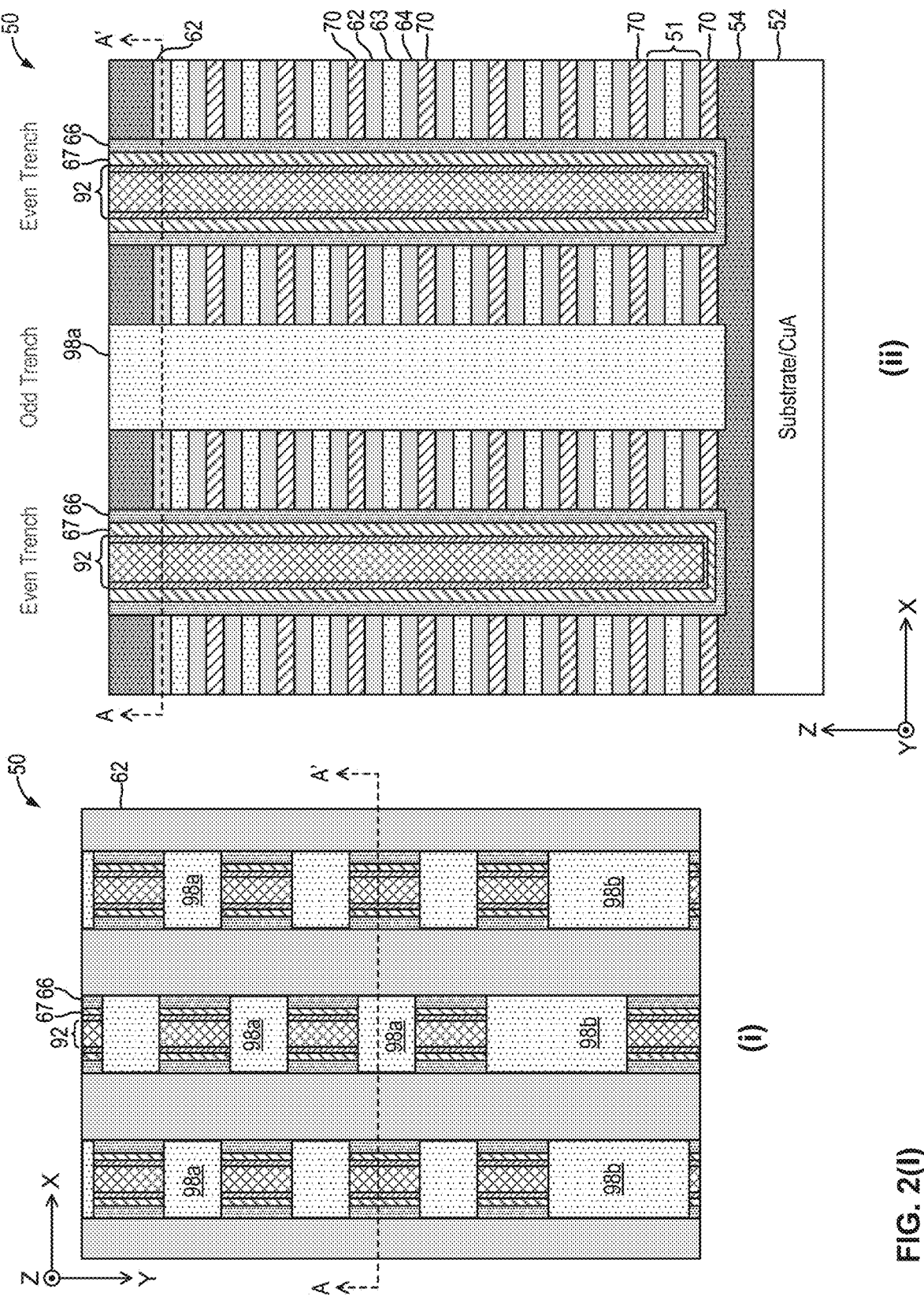
Figure 2:
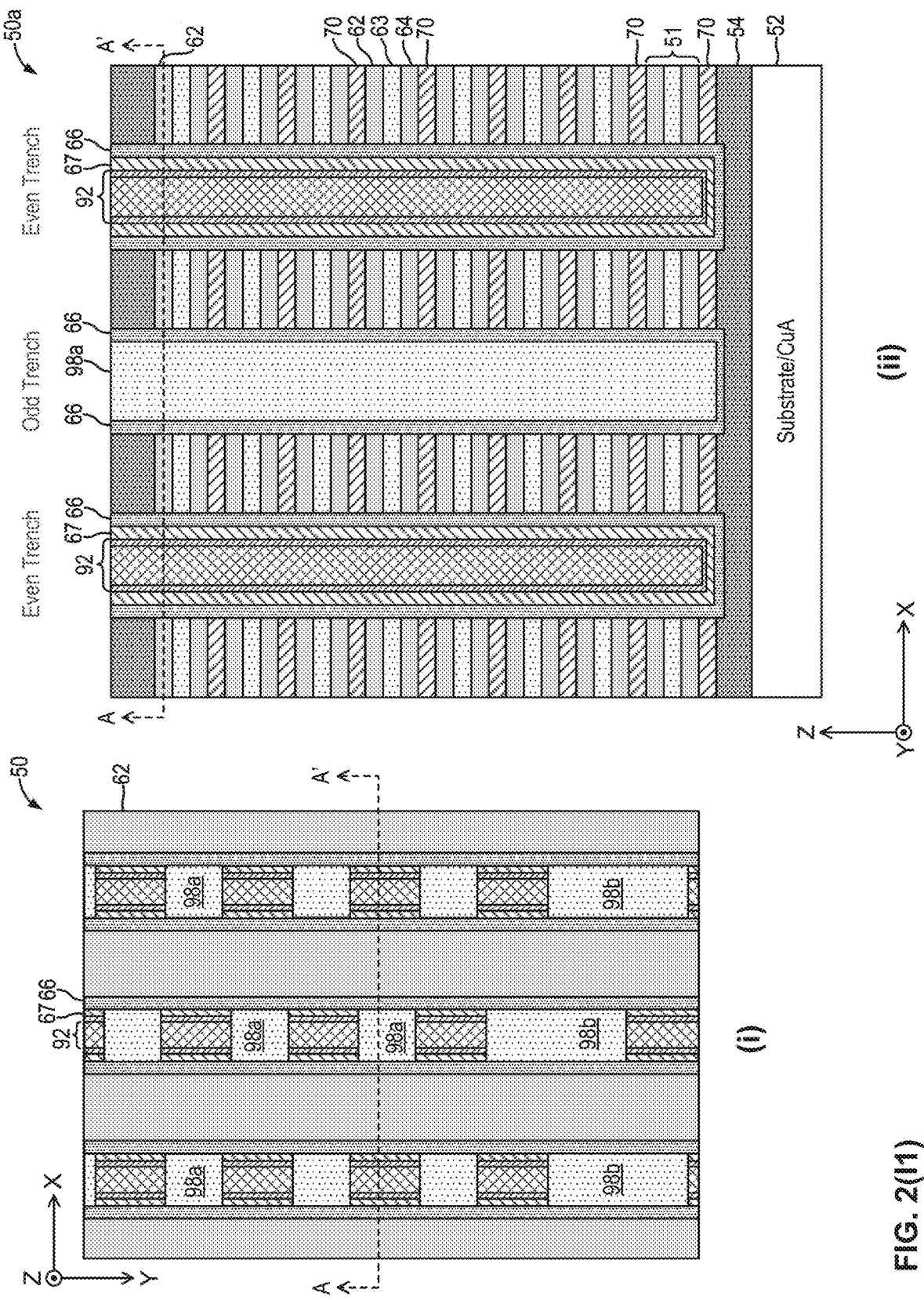
Figure 2M:
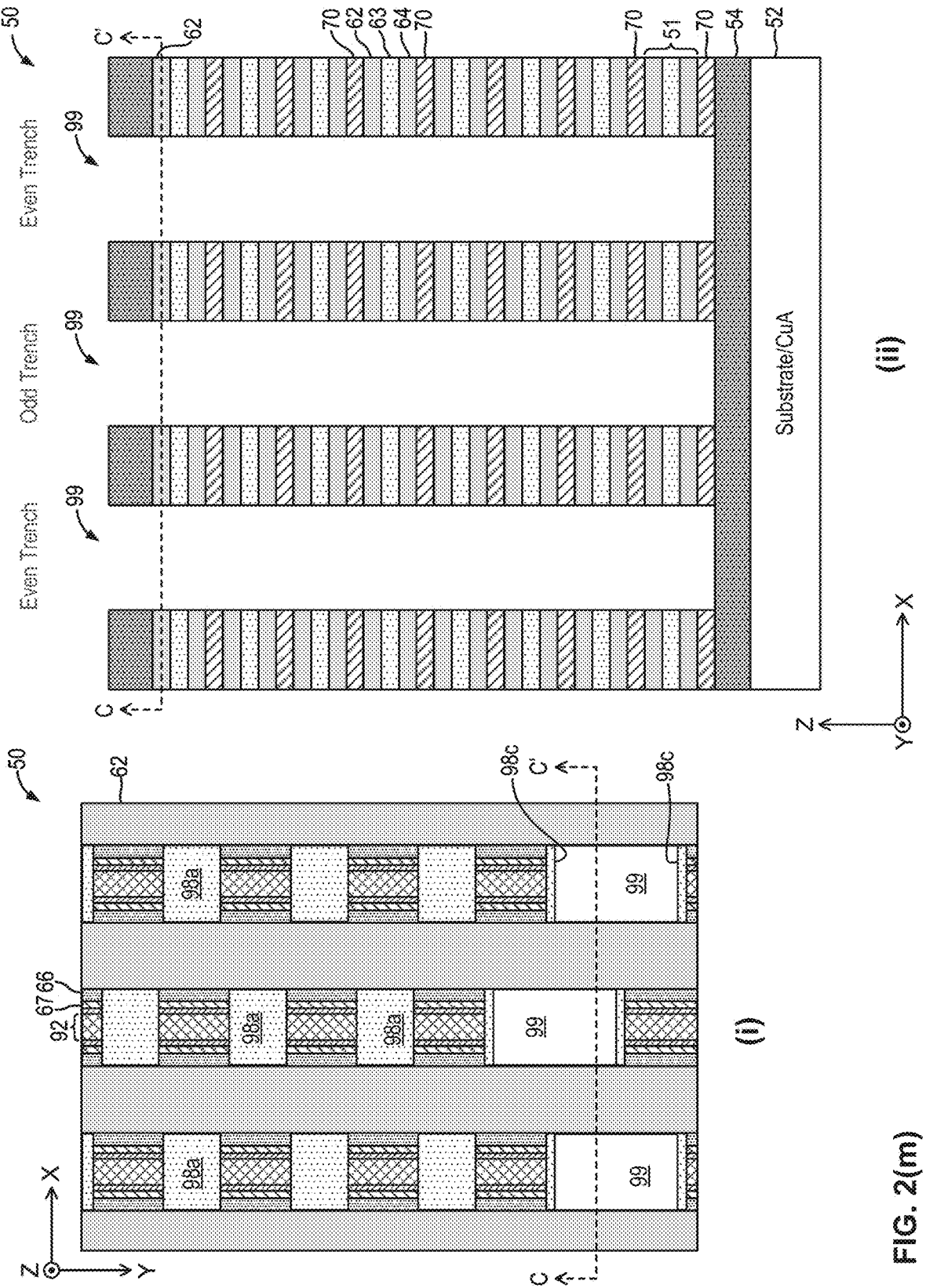
Figure 2N:
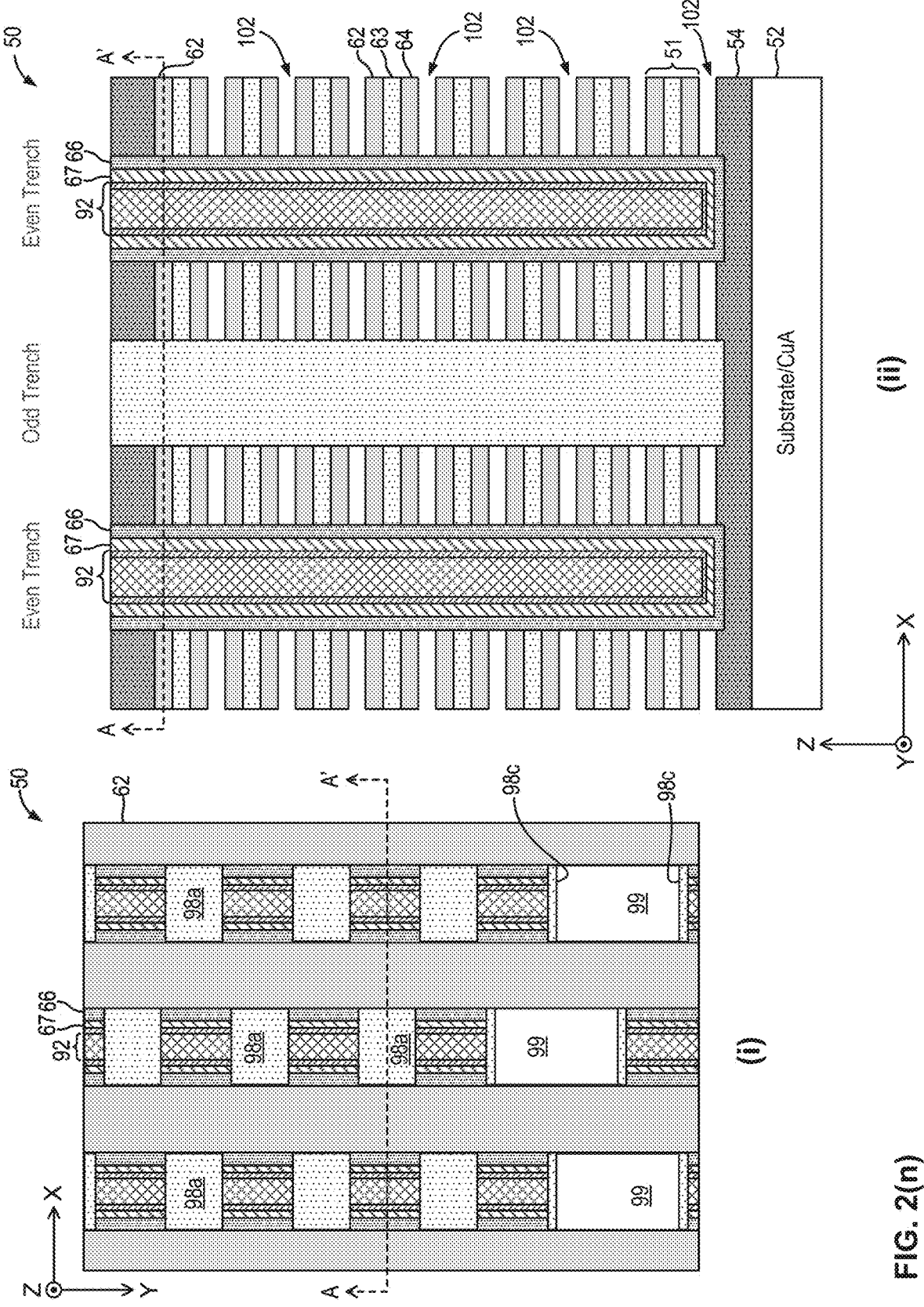
Figure 2O:
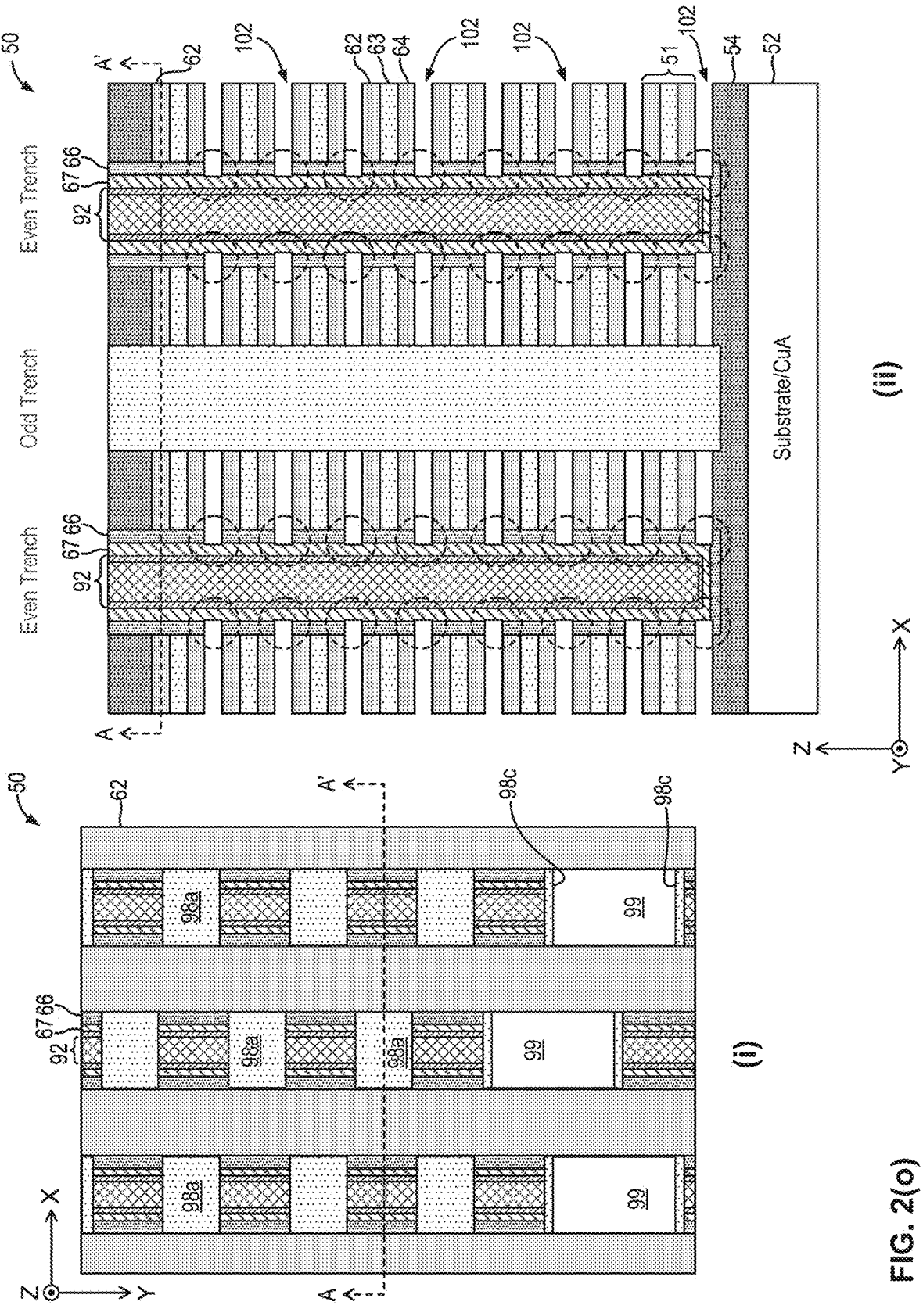
Figure 2:
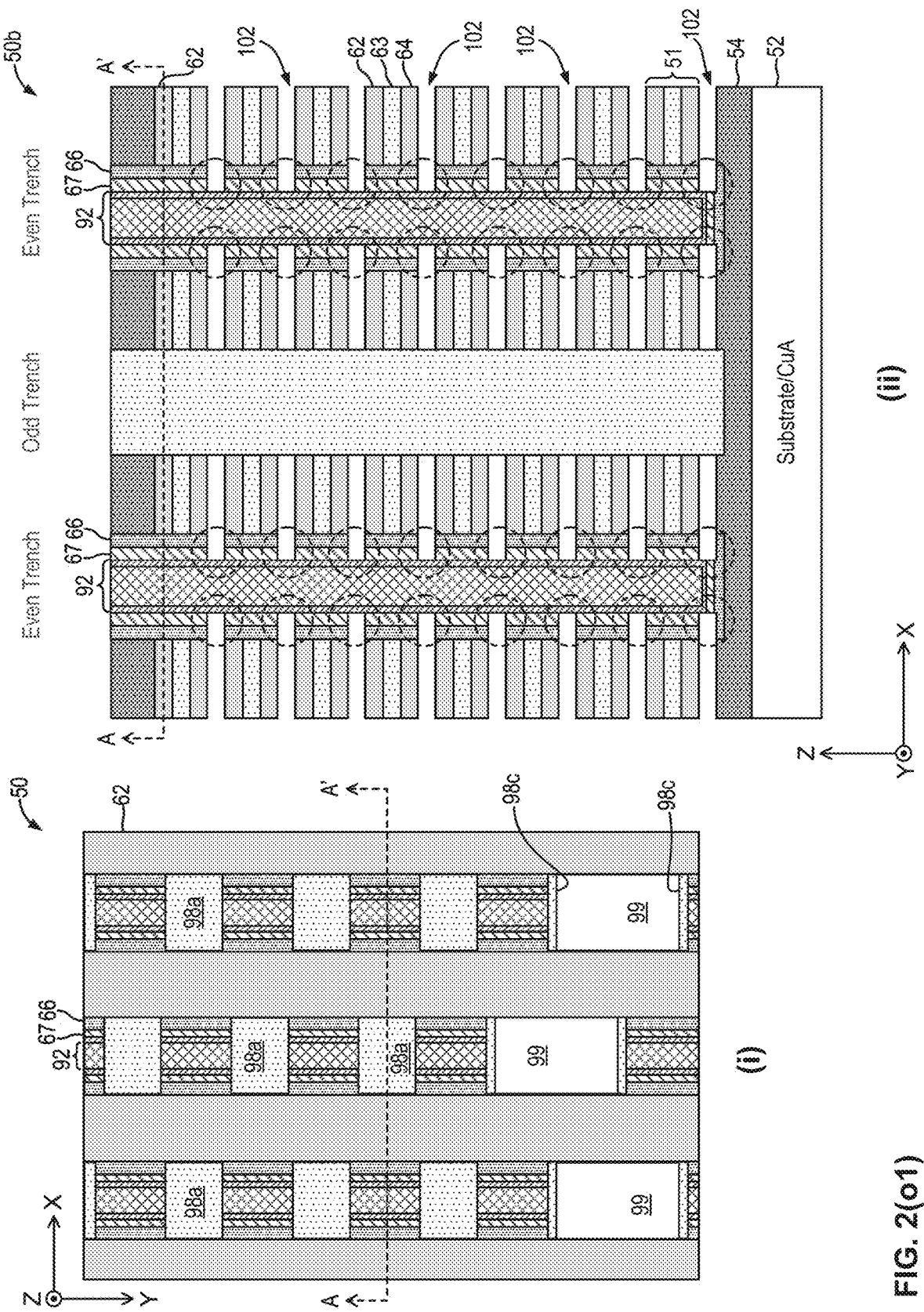
Figure 2P:
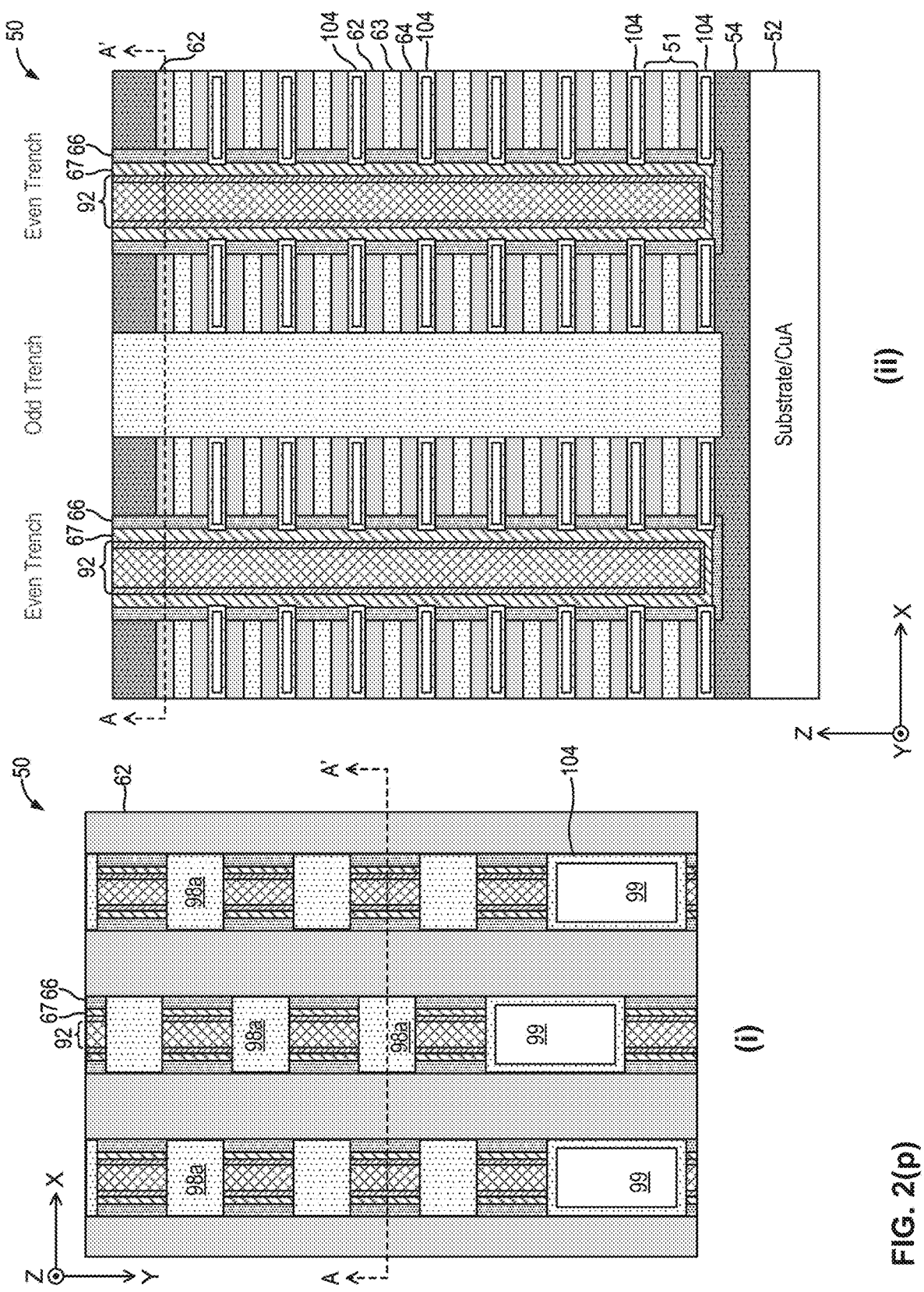
Figure 2Q:
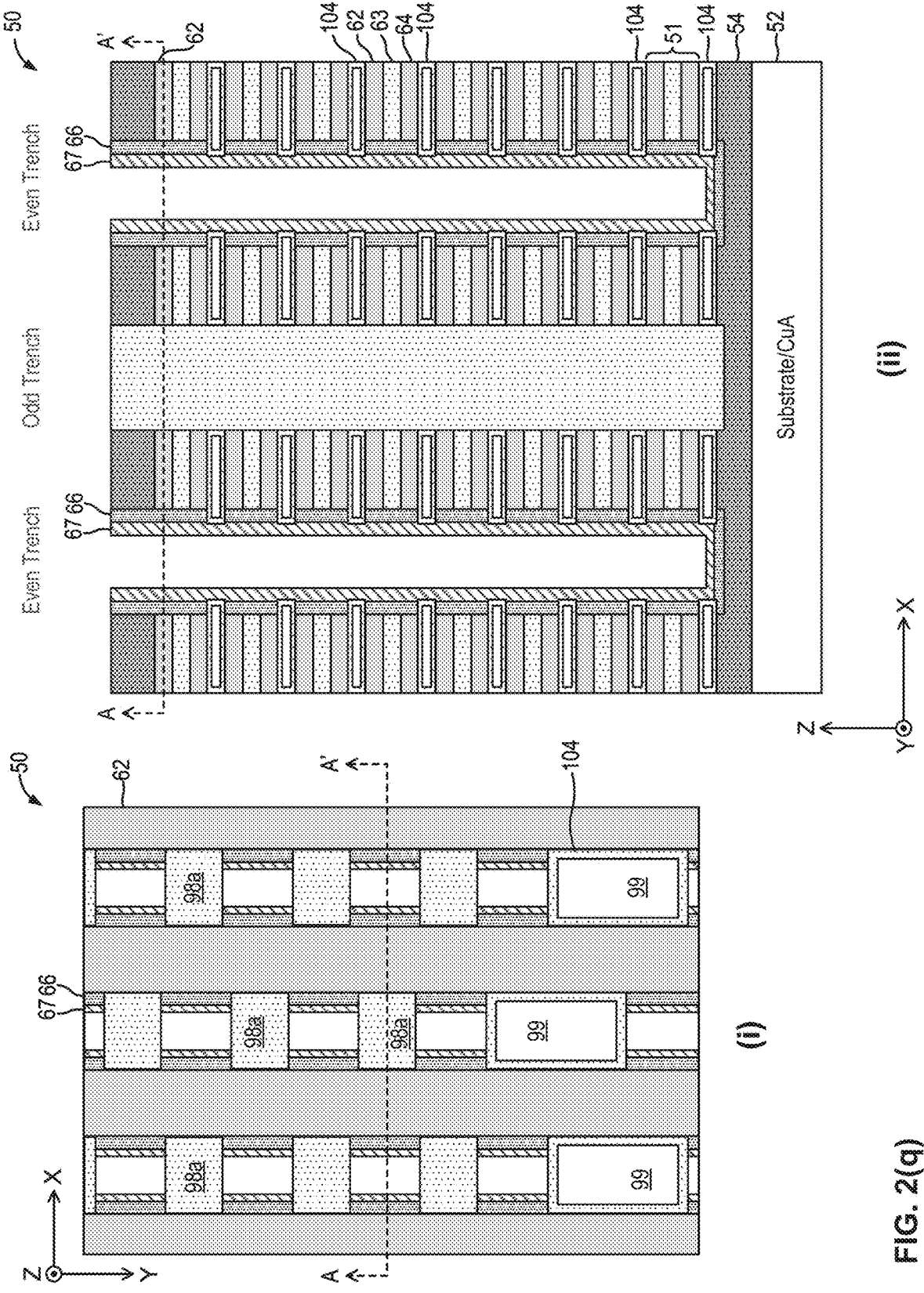
Figure 2R:
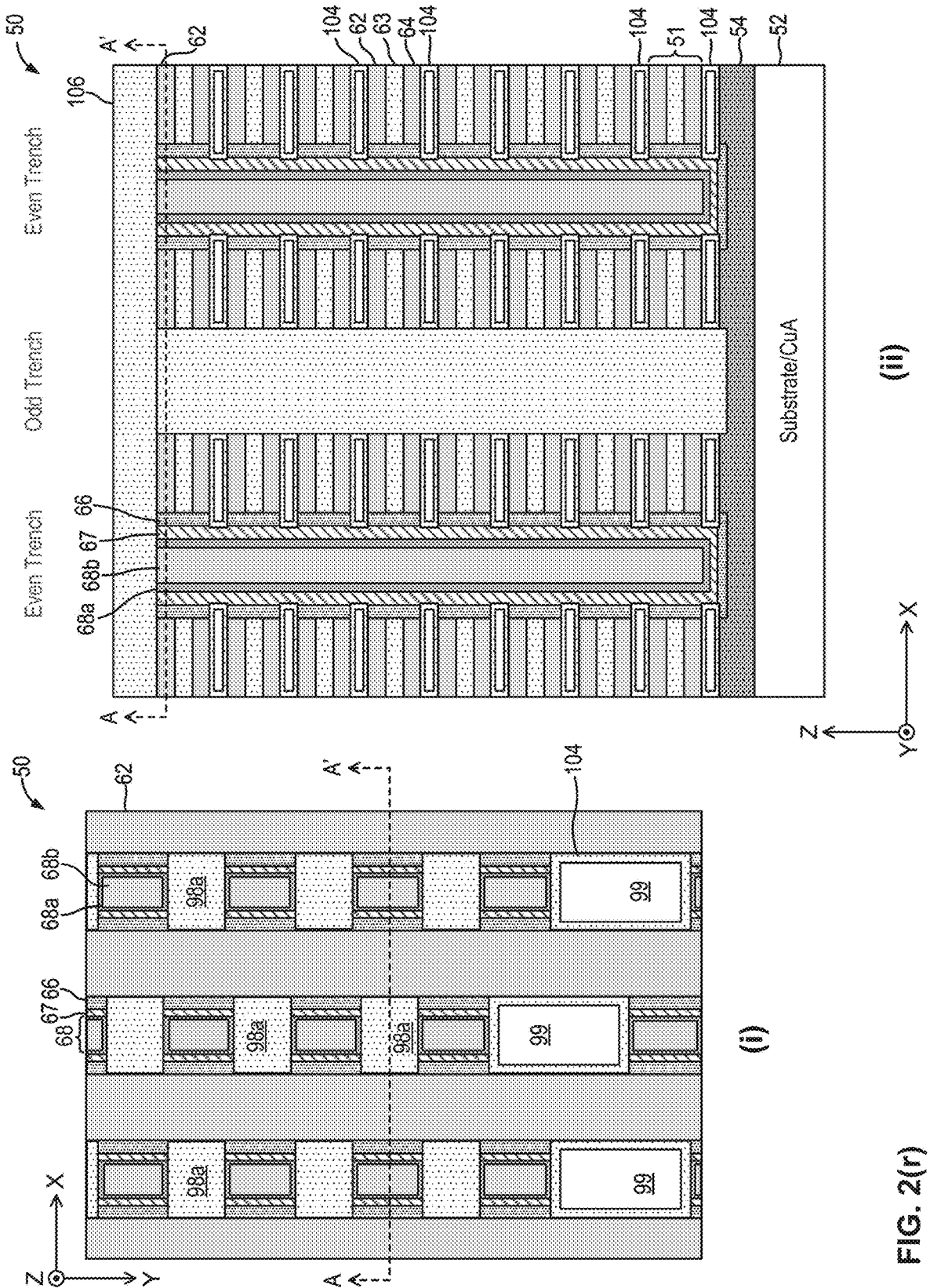
Figure 2S:
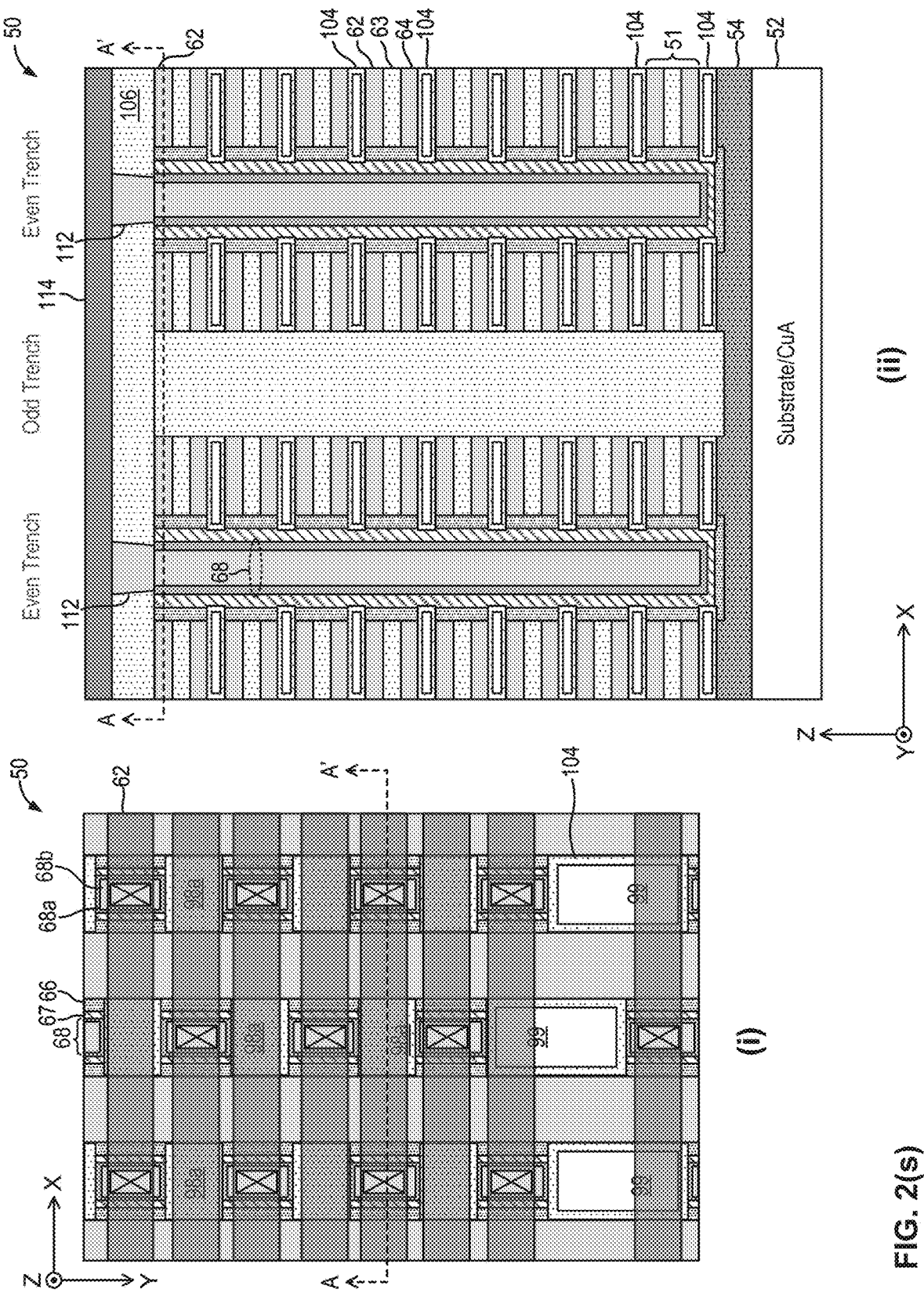

FIGS. 2(a) to 2(s), including FIGS. 2(11) and 2(01), illustrate a process for fabricating a memory structure including HNOR memory strings in embodiments of the present invention. Each figure in FIGS. 2(a) to 2(j), and 2(1)

to 2(s) includes two views: view (i) is a horizontal cross-sectional view (i.e., in an X-Y plane) along A-A', B-B', or C-C' in view (ii), and view (ii) is a vertical cross-sectional view (i.e., in an X-Z plane) along line A-A', B-B', or C-C' in view (i).

Referring to FIG. 2(a), initially, a semiconductor substrate 52 is provided and any circuitry to be formed in the substrate 52, such as the CuA and the interconnect conductors, are fabricated in or on the substrate 52. An insulating layer 54 is provided on top of the semiconductor substrate to cover and protect the circuitry formed on and in the semiconductor substrate 52. In some embodiments, the insulating layer 54 is a dielectric layer which may also serve as an etch stop layer for the subsequent processing steps. In some embodiments, the insulating layer 54 is a silicon oxycarbide (SiOC) layer or an aluminum oxide ($Al_2O_3$) layer. The insulating layer 54 can be formed using any material with suitable selectivity for the subsequent etch processes to be performed.

Subsequently, a memory structure 50 is formed by successive depositions of (i) a multilayer 51 and (ii) an inter-layer sacrificial layer 70 on the planar surface of a semiconductor substrate 52, or in particular, on the insulating layer 54. The multilayer 51 includes three sublayers: (a) a first sacrificial layer 72, (b) a channel spacer dielectric layer 63, and (c) a second sacrificial layer 74, in this order in the Z-direction. FIG. 2(a) shows the memory structure 50 after the depositions of the initial layers of thin films. Multilayer 51 is also referred to in this detailed description as an "active layer." View (i) in FIG. 2(a) illustrates the horizontal cross-section along a line A-A' in the first sacrificial layer 72 in view (ii). View (ii) in FIG. 2(a) illustrates the vertical cross-section of the memory structure 50 along the line A-A' shown in view (i). The first and second sacrificial layers 72 and 74 are to be replaced by respective conductive layers in subsequent processing. The inter-layer sacrificial layer 70 (also referred herein as the third sacrificial layer) is to be replaced by an isolation material in subsequent processing to form an inter-layer isolation layer.

In the present embodiment, the first and second sacrificial layers 72 and 74 are each a silicon nitride layer. The channel spacer dielectric layer 63 is an insulating dielectric material, such as silicon oxide ($SiO_2$). The third sacrificial layer 70 is a sacrificial layer selected from carbon, amorphous silicon (aSi), and silicon germanium (SiGe).

In one embodiment, each sublayer in the multilayer 51 and the inter-layer sacrificial layer 70 has a thickness of typically 30 nm or less. In another embodiment, the sublayers in the multilayer 51 and the inter-layer sacrificial layer 70 do not have the same thickness. In the present description, the dimensions are provided merely for illustrative purposes and are not intended to be limiting. In actual implementation, any suitable thicknesses or dimensions may be used. In some embodiments, the lowermost and uppermost sublayers (70 and 72 respectively in the example of FIG. 2(a)) of memory stack 50 may optionally be designated as dummy sublayers that are not necessarily part of an active layer.

After the memory structure is formed with the desired number of multi-layers with the third sacrificial layers therebetween, a hard mask 76 is formed on the top of the memory structure. In one embodiment, the hard mask 76 is a silicon oxycarbide layer (SiOC). The hard mask is patterned to define trenches in which storage transistors are to be formed, for example, using a photo-lithographical patterning step. In particular, the hard mask defines a set of even trenches and a set of odd trenches. In one example, the trenches have a width of 60 nm and a pitch of 100 nm. After the hard mask 76 is patterned, a second mask 78 is formed over the hard mask 76 which covers exposed areas in the hard mask 76 corresponding to the even trenches. The processing that follows will be performed first in the areas associated with the odd trenches exposed by the second mask 78. Processing in the areas associated the even trenches will be performed in a later stage when the second mask 78 is removed. In some embodiments, the second mask 76 may be planarized to the surface of the hard mask 76, as shown by the dotted line in FIG. 2(a).

Referring to FIG. 2(b), a first set of trenches 80 are formed in memory structure 50 using, for example, a selective anisotropic etch process with the hard mask 76 and the second mask 78 as the masking layer. The first set of trenches 80 is referred to as the odd trenches. In some examples, the trenches 80 may be 60 nm wide, with a spacing of 160 nm apart, that is, the mesa formed between two adjacent trenches is 160 nm. Subsequently, referring to FIG. 2(c), a channel layer 66 is deposited conformally on the sidewall of the trenches 80. In one embodiment, the channel layer 66 is deposited by atomic layer deposition (ALD), chemical vapor deposition (CVD) or a combination thereof. In the present embodiment, the channel layer 66 is a semiconductor oxide layer, such as indium gallium zinc oxide (IGZO), indium zinc oxide (IZO), indium tungsten oxide (IWO), or indium tin oxide (ITO). In other examples, the channel layer 66 can be formed using other oxide semiconductor material compatible with IGZO. Furthermore, in some embodiments, the channel layer 66 may have a thickness of 1.5 nm to 10 nm. A liner layer 81 is deposited to cover the channel layer 66 and the remaining volume in the trenches 80 is filled with a sacrificial material 82. In one embodiment, the liner layer 81 can be a low temperature (under 500° C.) silicon nitride layer and have a thickness of 3 nm. Alternately, the liner layer 81 can be an undoped amorphous silicon layer. In some embodiments, the sacrificial material 82 can be one of silicon germanium, phosphosilicate glass (PSG) or borophosphosilicate glass (BPSG) or silicon oxide. In one embodiment, the sacrificial material 82 is silicon germanium or carbon. To best protect the channel layer 66, the liner layer 81 is preferably deposited in the same deposition tool to avoid exposure of the channel layer to oxidation. After the deposition steps, excess material may be removed from the top of memory structure 50 using, for example, chemical-mechanical polishing (CMP). The second mask 78 is removed with the hard mask 76 remaining. The resulting memory structure 50 is shown in FIG. 2(c).

Referring to FIG. 2(d), a third mask 83 is applied and patterned to cover the odd trenches while exposing openings where the even trenches are defined by the hark mask 76. With the mechanical support from the sacrificial material 82, a second set of trenches 84 are then formed using substantially the same technique as discussed in conjunction with FIG. 2(b) above. For example, the memory structure is selective anisotropically etched with the hard mask 76 and the third mask 83 as the masking layer. The second set of trenches 84 is referred to as the even trenches. In some examples, the trenches 84 may be 60 nm wide. Each of the second set of trenches 84 is cut between an adjacent pair of the first set of trenches 80 and each of the second set of trenches 84 is cut substantially equidistant between an adjacent pair of the first set of trenches 80. As a result of trenches 80 and 84 being cut in the multilayer structure, stacks in the multilayer structure are formed which are referred to as "active stacks" in the present description. In some examples, the active stacks are each approximately 40 nm wide. The resulting narrow strips in each plane resulting from the cutting of the active layers 51 are referred herein as "active strips."

Thereafter, first and second sacrificial layers 72 and 74 are removed using, for example, a selective wet etch, thereby creating cavities between the channel spacer dielectric layer 63 and the inter-layer sacrificial layer 70. The cavities are filled by first and second conductive layers 62 and 64, as shown in FIG. 2(e). The interface between conductive layers 62, 64 and the channel layer 66 should be cleaned of any surface oxidation while protecting the channel layer from damage. In some embodiments, the first and second conductive layers 62, 64 are formed using a low resistivity metallic conductive material. In some embodiments, the first and second conductive layers are metal layers, such as a titanium nitride (TiN)-lined tungsten (W) layer, a tungsten nitride (WN)-lined tungsten (W) layer, a molybdenum nitride (MoN) lined molybdenum (Mo) layer, or a liner-less tungsten or molybdenum or cobalt layer, or other metal layers. In one example, the first and second conductive layers 62 and 64 are each formed by successively depositing a titanium nitride (TiN) liner and a tungsten (W) layer. The TiN liner may be formed using, for example, an atomic layer deposition (ALD) technique and the tungsten layer may be formed using, for example, CVD or PECVD techniques. An etching step removes the deposited material from the sidewalls of trenches 84. In some examples, an isotropic wet etch is used to remove the deposited material from the sidewalls of trenches 84. The resulting memory structure 50 is shown in FIG. 2(e). The third mask 83 is then removed.

Subsequently, referring to FIG. 2(f), a channel layer 66 is deposited conformally on the sidewall of trenches 84, in the same manner as described above with reference to FIG. 2(c). For example, the channel layer 66 is a semiconductor oxide layer, such as indium gallium zinc oxide (IGZO) or other suitable metal semiconductor oxide materials, deposited conformally by atomic layer deposition (ALD), chemical vapor deposition (CVD) or a combination thereof. In the same manner as the odd trenches 80, a dielectric liner layer 81, such as a silicon nitride liner layer, is deposited to cover the channel layer 66 and the remaining volume in the trenches 84 is filled with a sacrificial material 82, such as silicon germanium. After the deposition steps, excess material may be removed from the top of memory structure 50 using, for example, chemical-mechanical polishing (CMP). The resulting memory structure 50 is shown in FIG. 2(f). In some embodiments, annealing is performed after the channel layer is formed in both the even and the odd trenches so that a single annealing step can be used to anneal the channel layer. As thus formed, the first and second conductive layers 62 and 64, in contact with the channel layer 66 in the even and odd trenches, provide the common drain line and the common source line of an HNOR memory string to be formed.

In embodiments of the present disclosure, the memory structure 50 may include non-memory transistors to support operation of the storage transistors. For example, the ferroelectric storage transistors are formed with ferroelectric polarization layers to form non-volatile or quasi-volatile memory transistors. However, to facilitate the operation of the storage transistors, precharge transistors are provided along each memory string and the precharge transistors may be formed as non-memory transistors. For example, the precharge transistors may be MOSFET devices formed with a gate dielectric layer and not a ferroelectric polarization layer. In some embodiments, the process for fabricating the memory structure 50 of HNOR memory strings further includes fabrication process steps for forming precharge transistors in the HNOR memory strings. In particular, to facilitate the operation of the storage transistors, precharge transistors are provided at given locations along each HNOR memory string where the precharge transistors are used to bias the common source line or the common bit line of a HNOR memory string to a desired voltage. In one example, 3-5 precharge transistors may be provided in a NOR memory strings of 2000 storage transistors.

More specifically, the memory structure 50 of the present invention forms three-dimensional array of NOR memory strings of ferroelectric storage transistors. The ferroelectric storage transistors in each NOR memory string share the common source line and the common drain line (common bit line). The voltage on each shared common source line can be separately applied directly from one or both ends of each source line in the three-dimensional structure. In some embodiments, the shared common source line is electrically floating and the source voltage is applied from the common bit line using precharge transistors so as to obviate the need to provide connector wires to the source lines at the staircase portions of the three-dimensional structure. In one embodiment, the source voltage on a given source line is set to a desired voltage value (such as the ground voltage) through a precharge operation using one or more precharge transistors formed along the memory string and the source line is then left floating after the precharge operation. In particular, the precharge operation set the common bit line to a desired voltage and then the precharge transistor is momentarily turned on to short the common bit line to the common source line to transfer the bit line voltage to the source line. As a result, the common source line is charged from the voltage on the common bit line to a voltage to equal to the bit line voltage. After the precharge operation is complete, the precharge transistor(s) is turned off. The common source line maintains a relatively constant voltage through the parasitic capacitance at the source terminals, such as the parasitic capacitance between the source terminals and the numerous local word line gate terminals of the storage transistors in the NOR memory string.

FIG. 2(g) illustrates the memory structure 50 after the processing steps described above for forming the storage transistors in multiple layers of HNOR memory strings. The HNOR memory strings are formed extending in the Y-direction. At given locations along the memory strings, precharge transistors 112 are provided. The precharge transistors have extended dimensions in the Y-direction to form precharge transistors with a larger channel width to provide sufficient current drive. That is, the precharge transistors have channel width much larger than the channel width of the storage transistors. In some example, the channel width of the storage transistors may be 55 nm while the channel width of the precharge transistors may be 220 nm (in the Y-direction). In some embodiments, in a memory string of 2000 or more storage transistors, 4-5 precharge transistors may be provisioned along each memory string.

To form the precharge transistors in the memory structure, a mask is applied to the memory structure 50 to cover all of the memory string with mask openings 85 exposing locations where the precharge transistors are to be formed, as shown in FIG. 2(g). In some embodiments, the mask may be a silicon mask. Using the mask defined openings 85, the sacrificial material 82 is removed and the liner layer 81 is also removed, such as by one or more selective wet etch steps. The channel layer 66 remains on the sidewall of the active stacks and will be used to form the channel regions of the precharge transistors. Cavities are formed in the trenches between the active stacks. A gate dielectric layer 86 is then deposited on the sidewalls of the cavities. In one embodiment, the gate dielectric layer 86 is a silicon oxide layer or a hafnium oxide layer. In some examples, the gate dielectric layer 86 is a high temperature oxide (HTO). In another example, the gate dielectric layer 86 may include a high-K dielectric layer, such as 3-5 nm of silicon nitride, to fortify the gate dielectric layer. Then, the remaining areas of the cavities, lined with the gate dielectric layer 86, are filled by a conductive layer forming the gate conductor of the precharge transistors. The gate conductor may include successively deposited titanium nitride (TiN) layer 87 and a heavily doped polysilicon or tungsten (W) layer 88. Excess deposited materials may be removed from the top of memory structure 50 by CMP. FIG. 2(g) illustrates the resulting precharge transistors 112 thus formed. View (i) in FIG. 2(g) illustrates the horizontal cross-section along a line B-B' in the first conductive layer 62 in view (ii). View (ii) in FIG. 2(g) illustrates the vertical cross-section of the precharge transistors along the line B-B' shown in view (i). In the present embodiment, the precharge transistor 112 is a junctionless metal-oxide-semiconductor (MOS) transistor device.

The fabrication process of memory structure 50 may then return to forming the storage transistors. It is understood that the areas where the precharge transistors are formed are masked or covered, or otherwise protected from the following processing steps. Referring to FIG. 2(h), the sacrificial material 82 and the silicon nitride liner layer 81 are removed, exposing both even and odd trenches 90. The channel layer 66 remains on the sidewalls of the trenches 90. The fabrication process then proceeds to form the gate dielectric layer of the storage transistors. Referring to FIG. 2(i), a gate dielectric layer 67 is deposited onto the sidewalls of the trenches 90. Remaining volume in trenches 90 is filled with a silicon nitride liner layer and a sacrificial material (such as silicon germanium). The liner layer and the sacrificial material is collectively referred to as a sacrificial material 92. The resulting memory structure 50 is shown in FIG. 2(i).

In the present embodiment, the memory structure 50 is used to form ferroelectric storage transistors and the gate dielectric layer 67 is a ferroelectric gate dielectric layer or ferroelectric polarization layer. The ferroelectric polarization layer can be deposited using an atomic layer deposition (ALD) technique and may have a thickness between 2 nm to 8 nm. A thermal anneal is performed to form the ferroelectric phase in the deposited ferroelectric material. In some cases, the thermal anneal is performed after deposition of a conductive layer on the ferroelectric gate dielectric layer 67. In one embodiment, the ferroelectric gate dielectric layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric gate dielectric layer is a material selected from: zirconium-doped hafnium oxide (HZO), silicon-doped hafnium oxide (HSO), aluminum zirconium-doped hafnium oxide (HfZrAlO), aluminum-doped hafnium oxide (HfO$_2$:Al), lanthanum-doped hafnium oxide (HfO$_2$:La), hafnium zirconium oxynitride (HfZrON), hafnium zirconium aluminum oxide (HfZrAlO), and any hafnium oxide that includes zirconium impurities.

In some embodiments, an interfacial layer may be provided between the channel layer 66 and the gate dielectric layer 67. In some embodiments, the interfacial layer is formed using a material with a high dielectric constant (K)

(also referred to as "high-K" material), such as a dielectric material with a dielectric constant greater than the dielectric constant of silicon dioxide. In some embodiments, the interfacial layer may be a silicon nitride ($Si_3N_4$) layer, or a silicon oxynitride layer, or an aluminum oxide ($Al_2O_3$) layer. Other materials for the interfacial layer 65 may be indium tungsten oxide. In some embodiments, the interfacial layer may be deposited using an atomic layer deposition (ALD) technique and furthermore, in some embodiments, the interfacial layer may be deposited in the same process chamber as the ferroelectric polarization layer, without breaking vacuum between the deposition of the two layers. The interfacial layer may have a thickness of 0.5 nm-2 nm. In one embodiment, the interfacial layer is an aluminum oxide ($Al_2O_3$) layer and is annealed to yield an amorphous film with the desired characteristics. In some embodiments, the aluminum oxide ($Al_2O_3$) layer can be annealed in oxygen ($O_2$), ozone ($O_3$), nitrous oxide ($N_2O$), forming gas ($H_2N_2$), or argon (Ar).

In the above-described embodiments, the channel layer 66 is formed after each set of odd and even trenches are made (FIGS. 2(c) and 2(f)) and then protected by sacrificial materials and subsequently processing removes the sacrificial materials to form the gate dielectric layer 67 on the channel layer 66 (FIG. 2(i)). In some embodiments, the gate dielectric layer can be formed at the same time as the channel layer 66, thereby to avoid oxidation of the channel layer 66 if exposed to oxygen or during elevated temperature anneals. In some cases, the two layers can be formed in the same process chamber without breaking vacuum which makes it more efficient to form the two layers at the same time. Accordingly, in alternate embodiments, in each of the steps above when the channel layer 66 is formed, the gate dielectric layer 67 is formed immediately thereafter and both layers are then protected by the liner layer 81 and the trenches are filled with the sacrificial material 82.

Thereafter, the memory structure 50 is patterned to form the local word line structures. Referring to FIG. 2(j), a mask is applied to the memory structure 50 with openings 94 exposing areas for isolating the storage transistors along a memory string. In embodiments of the present invention, the openings 94 includes a first set of openings 94a defining isolation area between storage transistors. In some embodiments, the openings 94a may be 45 nm wide in the Y-direction and the openings 94a may be spaced apart by 55 nm. The openings 94 further includes a second set of openings 94b having extended width in the Y-direction. The openings 94b are to be used to perform channel separation in later stage of the fabrication process, as will be described in more details below. In one embodiment, the openings 94b may be 100 nm to 120 nm wide in the Y-direction. In some embodiments, one opening 94b is provided for every N number of openings 94a. For example, one opening 94b is provided for every 16 openings 94a.

With the openings 94 thus defined, the sacrificial material 92, the gate dielectric layer 67 and the channel layer 66 are removed from the areas defined by the exposed openings, as shown in FIG. 2(j). Shafts 95a are formed from mask openings 94a and shafts 95b are formed from mask openings 94b. In one embodiment, a selective anisotropic etch may be used to form shafts 95a and 95b. In some embodiments, the mask openings 94 overlap the active stacks and the etch process is self-aligned to the edges of the active stacks. FIG. 2(k) is another view of the memory structure 50 illustrating the openings 94a and 94b and the precharge transistors 112 and the shafts 95a and 95b formed therefrom. Referring to FIG. 2(k), storage transistors are formed along each active strip in the Y-direction, in the spaces between adjacent shafts 95a. Extended shafts 95b are formed at selected locations to form access openings for selectively etching the channel layer for channel separation, as will be described in more details below. In some embodiments, one extended shaft 95b is provided is provided for every N number of regular shafts 95a. In one example, the extended shafts 95b are provided once for every 16 regular shafts 95a along the memory string. In another example, the extended shafts 95b may be provided once every 1.6 µm along the memory string. As described above, along the memory string, several (e.g. 3-5) precharge transistors 112 (non-memory transistors) are provided to support memory operations in providing biasing of the common source line or common bit line.

In some embodiments, the etching of the channel layer 66 should be performed to limit any unintended sideway etch into the active stacks of active layers 51 at the face of the vertical sidewalls of the trenches that have become exposed to the etchant when the channel layer 66 has been etched away. In some cases, care can be taken to minimize excessive undercutting by sideway etching of the channel layer 66 or the ferroelectric dielectric layer 67.

Referring to FIG. 2(1), the shafts 95a and 95b are filled with a dielectric material 98, forming dielectric filled shafts 98a and 98b. For example, the dielectric material 98 can be a dielectric material, such as silicon oxide ($SiO_2$). Each pair of dielectric filled shafts 98a define an area in which a pair of ferroelectric storage transistors are to be formed.

In the above-described embodiments, the channel layer 66 is removed during the etch process applied to mask openings 94a and 94b to form shafts 95a and 95b. As shown in FIG. 2(1)(i), the channel layer 66 is separated between adjacent shafts 98 and no channel layer remains in the shafts 98. In other embodiments, the etch process may remove only the sacrificial material 82 and the liner layer 81, without removing the channel layer 66. FIG. 2(11) illustrates the alternate embodiment where the channel layer 66 is not removed from the shafts 95 and the subsequently formed dielectric filled shafts 98 (including shafts 98a and 98b) are bonded by the channel layer 66 in the X-direction. Accordingly, in memory structure 50a, the channel layer 66 is a continuous layer in the Y-direction along the NOR memory strings. The portions of the channel layer 66 remaining adjacent the dielectric filled shafts 98 have minimal impact on the operation of the storage transistors of the NOR memory strings.

With the dielectric filled shafts 98 thus formed, the fabrication process opens up the dielectric filled shafts 98b to use the inter-layer sacrificial layer 70 to perform separation of the channel layer 66 to each active layer. Referring to FIG. 2(m), the memory structure 50 is masked to protect all areas while exposing the shafts 98b. Then, the dielectric material is removed from shafts 98b, forming cavities 99. In one embodiment, the shafts 98b are etched using a selective anisotropic etch process. Furthermore, in some embodiments, the shafts 98b are etched using the selective anisotropic etch process to remove the dielectric materials in the main portion of the shafts and leaving spacers 98c on the ends of the shafts in the Y-direction to protect the channel layer and the ferroelectric dielectric layer formed in the narrow trenches adjacent the shafts 98b, as shown in FIG. 2(m). A further etch process, such as a selective wet etch process, can be performed to clean the surfaces of the active stacks in the excavated cavities 99. In this manner, the multilayers 51 and the inter-layer sacrificial layer 70 are exposed through the excavated cavities 99. View (i) in FIG. 2(m) illustrates the horizontal cross-section along a line C-C' in the first conductive layer 62 in view (ii) during the intermediate etch process. View (ii) in FIG. 2(m) illustrates the vertical cross-section of the memory structure 50 along the line C-C' shown in view (i).

Referring to FIG. 2(n), using the excavated cavities 99 as access shafts which exposes the multilayer 51 and the inter-layer sacrificial layer 70 from the sides of the active stacks, the fabrication process removes the inter-layer sacrificial layer 70, leaving cavities 102 in places where the inter-layer sacrificial layer used to be. Various removal processes can be used depending on the material used for the third sacrificial layer 70. For example, in the case the sacrificial layer 70 is a carbon layer, the carbon layer can be removed by ashing in an oxygen ambient. In the case the sacrificial layer 70 is amorphous silicon or silicon germanium, a selective wet etch process can be used. The resulting memory structure 50 is shown in FIG. 2(n). With the excavated cavities 102 formed, the remaining multilayers 51 are held in place by being attached to the channel layer 66, the gate dielectric layer 67, and the sacrificial material 92. Furthermore, the active stacks are supported by the dielectric filled shafts 98a formed in the narrow trenches between the active stacks and spaced throughout the length of the memory strings in the Y-direction.

As shown in FIG. 2(n), the excavated cavities 102 thus formed expose portions of the channel layer 66 between the multilayers 51 in the active stacks. In particular, the backside of the channel layer 66 is exposed between each multilayer 51. The cavities 102 can be used as access openings to remove the portions of the channel layer 66 that straddle two adjacent storage transistors formed by adjacent multilayers 51 in the active stack (in the Z-direction). Referring to FIG. 2(o), the fabrication process uses the cavities 102 to selectively etch or remove the exposed portions of channel layer 66, as indicated by the dotted circles in FIG. 2(o). As a result, the channel layer 66 is separated in the Z-direction to each multilayer 51.

More specifically, the fabrication process uses the access openings provided by cavities 99 and cavities 102 to deliver high etch selectivity etchant to the backside of the channel layer 66 to selectively etch the exposed portions of channel layer 66, as indicated by the dotted circles in FIG. 2(o). As a result, the channel layer 66 is separated in the Z-direction to each multilayer 51. In some embodiments, the channel layer 66 is a semiconductor oxide, such as IGZO, and the fabrication process uses, for example, sulfuric acid, citric acid, acetic acid, or ammonium hydroxide ($NH_4OH$) in a wet etch process to selectively etch the exposed portions of the channel layer 66. In some embodiments, the memory structure 50 includes an interfacial layer between the channel layer and the ferroelectric dielectric layer 67 and the backside etch of the channel layer 66 is selective to the interfacial layer so that the interfacial layer acts as an etch stop for the backside etch process. That is, the exposed portion of the channel layer 66 is etched through the access openings of cavities 99 and cavities 102 and the etch process will stop when the interfacial layer is reached. In one embodiment, the interfacial layer is an aluminum oxide ($Al_2O_3$) layer. In another embodiment, the backside etch process may be implemented as a multi-step etch process, including an atomic layer etch step used in the removal of the last 1-2 nm of the channel layer, in which the atomic layer etch step stops on the interfacial layer or stop on the ferroelectric dielectric layer 67.

In the embodiment shown in FIG. 2(o) the channel separation process stops when the exposed portions of the channel layer 66 are removed and the channel region is physically separated and isolated to each active layer 51 in each active stack. In some embodiments, the channel separation process can continue, by a change of etchant chemistry or process, to remove the now exposed portions of the ferroelectric dielectric layer 67, as shown in FIG. 2(01). In memory structure 50b of FIG. 2(01), the ferroelectric dielectric layer 67, serving as the ferroelectric polarization layer of the storage transistors, is also physically separated and isolated to each active layer 51 in each active stack. The separation of the ferroelectric dielectric layer 67 is optional and may be omitted in other embodiments of the present invention. In some cases, care can be taken to minimize excessive undercutting by sideway etching of the channel layer 66 or the ferroelectric dielectric layer 67.

Referring to FIG. 2(p), after the channel separation process, the exposed surfaces of the memory structure 50 can be passivated, such as by forming a thin liner layer 104. The liner layer 104 is a thin dielectric layer, such as around 1-2 nm thick. The liner layer 104 can be a silicon oxide layer, a silicon nitride layer or an aluminum oxide layer and serves to passivate or seal the exposed surfaces in the cavities 102. The remaining portions of cavities 102 can be left unfilled and used as an air gap isolation layer. Alternately, the remaining portions of cavities 102 can be filled with a dielectric material, such as silicon dioxide. Furthermore, in the present embodiment, the excavated cavities 99 are provided with the liner layer 104 and are left unfilled to use as an air gap isolation. In other embodiments, the cavities 99 can be filled with a dielectric material, such as silicon dioxide.

Referring to FIG. 2(q), the sacrificial material 92, including any filler or liner material, is removed from the trenches 90, using a suitable selective wet or dry etch process. As a result, the ferroelectric dielectric layer 67 is exposed in the regions between adjacent dielectric filled shafts 98a. Referring to FIG. 2(r), the excavated cavities between adjacent shafts 98a are then filled with a conductive layer which forms the gate conductor layer 68.

In the present embodiment, the gate conductor layer 68 is a metal layer and can include successively deposited thin conductive liner 68a and conductive filler material 68b. The thin conductive liner 68a may be a titanium nitride (TiN) liner or a tungsten nitride (WN) liner. The thin liner layer 68a may be formed using, for example, an atomic layer deposition (ALD) technique. The conductive filler material 68b may be a metal, such as tungsten (W) layer or molybdenum (Mo), or heavily doped n-type or p-type polysilicon. The conductive filler material 68b may be deposited using CVD or PECVD techniques.

Between each pair of dielectric-filled trenches 98a, the conductive layer 68 provides a vertical local word line (LWL) that serves as gate electrode for each of the storage transistors that are vertically aligned in the same active stack. The structure resulting from the combination of the gate dielectric layer 67 and the conductive layer 68 is referred herein as the local word line (LWL) structure. Excess deposited materials may be removed from the top of memory structure 50 by CMP. A cap oxide layer 106 may be formed above the memory structure 50. FIG. 2(r) illustrates the resulting memory structure 50. The memory structure 50 thus formed includes storage transistors arranged in NOR memory strings in multiple planes. In particular, the storage transistors have the same structure as the storage transistor 20 as described in FIG. 1.

Vias and interconnects are formed in and above the cap oxide layer 106 to form interconnection between the storage transistors and the control circuitry, such as the CuA formed in the substrate 52. For example, the bit lines and local word lines of the memory stack are connected with control, select, and sense circuits that are formed in the CuA in the semiconductor substrate. In one example, global word lines, formed using copper metallization processes and materials, can be formed above the cap oxide layer 106 to connect the local word lines 68 to the respective word line drivers formed in the CuA in the substrate 52. FIG. 2(*s*) illustrates the memory structure 50 with a global word line metallization layer 114 formed on the cap oxide layer 106 and connected to local word lines 68 formed in the memory structure through vias 112 formed in the cap oxide layer 106. In some embodiments, the global word line metallization layer 114 is one of copper, tungsten, molybdenum, cobalt, or other metals, or compounds thereof. Vias 112 is filled with a metal layer, such as copper or other suitable metals. As thus configured, each global word line 114 is connected to a group of local word lines 68 to provide the control signal to the gate electrodes of the storage transistors formed in multiple memory planes associated with the respective vertical local word lines. More specifically, the global word lines 114 runs in the X-direction, perpendicular to the common bit lines 62 which runs in the Y-direction. Each global word line connects to the local word lines arranged in a row across the X-direction, as shown in FIG. 2(*s*)(i). Meanwhile, the bit lines from different memory planes of each active stack are connected to bit line selectors through a staircase structure provided in the Y-direction. The bit line selectors connect the bit lines to their respective sense amplifiers and voltage drivers circuit formed in the CuA, typically formed under the staircase structure.

It is instructive to note that FIG. 2(*s*) is illustrative only and is not intended to depict the exact vias and global word line interconnect structures. For example, the vias 112 connecting the local word lines 68 to the global word lines 114 need to be isolated from the channel layer so as not to short the gate electrode to the channel region of the storage transistors. Various methods for forming the vias 112 while providing isolation are possible. In one example, the channel layer 66 may be recessed from the top of the memory array. In another example, additional dummy layers may be included in the memory structure above the array (in the Z-direction) to terminate the channel layer while extending each gate conductor layer 68 for connection to a via 112.

In the embodiment shown in FIG. 2(*s*), as a result of the channel separation process in the Z-direction using the cavities 102 and as a result of the shafts 98*a* formed between the LWL structures, each storage transistor thus formed is isolated in the Z-direction from other storage transistors in other planes of the same active stack. Each storage transistor is also isolated in the Y-direction from other storage transistors by the dielectric filled shafts 98*a*. Each storage transistor in the memory structure 50 is therefore completely isolated to enhance the performance characteristics of the storage transistors. Furthermore, air gap isolation is used to isolate the storage transistors in the active stacks between memory planes where the air gaps provide better isolation characteristics than most dielectric materials.

Figure 3:
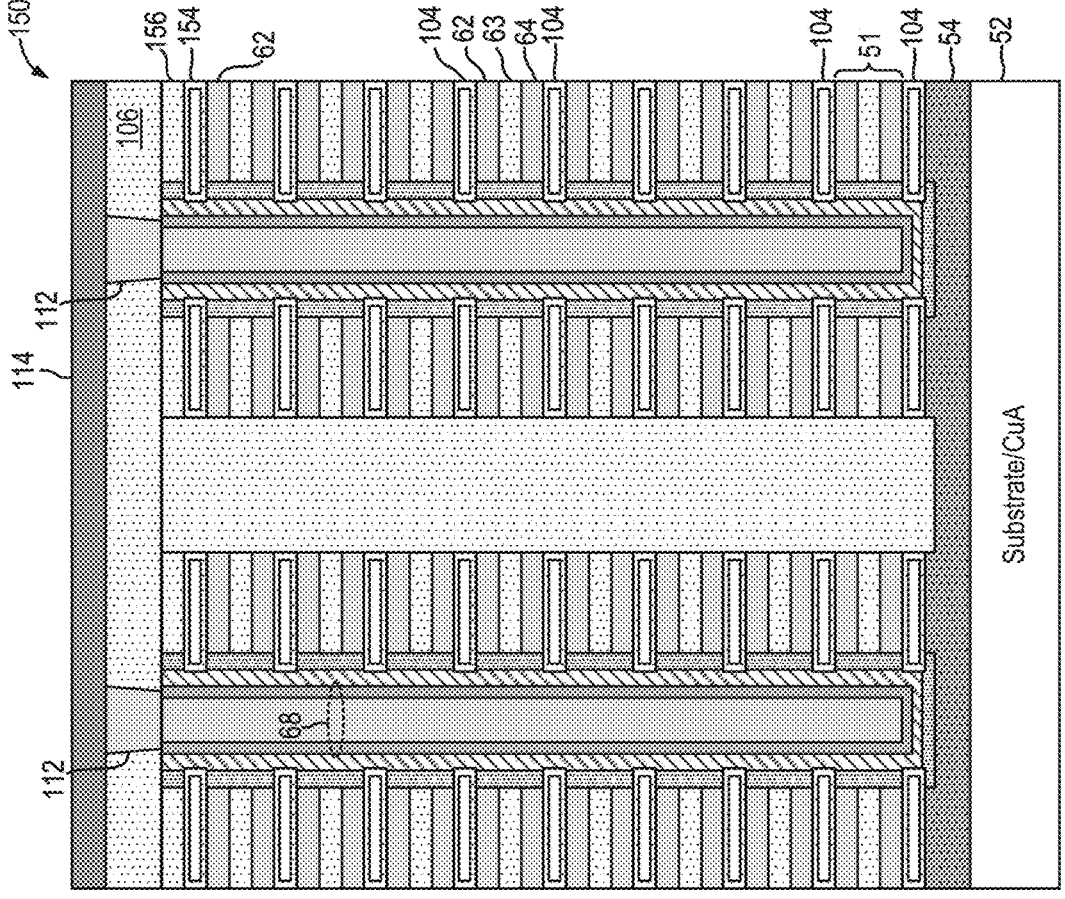
FIG. 3 illustrates a memory structure formed using dummy layers for isolating the channel layer for global word line connections in some embodiments.

FIG. 3 illustrates a memory structure formed using dummy layers for isolating the channel layer for global word line connections in some embodiments. Referring to FIG. 3, the memory structure 150 includes a dummy isolation layer 154 and a dummy dielectric layer 156. In the initial stack formation, the dummy isolation layer 154 can be provided as an inter-layer sacrificial layer described above (e.g. FIG. 2(*a*)) which is subsequently replaced by the inter-layer isolation layer, such as an air gap isolation. The dummy dielectric layer 156 functions as a capping layer for the dummy isolation layer 154 during the replacement process. In particular, during intermediate processing steps, the dummy isolation layer 154, as an inter-layer sacrificial layer, is removed to provide access openings to the backside of the channel layer 66. The channel layer 66 is selectively etched through the access openings. Then, the liner layer 104 is formed around the exposed cavities of the dummy isolation layer 154, the remaining portion forming an air gap isolation. As thus constructed, the channel layer for the topmost memory strings in the memory structure 150 is separated and isolated by the dummy isolation layer 154. A cap oxide layer 106 is formed above the memory structure 150. Vias 112 can be formed to contact the local word lines (gate conductor layer 68) without concern for possible electrical shorts to the channel layer. A metallization layer is formed on the cap oxide layer 106 to form the global word lines. Each global word line connects to the local word lines through vias 112 to provide the control signal to the gate electrodes of the storage transistors formed in multiple memory planes associated with the respective vertical local word lines.

Figure 4:
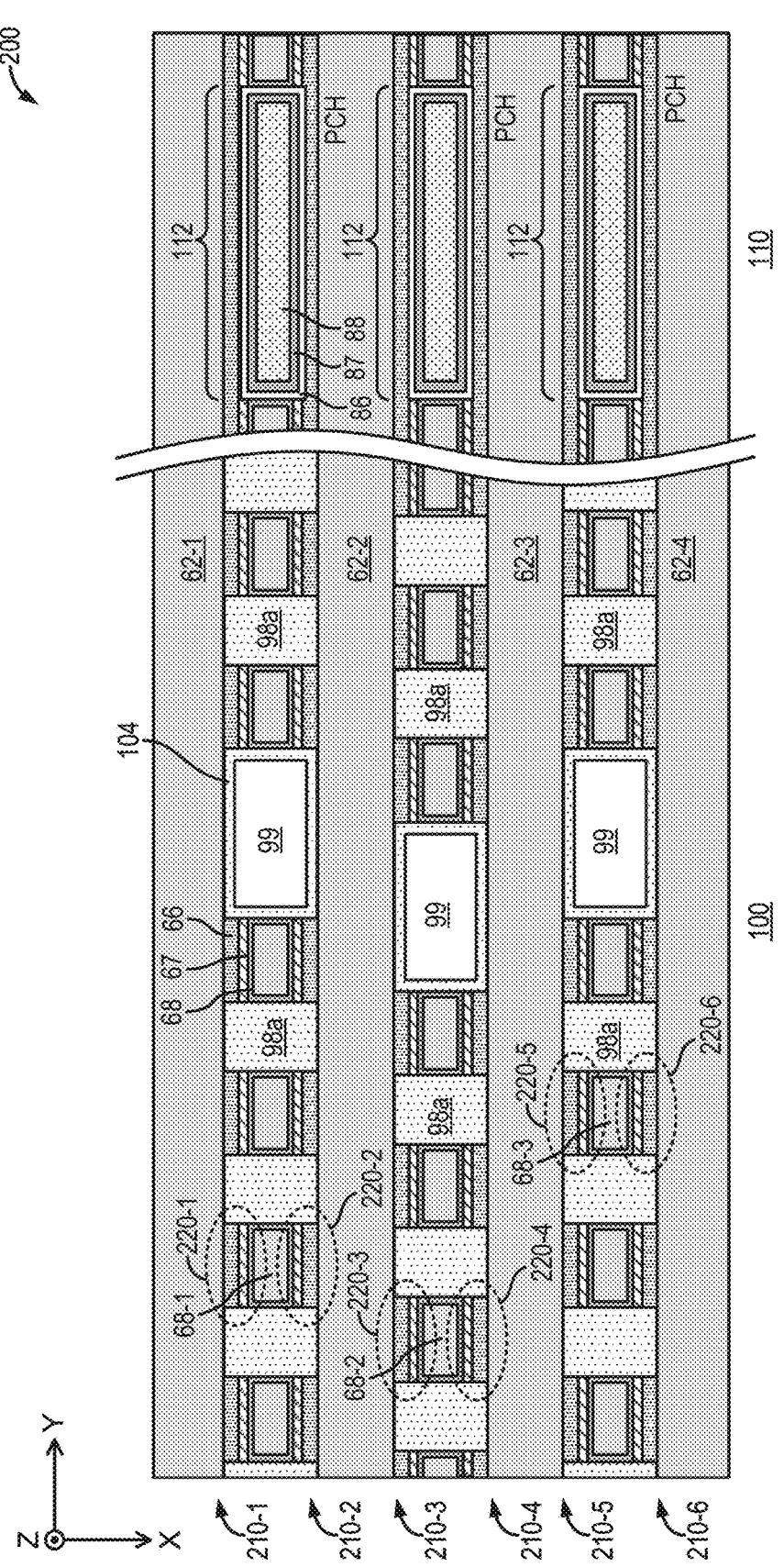
FIG. 4 is a cross-sectional view of a portion of a memory structure in the X-Y plane illustrating NOR memory strings with precharge transistors in embodiments of the present invention.

FIG. 4 is a cross-sectional view of a portion of a memory structure in the X-Y plane illustrating NOR memory strings with precharge transistors in embodiments of the present invention. Referring to FIG. 4, a memory structure 200 includes active stacks bordering narrow trenches with local word line structures formed therein. In the present illustration, the cross-sectional view is taken at the first conductive layer 62 of a given active layer in an active stack. The first conductive layer 62 forms the common bit line of the memory string. A ferroelectric storage transistor 220 is formed at the intersection of the common bit line 62 with the channel layer 66, the gate dielectric layer 67 and the gate conductor 68. FIG. 4 illustrates six memory strings 210-1 to 210-6 that are formed extending in the Y-direction along four active stacks (represented by respective first conductive layer 62-1 to 62-4). For example, each memory string 210 includes the storage transistors 220 formed along the active stack 62 and intersecting with all of the local word line structures along the active stack 62. The storage transistors 220 are isolated from other storage transistors in the memory string by the dielectric filled shafts 98*a*. Access shafts with cavities 99 lined with the liner layer 104 are used during the fabrication process to perform channel separation to isolate the channel layer 66 to each memory plane (in the Z-direction). Cavities 99 are left unfilled in the present embodiment and can function as an air gap isolation. Precharge transistors 112 are formed along each memory string to support the precharge operation.

It is instructive to note that in memory structure 200, a pair of memory strings 210 in each memory plane bordering a narrow trench including LWL structures have corresponding storage transistors sharing a local word line. Accordingly, each local word line activates two storage transistors in the memory strings bordering the same LWL structure in each memory plane. In one example, in response to the local word line 68-1 being selected, storage transistors 220-1 and 220-2 associated with respective memory strings 210-1 and 210-2 are activated. The common bit lines 62-1 and 62-2 are in turn selected to provide access and the appropriate voltages to the activated storage transistors 220-1 and 220-2. In another example, in response to the local word line 68-2 being selected, storage transistors 220-3 and 220-4 associated with respective memory strings 210-3 and 210-4 are activated. The common bit lines 62-3 and 62-4 are in turn selected to provide access and appropriate voltages to the activated storage transistors 220-3 and 220-4. In some embodiments, when storage transistor 220-1 is to be erased, transistor 220-2, which may be in a programmed state, needs to be protected from being erased as well. As an example of a typical erase operation of a ferroelectric storage transistor 220-1, the erase operation may require 3.0 Volts applied to the local word line 68-1, and 0.0 Volts applied to its bit line 62-1. To prevent erasing of ferroelectric transistor 220-2 (that shares the same local word line 68-1 and therefore has the same 3.0 Volts on its control gate), its bit line 62-2 must be held at an inhibit voltage Vinhb that is close enough to 3.0V to avoid flipping of the polarization state of ferroelectric type storage transistor 220-2. The same applies to all program and program inhibit operations, as well as for inhibiting disturbing the stored data of storage transistors on different planes above or below the plane being accessed, that are not being addressed yet are still being exposed to the voltage on their shared local word lines.

Enhanced Fringing Field Effect

In the memory structure 10 of FIG. 1, the channel length of the ferroelectric storage transistor 20 thus formed is determined by the thickness L1 of the channel spacer dielectric layer 23. In embodiments of the present invention, shorter channel lengths, such as L1 less than 10 nm, can accentuate the electric fringing-field effect of the ferroelectric storage transistor which enhances the polarization effect in the ferroelectric dielectric layer. Referring again to FIG. 1, when erase or program voltages are applied between the bit line (BL) electrode 22 and the control gate electrode 28, the electric field between the two electrodes is imposed onto the part of the ferroelectric dielectric layer 27 that is directly opposite the BL electrode to cause the desired change in polarization in the ferroelectric dielectric layer 27. The electric field further includes fringing field that extends into part of the channel 26.

In some embodiments, the fringing electric field is further accentuated by biasing the bit line (BL) and the source line (SL) to the same voltage during erase and program operations. In other words, the bit line (BL) and the source line (SL) of the ferroelectric storage transistor is being used as a single electrode during the erase and program operations. With the bit line and the source line biased as a single electrode, the fringing electric fields from both the bit line 22 and the source line 24 extends into the channel 26 from both ends and the fringing electric field overlaps most of, or the entire length of, the channel 26 when the channel is sufficiently short. By biasing the ferroelectric storage transistor in a single electrode mode to accentuate the fringing electric field, the polarization of the ferroelectric dielectric layer is enhanced which can result in a wider threshold voltage window between the erase and program states.

In one embodiment, when the memory structure implements the floating source architecture, the precharge transistors described above can be used to facilitate the equalization of the voltages of the bit line 22 and the source line 24 during erase or program operations so that the bit line 22 and the source line 24 operates as a joint electrode to maximize the fringing field coverage of ferroelectric dielectric layer 27.

Figures 5A, 5B:
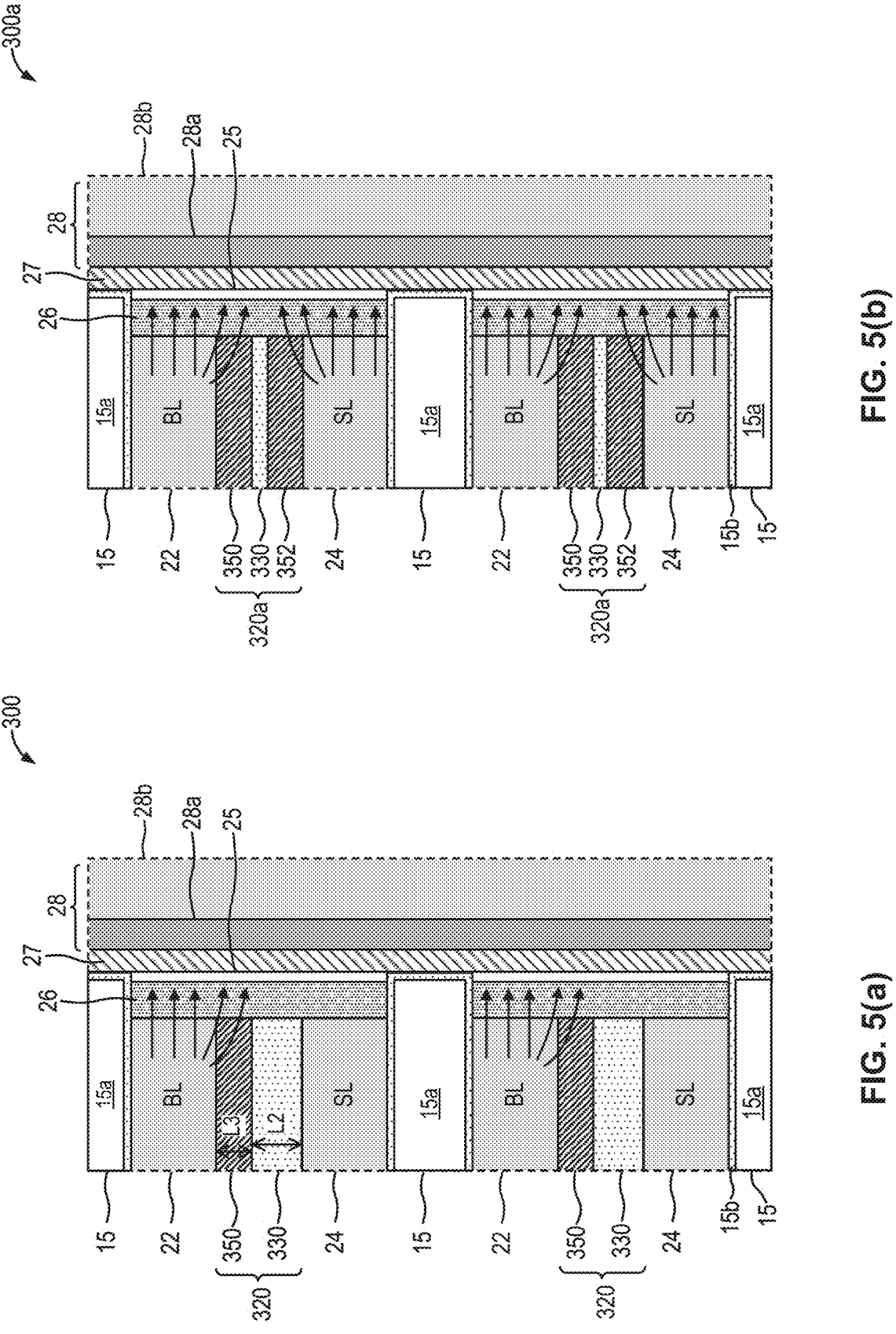
FIGS. 5(a) and 5(b) illustrate the detail construction of junctionless ferroelectric storage transistors in alternate embodiments of the present invention.

In another embodiment of the present invention, the fringing electric field is enhanced by using a high dielectric constant (high-K) dielectric layer in the channel spacer region adjacent the bit line. In particular, the fringing electric field is enhanced by using a high dielectric constant (high-K) dielectric layer in the channel spacer region adjacent the bit line. FIGS. 5(*a*) and 5(*b*) illustrate the detail construction of junctionless ferroelectric storage transistors in alternate embodiments of the present invention. Like elements in FIGS. 1 and 5(*a*) and 5(*b*) are given like reference numerals and may not be further described in detail. Referring first to FIG. 5(*a*), a ferroelectric storage transistor 300 includes a bit line 22 forming the common drain line of the NOR memory string, and a source line 24 forming the common source line of the NOR memory string, the bit line 22 and the source line 24 being spaced apart by a channel spacer dielectric layer 320. The storage transistor 300 further includes a semiconductor oxide channel layer 26 formed vertically along the sidewall of the memory stack and in contact with both the bit line 22 and the source line 24. A ferroelectric dielectric layer 27 and a gate conductor layer 28 are formed on the sidewall of the memory stack adjacent the channel layer 26. In some embodiments, an optional interfacial layer 25 may be provided between the channel layer 26 and the ferroelectric dielectric layer 27. The storage transistor 300 is isolated from adjacent storage transistors in the stack by an interlayer isolation layer 15, which can be an air-gap isolation layer. As thus configured, the storage transistors 300 are junctionless ferroelectric storage transistors.

In embodiments of the present invention, the channel spacer dielectric layer 320 includes a first dielectric layer 330 and a second dielectric layer 350 formed between the bit line 22 and the first dielectric layer 330. The second dielectric layer 350 has a higher dielectric constant than the first dielectric layer 330 and is referred to as a high dielectric constant (high-K) dielectric layer in the present description. By incorporating the high-K dielectric layer 350 adjacent the bit line 22, the fringing electric field between bit line electrode 22 and the gate electrode 28 is concentrated in the portion of the channel 26 closest to the bit line 22, which has the effect of enhancing the polarization effect of the ferroelectric polarization layer 27 during program and erase operations.

In some embodiments, the high-K dielectric layer 350 can be formed using silicon nitride (having a dielectric constant of about 6) or hafnium oxide (having a dielectric constant of about 19). Meanwhile, the first dielectric layer 330 can be formed using silicon dioxide (having a dielectric constant of 3.9). In some embodiments, the first dielectric layer 330 has a thickness L2 and the high-K dielectric layer 350 has a thickness L3 and the ferroelectric storage transistor 300 has an effective channel length of L2+L3. In one example, the thickness L2 is 15 nm and the thickness L3 is 10 nm, and the effective channel length of the storage transistor 300 is 25 nm. The high-K dielectric layer 350 may be provided in the fabrication process by including the high-K dielectric layer in the deposition process forming the multilayer stack, such as described with reference to FIG. 2(*a*).

The higher dielectric constant of the high-K dielectric layer 350 serves to concentrate the fringing electric field that extend over the channel 26 when polarization voltage is applied between the bit line electrode 22 and the control gate electrode 28. The accentuation of the fringing electric field is particularly effective if the bit line conductive layer 22 is very thin (e.g. 20 nm or less), in which case any contribution to the electric field from the field fringing into channel 26 is reinforcing the polarization effect during erase or program operation.

In the embodiment shown in FIG. 5(*a*), the high-K dielectric layer 350 is provided only adjacent the bit line conductive layer 22. In other embodiments, as shown in FIG. 5(*b*), a channel spacer dielectric layer 320*a* may include a first high-K dielectric layer 350 provided adjacent the bit line conductive layer 22 and a second high-K dielectric layer 352 provided adjacent the source line conductive layer 24. A narrow dielectric layer 330 may separate the first and second high-K dielectric layers 350, 352. In the present embodiment, the dielectric layer 330 is formed of a material with a dielectric constant lower than the dielectric constant of the dielectric layers 350 and 352. In alternate embodiments, the entire channel spacer dielectric layer can be formed entirely of a high-K dielectric layer, such as a dielectric layer with a dielectric constant larger than the dielectric constant of a silicon oxide layer.

In the above-described embodiments, the memory structures are formed using a semiconductor oxide layer as the channel layer of the storage transistors. In some embodiments, the semiconductor oxide channel layer is formed as a bi-layer channel including a first semiconductor oxide layer formed on the trench sidewalls and in good electrical contact with the conductive layers forming the drain and source lines and a second semiconductor oxide layer formed on the first semiconductor oxide layer. The first and second semiconductor oxide layers together form the channel layer and providing the channel region to each storage transistor. The first semiconductor oxide layer functions as a low contact resistance contact layer to the drain and source conductive layers to which it contacts. The second semiconductor oxide layer functions as the main channel layer providing the desired high mobility and high on-current for the channel region of the storage transistors. In some embodiments, the first semiconductor oxide layer is a metal oxide semiconductor material that provides a contact resistance to the conductive layers that is lower than the contact resistance provided by the second semiconductor oxide layer. In one embodiment, the first semiconductor oxide layer is, for example, an indium aluminum zinc oxide (InAlZnO or IAZO) layer of thickness around 1 nm-2 nm, and the second semiconductor oxide layer is an IGZO layer of thickness around 6 nm. In other embodiments, other semiconductor oxide materials that provide a desirably low contact resistance to metal layers can be used as the first semiconductor oxide layer. In particular, a metal oxide semiconductor material that has high immunity to deoxidization of the channel layer by the source/drain conductive layer and suppresses oxidation of the source/drain conductive layers during thermal processing is desired for use as the first semiconductor oxide layer.

In the present description, spatially relative terms, such as "beneath," "below," "lower," "above," "upper" and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A three-dimensional memory structure formed above a planar surface of a semiconductor substrate, the memory structure comprising:

a plurality of thin-film ferroelectric storage transistors being organized as a plurality of stacks of NOR memory strings, the storage transistors within each NOR memory string sharing a common source layer and a common drain layer, spaced apart by a first isolation layer, with each layer extending along a first direction, the common source layer and the common drain layer comprising respectively a first conductive layer and a second conductive layer with the first isolation layer formed therebetween; wherein:

(i) each NOR memory string extends along the first direction that is substantially parallel to the planar surface of the semiconductor substrate;

(ii) the NOR memory strings of each stack are (a) provided one on top of another along a second direction substantially normal to the planar surface, and (b) isolated one from the other memory string by a second isolation layer;

(iii) a semiconductor oxide layer formed on the sidewalls of each stack of NOR memory strings and, with respect to each NOR memory string within the stack, in contact with the common source layer and the common drain layer of the NOR memory string along the sidewall of each stack, thus providing channel regions for the storage transistors of the NOR memory string;

(iv) a ferroelectric gate dielectric layer is provided adjacent the semiconductor oxide layer, the semiconductor oxide layer being provided between the ferroelectric gate dielectric layer and the first conductive layer of the common source layer, and further being provided between the ferroelectric gate dielectric layer and the second conductive layer of the common drain layer; and (v) a plurality of conductors are provided between adjacent stacks of NOR memory strings, each conductor extending along the second direction, and each serving as a common gate electrode for a group of storage transistors in the NOR memory strings of the adjacent stacks, wherein, within a stack of NOR memory strings, the semiconductor oxide layer for the storage transistors of a first NOR memory string are separated from the semiconductor oxide layer for the storage transistors of a second adjacent NOR memory string in the same stack in the second direction.

2. The three-dimensional memory structure of claim 1, wherein, within the stack of NOR memory strings, the semiconductor oxide layer for the storage transistors of a first NOR memory string are separated from the semiconductor oxide layer for the storage transistors of a second adjacent NOR memory string in the same stack in the second direction by the second isolation layer.

3. The three-dimensional memory structure of claim 2, wherein the second isolation layer comprises an air gap cavity.

4. The three-dimensional memory structure of claim 3, wherein the second isolation layer comprises a liner layer formed on exposed surfaces between memory strings within a stack of NOR memory strings and an air gap in the remaining cavity.

5. The three-dimensional memory structure of claim 1, wherein the storage transistors within each NOR memory string share the first conductive layer, which serves as a common drain line and share the second conductive layer, which serves as a common source line, the semiconductor oxide layer in contact with and in between the first and second conductive layers serving as a junctionless channel region of each storage transistor in each NOR memory string.

6. The three-dimensional memory structure of claim 5, wherein the common source line is an electrically floating source.

7. The three-dimensional memory structure of claim 1, wherein the semiconductor oxide layer comprises one of an indium gallium zinc oxide (IGZO) layer, an indium zinc oxide (IZO) layer, an indium tungsten oxide (IWO) layer, or an indium tin oxide (ITO) layer.

8. The three-dimensional memory structure of claim 7, wherein the semiconductor oxide layer comprises a first semiconductor oxide layer and a second semiconductor oxide layer, the first semiconductor oxide layer being provided in contact with the first and second conductive layers and providing a contact resistance to the first and second conductive layers lower than the contact resistance of the second semiconductor oxide layer.

9. The three-dimensional memory structure of claim 1, wherein the ferroelectric gate dielectric layer comprises a doped hafnium oxide layer.

10. The three-dimensional memory structure of claim 1, further comprising an interfacial dielectric layer formed between the semiconductor oxide layer and the ferroelectric gate dielectric layer.

11. The three-dimensional memory structure of claim 10, wherein the ferroelectric gate dielectric layer comprises a doped hafnium oxide layer and the interfacial dielectric layer comprises a high dielectric constant dielectric layer.

12. The three-dimensional memory structure of claim 1, wherein the conductive layer of each of the common source layer and the common drain layer comprises a metal layer.

13. The three-dimensional memory structure of claim 1, wherein the first isolation layer comprises a silicon oxide layer.

14. The three-dimensional memory structure of claim 1, further comprising a plurality of non-memory transistors formed in each NOR memory string, the non-memory transistors being designated as precharge transistors, the precharge transistors being activated during a precharge operation to electrically connect the common source layer and the common drain layer in each NOR memory string to set the voltage on the common source layer to equal to the voltage on the common drain layer.

15. The three-dimensional memory structure of claim 1, wherein the plurality of conductors forming the gate electrodes are provided in trenches formed between adjacent stacks of NOR memory strings, each conductor being spaced apart from an adjacent conductor by a dielectric filled shaft extending in the second direction.

16. The three-dimensional memory structure of claim 1, wherein the plurality of conductors in a first trench are formed offset in the first direction from the plurality of conductors in a second trench adjacent the first trench.

17. The three-dimensional memory structure of claim 1, wherein in each storage transistor in the NOR memory string, the common drain line and the common source line are biased to substantially the same voltage during a program or an erase operation of the storage transistor.

18. The three-dimensional memory structure of claim 1, wherein the first isolation layer comprises a first dielectric layer having a first dielectric constant formed adjacent the first conductive layer and a second dielectric layer having a second dielectric constant formed adjacent the second conductive layer, the first dielectric constant being larger than the second dielectric constant.

19. The three-dimensional memory structure of claim 1, wherein the first isolation layer comprises a first dielectric layer having a first dielectric constant formed adjacent the first conductive layer, a second dielectric layer having a second dielectric constant formed adjacent the second conductive layer, and a third dielectric layer having a third dielectric constant formed between the first and second dielectric layers, the first and second dielectric constants being larger than the third dielectric constant.

20. The three-dimensional memory structure of claim 1, wherein the first isolation layer comprises a dielectric layer having a dielectric constant greater than a dielectric constant of silicon oxide.

* * * * *